(12) United States Patent
Ono et al.

(10) Patent No.: US 11,509,842 B2
(45) Date of Patent: Nov. 22, 2022

(54) SOLID-STATE IMAGING ELEMENT, METHOD OF DRIVING SOLID-STATE IMAGING ELEMENT, AND ELECTRONIC APPARATUS

(71) Applicant: SONY SEMICONDUCTOR SOLUTIONS CORPORATION, Kanagawa (JP)

(72) Inventors: Toshiaki Ono, Kanagawa (JP); Satoko Iida, Kanagawa (JP); Tomohiko Asatsuma, Kanagawa (JP); Yoshiaki Kitano, Kanagawa (JP); Yusuke Matsumura, Kanagawa (JP); Ryoko Kajikawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 277 days.

(21) Appl. No.: 16/755,416

(22) PCT Filed: Oct. 12, 2018

(86) PCT No.: PCT/JP2018/038108
§ 371 (c)(1),
(2) Date: Apr. 10, 2020

(87) PCT Pub. No.: WO2019/078110
PCT Pub. Date: Apr. 25, 2019

(65) Prior Publication Data
US 2020/0260026 A1    Aug. 13, 2020

(30) Foreign Application Priority Data

Oct. 20, 2017 (JP) ............................. JP2017-203415
Aug. 28, 2018 (JP) ............................. JP2018-159569

(51) Int. Cl.
*H04N 5/355* (2011.01)
*H04N 5/378* (2011.01)
(Continued)

(52) U.S. Cl.
CPC ..... *H04N 5/3559* (2013.01); *H01L 27/14603* (2013.01); *H01L 27/14614* (2013.01);
(Continued)

(58) Field of Classification Search
CPC .. H04N 5/3559; H04N 5/37457; H04N 5/378; H01L 27/14603; H01L 27/14614;
(Continued)

(56) References Cited

U.S. PATENT DOCUMENTS

2012/0025061 A1\* 2/2012 Izuha ................ H01L 27/14621
257/E31.127
2012/0249829 A1 10/2012 Izuha et al.
(Continued)

FOREIGN PATENT DOCUMENTS

JP    2012-049485 A    3/2012
JP    2012-084814 A    4/2012
(Continued)

OTHER PUBLICATIONS

International Search Report and Written Opinion of PCT Application No. PCT/JP2018/038108, dated Nov. 20, 2018, 09 pages of ISRWO.

*Primary Examiner* — Lin Ye
*Assistant Examiner* — John H Morehead, III
(74) *Attorney, Agent, or Firm* — Chip Law Group

(57) ABSTRACT

Provided is a solid-state imaging element configured to automatically extend dynamic range for each unit pixel. A solid-state imaging element includes, for a unit pixel, a first photoelectric conversion element, a first accumulation portion that accumulates electric charge obtained by photoelec-
(Continued)

tric conversion by the first photoelectric conversion element, and a first film that is electrically connected to the first accumulation portion and has an optical characteristic changing according to applied voltage. Furthermore, the unit pixel of the solid-state imaging element can further include a first transfer transistor that transfers electric charge obtained by photoelectric conversion by the photoelectric conversion element to the first accumulation portion, an amplification transistor that is electrically connected to the first accumulation portion, and a selection transistor that is electrically connected to the amplification transistor.

22 Claims, 23 Drawing Sheets

(51) Int. Cl.
 *H04N 5/3745* (2011.01)
 *H01L 27/146* (2006.01)
(52) U.S. Cl.
 CPC .. *H01L 27/14621* (2013.01); *H01L 27/14645* (2013.01); *H04N 5/378* (2013.01); *H04N 5/37457* (2013.01)
(58) Field of Classification Search
 CPC ......... H01L 27/14621; H01L 27/14645; H01L 27/14612; H01L 27/14656; H01L 27/14665; H01L 27/14623
 See application file for complete search history.

(56) References Cited

U.S. PATENT DOCUMENTS

| | | | |
|---|---|---|---|
| 2013/0200479 A1* | 8/2013 | Sakano | H01L 27/14689 257/443 |
| 2013/0240961 A1* | 9/2013 | Nakatsuka | H01L 27/14614 257/292 |
| 2014/0151531 A1* | 6/2014 | Yamashita | H01L 27/14621 257/435 |
| 2015/0295007 A1* | 10/2015 | Cellek | H01L 27/14625 257/84 |
| 2016/0155774 A1* | 6/2016 | Hasegawa | H01L 27/14638 257/231 |
| 2017/0133419 A1* | 5/2017 | Watanabe | H01L 31/112 |

FOREIGN PATENT DOCUMENTS

| | | |
|---|---|---|
| JP | 2012-216760 A | 11/2012 |
| JP | 2013-161868 A | 8/2013 |

* cited by examiner

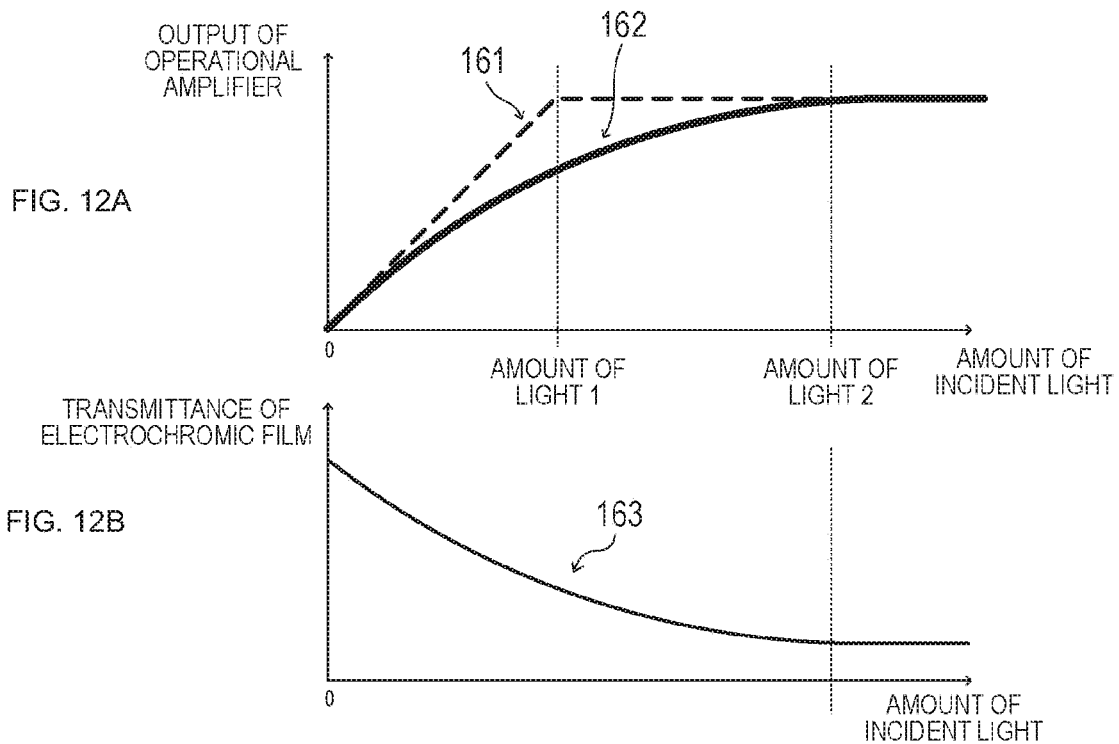
FIG. 12A
FIG. 12B
FIG. 13
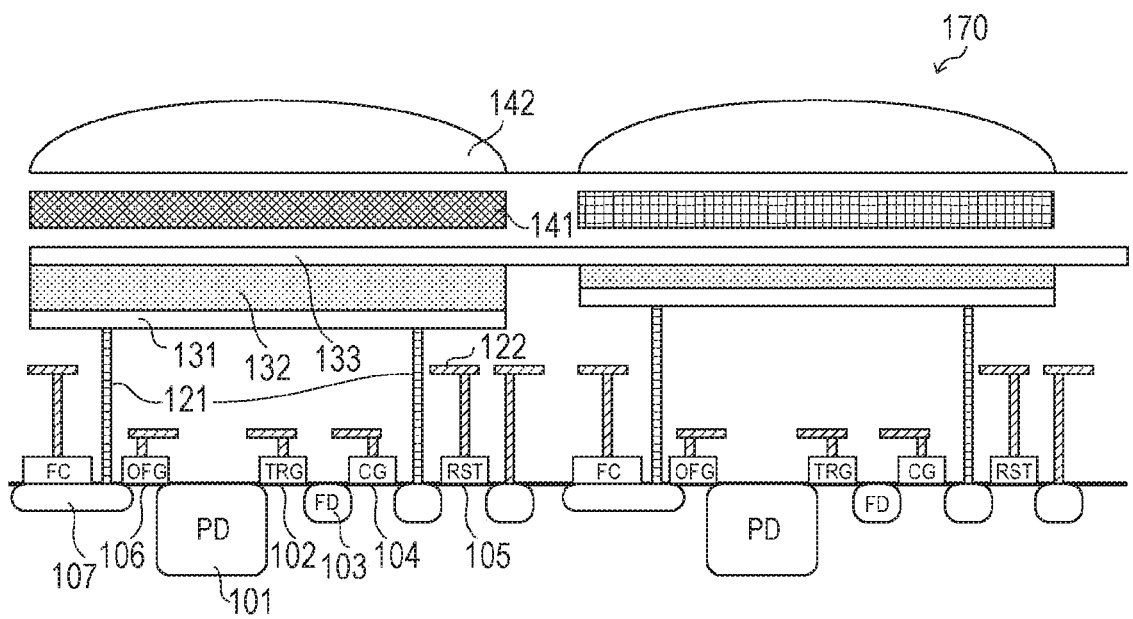

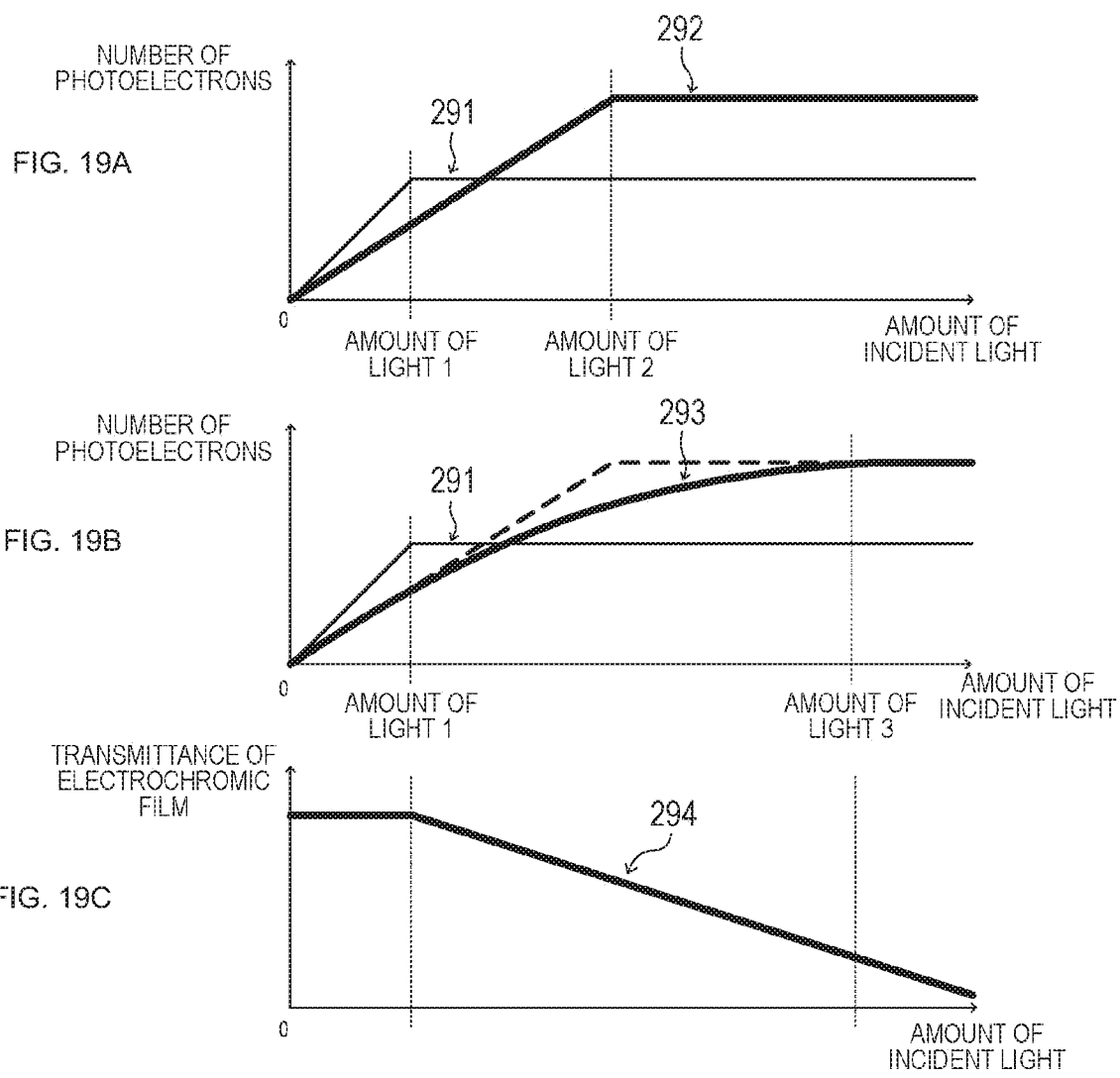
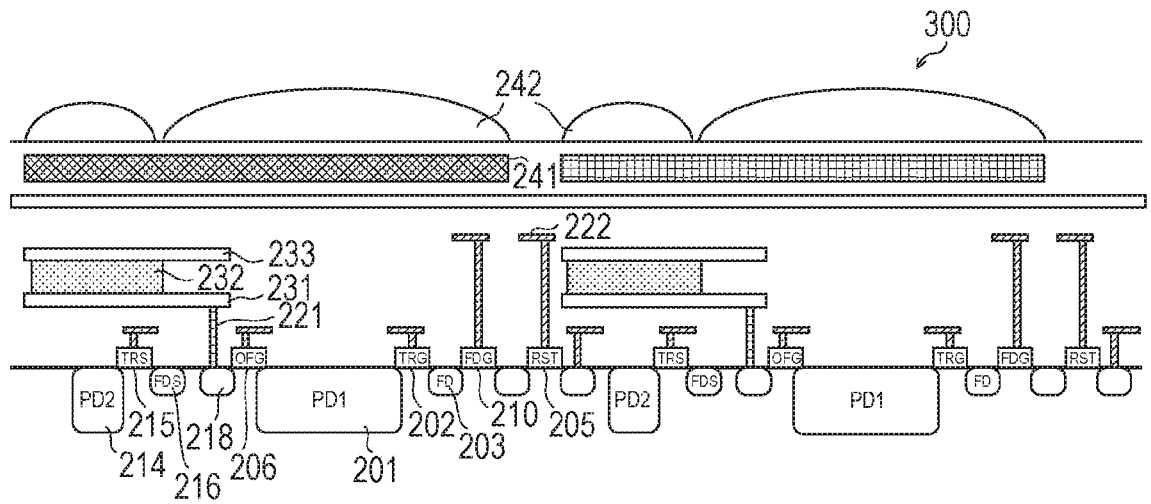

SOLID-STATE IMAGING ELEMENT, METHOD OF DRIVING SOLID-STATE IMAGING ELEMENT, AND ELECTRONIC APPARATUS

CROSS REFERENCE TO RELATED APPLICATIONS

This application is a U.S. National Phase of International Patent Application No. PCT/JP2018/038108 filed on Oct. 12, 2018, which claims priority benefit of Japanese Patent Application No. JP 2017-203415 filed in the Japan Patent Office on Oct. 20, 2017 and also claims priority benefit of Japanese Patent Application No. JP 2018-159569 filed in the Japan Patent Office on Aug. 28, 2018. Each of the above-referenced applications is hereby incorporated herein by reference in its entirety.

TECHNICAL FIELD

The present technology relates to a solid-state imaging element, a method of driving a solid-state imaging element, and an electronic apparatus and particularly to a technology of a solid-state imaging element including a film having an optical characteristic changing according to a voltage applied.

BACKGROUND ART

Conventionally, there have been solid-state imaging elements, such as CCD or CMOS image sensors, in which light incident on a sensor unit during a certain exposure time period is photoelectrically converted by a photodiode, and the incident light is converted into electric charge and accumulated in an accumulation portion. However, since the accumulation portion has a finite amount of electric charge accumulated, and, for example, when strong light is incident, the accumulation portion is saturated with electric charge and provides insufficient gray scale. As a method for suppressing insufficient gray scale, it is known to increase dynamic range.

Here, as an example of a technique for extending dynamic range of a solid-state imaging element, Patent Document 1 discloses a solid-state imaging element including a semiconductor substrate that has a light receiving surface on which a photoelectric conversion unit is formed corresponding to each of pixels arranged in a matrix, an electrochromic film that is formed on the semiconductor substrate in optical incidence paths to the photoelectric conversion units in some pixels selected from the pixels and has a light transmittance changing from a first transmittance to a second transmittance according to an applied voltage, a lower electrode that is formed in a layer below the electrochromic film, and an upper electrode that is formed in a layer above the electrochromic film. According to the technique of Patent Document 1, it is considered that the dynamic range can be extended without causing problems such as the increase of power consumption and generation of an unnatural image.

CITATION LIST

Patent Document

Patent Document 1: Japanese Patent Application Laid-Open No. 2012-049485

SUMMARY OF THE INVENTION

Problems to be Solved by the Invention

However, the technique proposed in Patent Document 1 may not be able to further improve the technique for extending dynamic range.

Therefore, the present technology has been made in view of such a situation, and an object of the present technology is mainly to provide a solid-state imaging element configured to automatically extend dynamic range for each unit pixel.

Solutions to Problems

In order to solve the above-described problem, a solid-state imaging element according to an example of the present technology includes, for a unit pixel, a first photoelectric conversion element, a first accumulation portion that accumulates electric charge obtained by photoelectric conversion by the first photoelectric conversion element, and a first film that is electrically connected to the first accumulation portion and has an optical characteristic changing according to applied voltage. Furthermore, the unit pixel of the solid-state imaging element as an example of the present technology can further include a first transfer transistor that transfers electric charge obtained by photoelectric conversion by the photoelectric conversion element to the first accumulation portion, an amplification transistor that is electrically connected to the first accumulation portion, and a selection transistor that is electrically connected to the amplification transistor.

In addition, a solid-state imaging element as an example of the present technology includes, for a unit pixel, in order of incidence of light; a first electrode, an electrochromic film that has an optical characteristic changing according to applied voltage; a second electrode, a first photoelectric conversion element, a first accumulation portion that accumulates electric charge obtained by photoelectric conversion by the first photoelectric conversion element; a second photoelectric conversion element, and a second accumulation portion that accumulates electric charge obtained by photoelectric conversion by the second photoelectric conversion element, in which the electrochromic film is disposed on an optical path of light incident on the second photoelectric conversion element and the first accumulation portion is connected to the second electrode.

Furthermore, a method of driving a solid-state imaging element, as an example of the present technology, is configured to accumulate an electric charge in response to photoelectric conversion by a first photoelectric conversion element, in a first accumulation portion and cause the first accumulation portion to keep holding the accumulated electric charge during an exposure period.

In addition, an electronic apparatus as an example of the present technology includes, as an imaging unit, a solid-state imaging element including, for a unit pixel, a first photoelectric conversion element, a first accumulation portion that accumulates electric charge obtained by photoelectric conversion by the first photoelectric conversion element, and a first film that is electrically connected to the first accumulation portion and has an optical characteristic changing according to applied voltage.

Effects of the Invention

According to the present technology, it is possible to provide a solid-state imaging element configured to automatically extend dynamic range for each unit pixel. Note that, the present technology may have, not always limited to the above effects, any of the effects described in the present disclosure.

BRIEF DESCRIPTION OF DRAWINGS

FIG. 3A is a schematic plan view of the unit pixel from which an electrochromic film and an on-chip lens are removed, and FIG. 3B is a schematic plan view of the unit pixel in which the electrochromic film and the on-chip lens are also shown.

FIG. 5A is a graph illustrating a photoelectric conversion characteristic obtained in a case where the electrochromic film is not provided, FIG. 5B is a graph illustrating a photoelectric conversion characteristic obtained in a case where the electrochromic film is provided, and FIG. 5C is a graph illustrating a relationship between light transmittance of the electrochromic film and amount of incident light.

FIGS. 12A and 12B illustrate graphs of photoelectric conversion characteristics of a solid-state imaging element according to the sixth embodiment of the present technology. FIG. 12A is a graph illustrating a relationship between output of an operational amplifier and amount of incident light, and FIG. 12B is a graph illustrating a relationship between light transmittance of an electrochromic film and amount of incident light.

FIG. 13 is a schematic cross-sectional diagram illustrating pixels of a solid-state imaging element according to a seventh embodiment of the present technology.

FIG. 17A is a plan view of the unit pixel from which an electrochromic film and an on-chip lens are removed, and FIG. 17B is a plan view of the unit pixel in which the electrochromic film and the on-chip lens are also shown.

FIGS. 19A, 19B, and 19C illustrate graphs of photoelectric conversion characteristics of the solid-state imaging element of FIG. 15. FIG. 19A is a graph illustrating a photoelectric conversion characteristic obtained in a case where the electrochromic film is not provided, FIG. 19B is a graph illustrating a photoelectric conversion characteristic obtained in a case where the electrochromic film is provided, and FIG. 19C is a graph illustrating a relationship between light transmittance of the electrochromic film and amount of incident light.

FIG. 20 is a schematic cross-sectional diagram illustrating pixels of a solid-state imaging element according to a tenth embodiment of the present technology.

MODE FOR CARRYING OUT THE INVENTION

Figure 1:
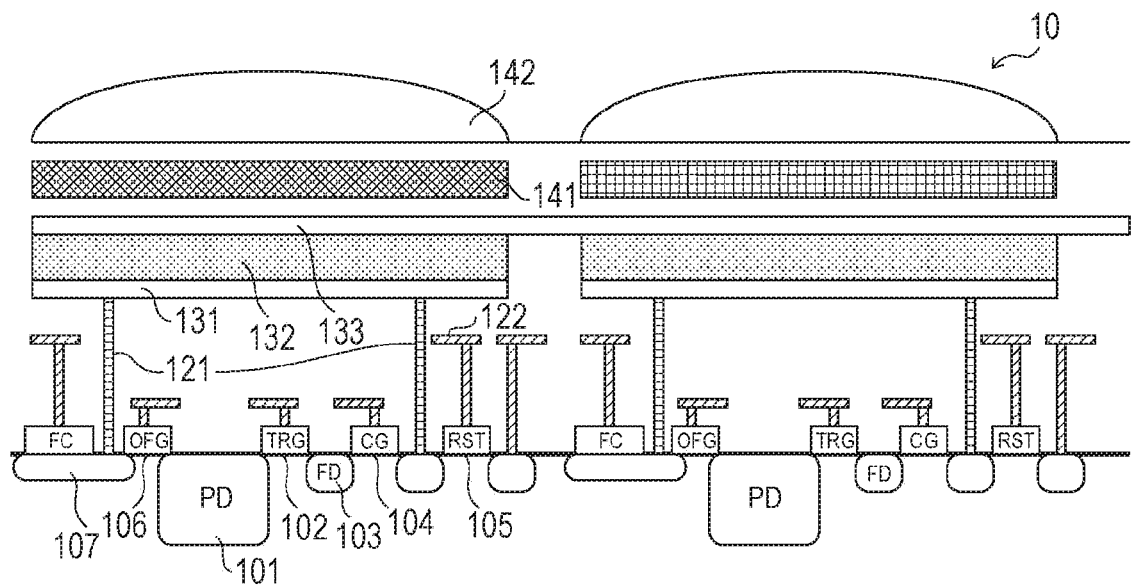
FIG. 1 is a schematic cross-sectional diagram illustrating pixels of a solid-state imaging element according to a first embodiment of the present technology.

Hereinafter, preferred modes for carrying out the present technology will be described with reference to the drawings. It should be noted that the embodiments described below are only examples of typical embodiments of the present technology and the scope of the present technology is not restricted by them. In addition, the present technology may be implemented by combining any of the following embodiments and modifications thereof.

Note that the description will be given in the following order.

1. Solid-state imaging element according to first embodiment
   (1-1) Configuration example of solid-state imaging element
   (1-2) Exemplary circuit configuration of unit pixel
   (1-3) Configuration example of unit pixel
   (1-4) Example of circuit operation of unit pixel
   (1-5) Extension of dynamic range 2. Solid-state imaging element according to second embodiment
3. Solid-state imaging element according to third embodiment
4. Solid-state imaging element according to fourth embodiment
5. Solid-state imaging element according to fifth embodiment
6. Solid-state imaging element according to sixth embodiment
7. Solid-state imaging element according to seventh embodiment
8. Solid-state imaging element according to eighth embodiment
9. Solid-state imaging element according to ninth embodiment
   (9-1) Example of cross-sectional structure of solid-state imaging element
   (9-2) Exemplary circuit configuration of unit pixel
   (9-3) Configuration example of unit pixel
   (9-4) Example of circuit operation of unit pixel
   (9-5) Extension of dynamic range
10. Solid-state imaging element according to tenth embodiment
11. Solid-state imaging element according to eleventh embodiment
12. Solid-state imaging element according to twelfth embodiment
13. Solid-state imaging element according to thirteenth embodiment
14. Solid-state imaging element according to fourteenth embodiment
15. Solid-state imaging element according to fifteenth embodiment
16. Solid-state imaging element according to sixteenth embodiment
    (16-1) Configuration example of solid state imaging device
    (16-2) Operation example of unit pixel
17. Solid-state imaging element according to seventeenth embodiment
18. Solid-state imaging element according to eighteenth embodiment
19. Electronic apparatus according to nineteenth embodiment
20. Usage examples of solid-state imaging element to which present technology is applied
21. Example of application to mobile body 1. Solid-State Imaging Element According to First Embodiment A solid-state imaging element according to a first embodiment of the present technology will be described with reference to FIGS. 1, 2, 3A, 3B, 4, 5A, 5B and 5C. The solid-state imaging element according to the present embodiment is a solid-state imaging element, such as a complementary metal oxide semiconductor (CMOS) image sensor or charge coupled device (CCD) image sensor, configured to capture an image of an object and obtain digital data about a captured image.

(1-1) Example of Cross-Sectional Structure of Solid-State Imaging Element

Firstly, an example of a cross-sectional structure of a solid-state imaging element according to the present embodiment will be described with reference to FIG. 1. FIG. 1 is a schematic cross-sectional diagram of pixels illustrating the solid-state imaging element according to the present embodiment. As illustrated in FIG. 1, the solid-state imaging element 10 according to the present embodiment is a front-illuminated type CMOS solid-state imaging element. In the front-illuminated CMOS solid-state imaging element, a wiring layer in which a connection line 121 and the like are formed, a lower electrode 131, an electrochromic film 132, and an upper electrode 133 are stacked on a semiconductor substrate, and in the semiconductor substrate, a photodiode (PD) 101 as an example of a photoelectric conversion element is formed. Furthermore, in the solid-state imaging element 10, color filters 141 of red, green, and blue are formed in a layer above the upper electrode 133, and on-chip lenses 142 are formed in a layer above the color filters 141. The photodiode 101 is formed in each pixel of a pixel array of a red pixel, green pixel, and blue pixel arranged on the semiconductor substrate in a matrix form.

Since the lower electrode 131 and the upper electrode 133 need to be transparent, for example, a material, such as indium tin oxide (ITO) or indium zinc oxide (IZO) is used. The electrochromic film 132 is provided in an optical incidence path to the photodiode 101 and includes an electrochromic material having light transmittance changing according to an applied voltage. Furthermore, the electrochromic film 132 has a property that the light transmittance changes from a first transmittance to a second transmittance according to an applied voltage.

In the wiring layer, a transfer transistor 102, a capacitance connection transistor 104, a reset transistor 105, an overflow gate 106, and a floating capacitor FC are formed near a contact surface with the semiconductor substrate. Furthermore, in the wiring layer, two connection lines 121 are formed that connects the semiconductor substrate and the lower electrode 131. In addition, the transfer transistor 102, the capacitance connection transistor 104, the reset transistor 105, the overflow gate 106, and the floating capacitor FC are connected to a pixel drive line 122 via connection lines.

In the semiconductor substrate, a floating diffusion (FD) portion 103 as a floating diffusion region is formed between and below the transfer transistor 102 and capacitance connection transistor 104 adjoining each other. The FD portion 103 serves as a first accumulation portion that accumulates electric charge obtained by photoelectric conversion by the photodiode 101 as a first photoelectric conversion element. Furthermore, in the semiconductor substrate, a storage capacitor 107 is formed that includes the floating capacitor FC and a diffusion layer positioned below the floating capacitor FC. The storage capacitor 107 serves as a second accumulation portion. The storage capacitor 107 is connected to the lower electrode 131 via one of the connection lines 121. Note that, in the present embodiment, for an example, "capacitance" represents a two-terminal element, and the capacitance is formed by a diffusion layer and a floating capacitor FC including polysilicon (and an insulating film therebetween).

(1-2) Exemplary Circuit Configuration of Unit Pixel

Figure 2:
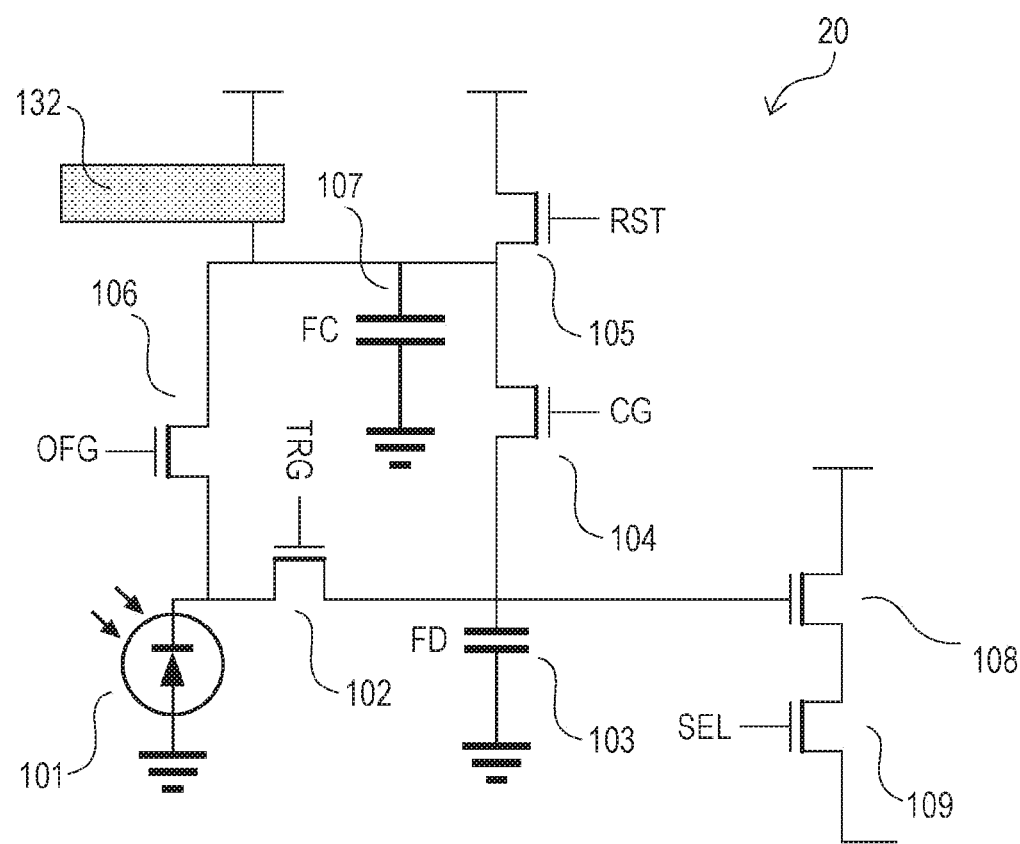
FIG. 2 is a circuit configuration diagram illustrating an equivalent circuit of a unit pixel of FIG. 1.

Next, an exemplary circuit configuration of a unit pixel according to the present embodiment will be described with reference to FIG. 2. FIG. 2 is a circuit configuration diagram illustrating an equivalent circuit of the unit pixel according to the present embodiment.

As illustrated in FIG. 2, the unit pixel 20 according to the present embodiment includes a photodiode 101, a transfer transistor 102, a FD portion 103 including a floating capacitor FC, a capacitance connection transistor 104, a reset transistor 105, and an overflow gate 106, and a storage capacitor 107 including a floating capacitor FC. Furthermore, the unit pixel 20 includes an amplifier transistor 108 and a selection transistor 109.

In the unit pixel 20, a plurality of row control lines, which is not shown in FIG. 2 for simplification of the drawing, is disposed commonly for pixels in the same pixel row. A row control line for each pixel row of the plurality of row control lines is connected to an output terminal of a vertical drive unit corresponding to each pixel row. When driving each unit pixel 20 of a pixel array portion, the vertical drive unit appropriately outputs a transfer signal TRG being a transfer pulse on the side of a PD 201, a reset signal RST, and a selection signal SEL to the plurality of row control lines.

The photodiode 101 has an anode electrode that is connected to a negative power supply such as ground, photoelectrically converts received light into photoelectrons being a photocharge having an amount of electric charge according to a light amount of the received light, and accumulates the photoelectrons. The photodiode 101 has a cathode electrode that is connected to a source electrode of the transfer transistor 102 and a source electrode of the overflow gate 106. Furthermore, the photodiode 101 is electrically connected to the FD portion 103 via the transfer transistor 102. Furthermore, the photodiode 101 is electrically connected to an electrochromic film 132 and the storage capacitor 107 via the overflow gate 106.

The transfer transistor 102 has a drain electrode that is connected to the FD portion 103. The transfer transistor 102 has a gate electrode to which a transfer signal TRG is supplied from the vertical drive unit. When the transfer transistor 102 becomes conductive in response to the transfer signal TRG, photocharge obtained by photoelectric conversion by the photodiode 101 and accumulated therein is transferred to the FD portion 103.

The FD portion 103 is connected to a source electrode of the capacitance connection transistor 104 and a gate electrode of the amplifier transistor 108. Furthermore, the FD portion 103 is connected to one end of the floating capacitor FC, and the other end of the floating capacitor FC is connected to ground. Note that the FD portion 103 can be formed as a charge accumulation portion that accumulates electric charge to apply a voltage to the electrochromic film 132 as a first film. However, the charge accumulation portion may be provided separately from the FD portion 103.

The capacitance connection transistor 104 has a drain electrode that is connected to a source electrode of the reset transistor 105 and the storage capacitor 107. The capacitance connection transistor 104 has a gate electrode to which a capacitance connection signal CG is given from the vertical drive unit. When the capacitance connection transistor 104 becomes conductive in response to the capacitance connection signal CG, the FD portion 103 and the storage capacitor 107 are connected to each other.

The reset transistor 105 has a drain electrode that is connected to a power supply. The reset transistor 105 has a gate electrode to which a reset signal RST is given from the vertical drive unit. The reset transistor 105 becomes conductive in response to the reset signal RST, supplies electric charge in the FD portion 103 and/or the storage capacitor 107 to the power supply, and resets the FD portion 103 and/or the storage capacitor 107.

The overflow gate 106 has a drain electrode that is connected to the electrochromic film 132 and the storage capacitor 107. The overflow gate 106 has a gate electrode to which an overflow signal OFG is given from the vertical drive unit. When the overflow gate 106 becomes conductive in response to the overflow signal OFG, photocharge obtained by photoelectric conversion by the photodiode 101 and accumulated therein is supplied to the electrochromic film 132 and/or the storage capacitor 107.

The storage capacitor 107 is connected to the drain electrode of the capacitance connection transistor 104, a source electrode of the reset transistor 105, the drain electrode of the overflow gate 106, and the electrochromic film 132. Furthermore, the storage capacitor 107 is connected to one end of the floating capacitor FC, and the other end of the floating capacitor FC is connected to ground. Note that the storage capacitor 107 can be formed as a charge accumulation portion that accumulates electric charge to apply a voltage to the electrochromic film 132 as a first film.

The amplifier transistor 108 has a drain electrode connected to the power supply and a source electrode connected to a drain electrode of the selection transistor 109. The amplifier transistor 108 has a source electrode that is connected to a vertical signal line via the selection transistor 109.

The selection transistor 109 has a source electrode that is connected to the vertical signal line. The selection transistor 109 has a gate electrode to which a selection signal SEL is given from the vertical drive unit. When the selection transistor 109 becomes conductive in response to the selection signal SEL, a pixel signal amplified by the amplifier transistor 108 is output to the vertical signal line while the unit pixel 20 is in a selected state.

Note that the selection transistor 109 can be disposed so as to be connected between the drain electrode of the amplifier transistor 108 and the power supply. In other words, the selection transistor 109 being connected to the amplifier transistor 108 in series between the power supply and the vertical signal line is operable to select a unit pixel 20.

(1-3) Configuration Example of Unit Pixel

Figure 3A:
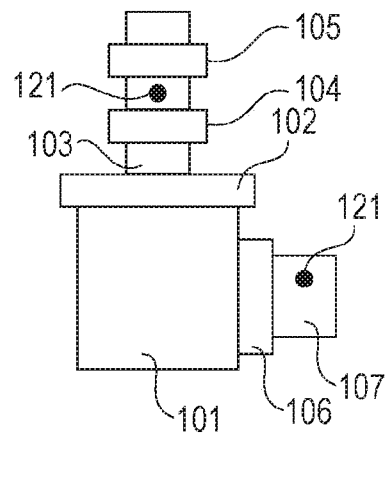
FIGS. 3A and 3B illustrate schematic plan views of the unit pixel of FIG. 1.
Figure 3B:
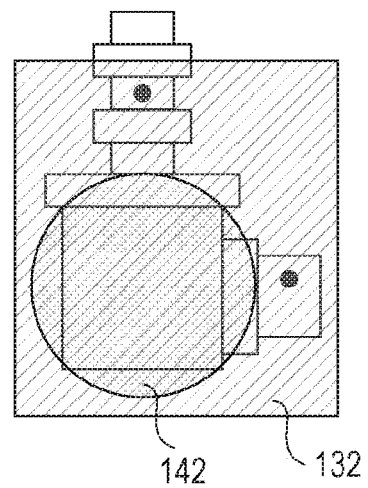

Next, a configuration example of the unit pixel according to the present embodiment will be described with reference to FIGS. 3A, 3B, and 4. FIGS. 3A and 3B illustrate schematic plan views of the unit pixel according to the present embodiment. FIG. 3A is a schematic plan view of the unit pixel 20 from which the electrochromic film 132 and an on-chip lens 142 are removed, and FIG. 3B is a schematic plan view of the unit pixel 20 in which the electrochromic film 132 and the on-chip lens 142 which are arranged to cover the photodiode 101 are also shown.

As illustrated in FIG. 3A, when viewing the unit pixel 20 from above, as an example, the transfer transistor 102, the FD portion 103, the capacitance connection transistor 104, and the reset transistor 105 are connected to one side of the photodiode 101 of rectangular shape. The overflow gate 106 and the storage capacitor 107 are connected to another side adjacent to the one side of the photodiode 101 of rectangular shape. Furthermore, the connection lines 121 are formed between the capacitance connection transistor 104 and the reset transistor 105 and at a position of the storage capacitor 107.

As illustrated in FIG. 3B, as an example, the electrochromic film 132 of rectangular shape is disposed above the unit pixel 20 to cover the unit pixel 20. Above the electrochromic film 132, as an example, the on-chip lens 142 of circular shape is disposed at a position to cover the photodiode 101, the transfer transistor 102, and the overflow gate 106.

For the electrochromic film 132 according to the present embodiment, for example, a material having a transmittance changing according to applied voltage, such as tungsten oxide, can be used. In addition, the electrochromic film 132 according to the present embodiment may include a material such as a magnesium-titanium alloy, magnesium-nickel alloy, or tantalum oxide.

Figure 4:
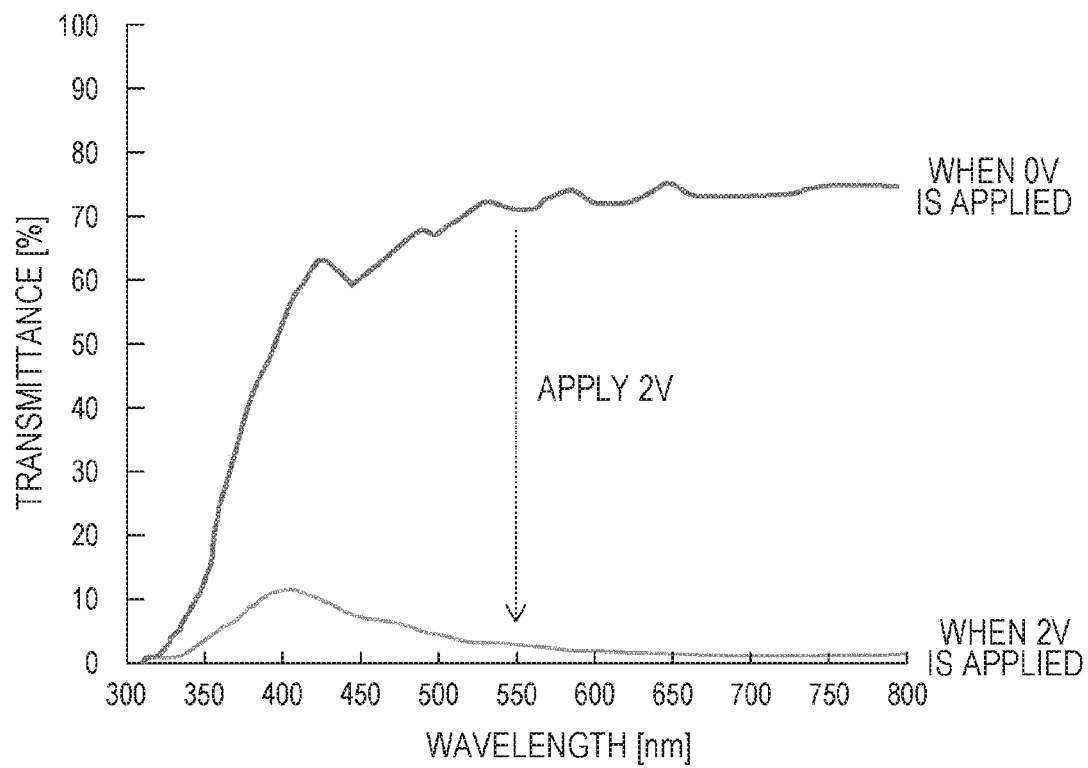
FIG. 4 is a graph illustrating a typical characteristic shown when a voltage is applied to the electrochromic film of FIG. 1.

FIG. 4 is a graph illustrating a typical characteristic shown when a voltage is applied to the electrochromic film 132 according to the present embodiment including tungsten oxide. A solid line at the upper part of FIG. 4 indicates transmittance obtained when a voltage applied between the upper electrode 133 and the lower electrode 131 is 0 V. A solid line at the lower part of FIG. 4 indicates transmittance obtained when a voltage applied between the upper electrode 133 and the lower electrode 131 is 2 V. When voltage applied between the upper electrode 133 and the lower electrode 131 is 0 V, transmittance is around 70% in the visible light region (approximately 380 nm to 780 nm), whereas when the voltage is 2V, T transmittance changes to 10% or less.

(1-4) Example of Circuit Operation of Unit Pixel

Next, an example of the circuit operation of the unit pixel 20 according to the present embodiment will be described.

Normally, electric charge obtained by photoelectric conversion by the photodiode 101 during exposure is accumulated in the photodiode 101, and when reading out the electric charge, the transfer transistor 102 is turned on to transfer the electric charge to the FD portion 103, and a signal is output to the outside via the amplifier transistor 108 and the selection transistor 109.

Next, when strong light exceeding an amount of saturation charge of the photodiode 101 is incident thereon, electric charge leaks out via the overflow gate 106 and is accumulated in the storage capacitor 107. When reading out the electric charge accumulated in the storage capacitor 107, the capacitance connection transistor 104 is turned on to output a signal to the outside via the amplifier transistor 108 and the selection transistor 109.

After the electric charge has been read out, the potential of the accumulation portion is reset so that the transmittance of the electrochromic film 132 is set high. At this time, by turning on the reset transistor 105, the storage capacitor 107 is reset. Furthermore, by turning on the reset transistor 105 and the capacitance connection transistor 104, the FD portion 103 is also reset.

Here, since the storage capacitor 107 is connected to the lower electrode 131, when reset potential and a potential supplied to the upper electrode 133 are set equal to each other, voltage applied to the electrochromic film 132 becomes 0 V upon resetting. In other words, in a reset state, the electrochromic film 132 has a high transmittance.

Then, upon incidence of strong light, electric charge including holes and electrons are gradually accumulated in the storage capacitor 107 via the overflow gate 106 according to the amount of electric charge obtained by photoelectric conversion by the photodiode 101.

Here, means for accumulating electric charge in the accumulation portion variously includes use of an overflow charge from the photodiode, holding a signal electric charge obtained by pre-exposure, use of a sweep-out electric charge during the electronic shutter operation, and the like.

As electric charge is accumulated in the storage capacitor 107, the potential decreases, and a potential difference is gradually generated between the storage capacitor 107 and the upper electrode 133. When a potential difference is generated, the more the amount of photoelectrons is, the more the voltage applied to the electrochromic film 132 is, and the transmittance decreases. When the transmittance decreases, the amount of light incident on the photodiode 101 decreases and a photocharge to be generated also decreases, decreasing the sensitivity. Thus, dynamic range can be extended.

As described above, exposure is performed in a state where the pixels have transmittances of the electrochromic films 132 being different according to amount of light. At this time, it is preferable to cause the storage capacitor 107 to keep holding accumulated electric charge during a period of the exposure. Then, a signal obtained by photoelectric conversion is read out to obtain an output.

(1-5) Extension of Dynamic Range

Figure 5A:
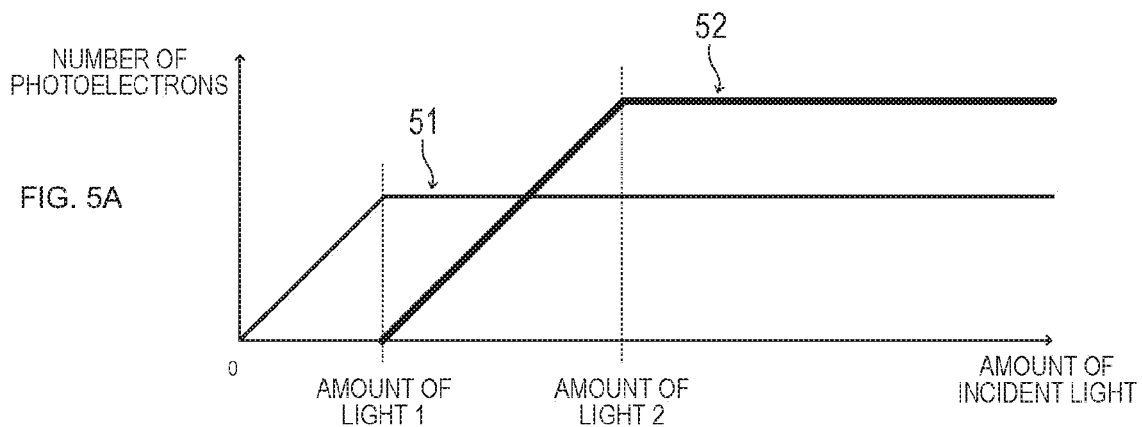
FIGS. 5A, 5B, and 5C illustrate graphs of photoelectric conversion characteristics of the solid-state imaging element of FIG. 1.
Figure 5B:
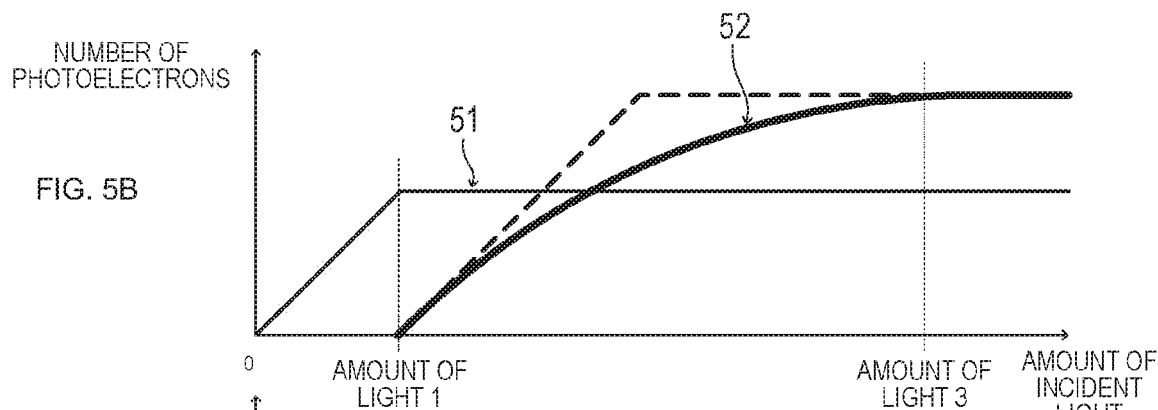
Figure 5C:
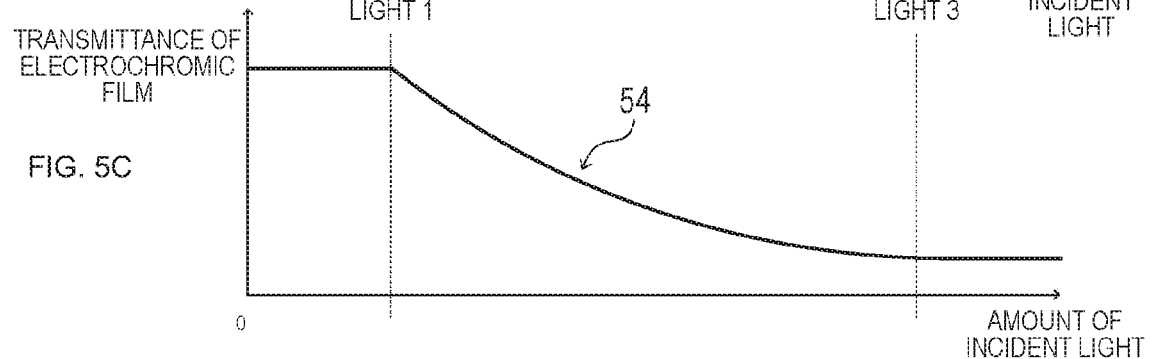

Next, dynamic range extended by the solid-state imaging element 10 according to the present embodiment will be described with reference to FIGS. 5A, 5B, and 5C. FIGS. 5A, 5B, and 5C illustrate graphs of photoelectric conversion characteristics of the solid-state imaging element 10 according to the present embodiment. FIG. 5A is a graph illustrating a photoelectric conversion characteristic obtained in a case where the electrochromic film 132 is not provided, FIG. 5B is a graph illustrating a photoelectric conversion characteristic obtained in a case where the electrochromic film 132 is provided, and FIG. 5C is a graph illustrating a relationship between light transmittance of the electrochromic film 132 and amount of incident light.

As indicated by a solid line 51 in FIG. 5A, in a case where the electrochromic film 132 is not provided, firstly, as the amount of incident light increases from a dark state, the number of photoelectrons accumulated in the photodiode 101 also increases linearly. Then, when the amount of incident light reaches light amount 1 and the photodiode 101 is saturated with accumulated electrons, no more electric charge can be accumulated in the photodiode 101.

Thereafter, generated photoelectrons are accumulated in the storage capacitor 107 via the overflow gate 106. Therefore, when the amount of incident light exceeds light amount 1, the number of electrons accumulated in the photodiode 101 does not increase as indicated by the solid line 51, and the number of electrons accumulated in the storage capacitor 107 increases as indicated by a solid line 52. Then, as indicated by the solid line 52, when the amount of light further increases and reaches light amount 2 and the storage capacitor 107 is saturated with accumulated electrons, no more electric charge can be accumulated.

Therefore, by reading out electrons accumulated in the photodiode 101, reading out electrons accumulated in the storage capacitor 107, and adding up the electrons, output that is not saturated before light amount 2 can be obtained. However, in a case where the amount of light exceeds light amount 2, output is saturated, and it becomes impossible to know the correct amount of light.

On the other hand, a photoelectric conversion characteristic obtained in a case where the electrochromic film 132 is provided will be described with reference to FIG. 5B.

Firstly, in a reset state, the electrochromic film 132 has a high transmittance, and the transmittance does not change before electric charge accumulated in the storage capacitor 107 changes. Therefore, from a dark state to light amount 1, the same photoelectric conversion characteristic as that indicated by the solid line 51 of 5A is shown.

When the amount of light exceeds light amount 1, electric charge is gradually accumulated in the storage capacitor 107 as indicated by a solid line 53, and the transmittance of the electrochromic film 132 decreases according to the accumulation of the electric charge as indicated by a solid line 54 in FIG. 5C. In other words, since the sensitivity gradually decreases, the gradient of the number of electrons accumulated in the storage capacitor 107 is gradually laid, compared with the case where the electrochromic film 132 is not provided (indicated by a dashed line in FIG. 5B)

Therefore, even when the amount of light exceeds light amount 2, the storage capacitor 107 is not saturated with accumulated electrons and saturated with accumulated electrons at light amount 3 which is higher than light amount 2. In other words, output that is not saturated before light amount 3 can be obtained, and dynamic range is extended. Furthermore, by reading out electrons accumulated in the photodiode 101, reading out electrons accumulated in the storage capacitor 107, and adding up the electrons, a linear output can be obtained from a dark state to light amount 1 and a logarithmic output can be obtained from light amount 1 to light amount 3, with respect to the amount of light.

As described above, employment of the solid-state imaging element 10 according to the present embodiment enables to extend the dynamic range from light amount 2 to light amount 3. Therefore, unlike the technology described in Patent Document 1, the present technology can provide a solid-state imaging element configured to automatically extend the dynamic range for each unit pixel.

Furthermore, according to the present technology, a charge detection unit or a voltage application unit does not need to be provided outside a pixel, and a voltage applied to the electrochromic film can be controlled only by the elements in the pixel, increasing no power consumption or chip area.

Furthermore, in the present technology, voltage applied to the electrochromic film can be controlled individually for each pixel, and the control thereof is automatically adjusted according to the amount of light incident on the pixel. Therefore, even if pixels have great differences in the amount of incident light, each pixel is adjusted in an optimum state.

2. Solid-State Imaging Element According to Second Embodiment

Figure 6:
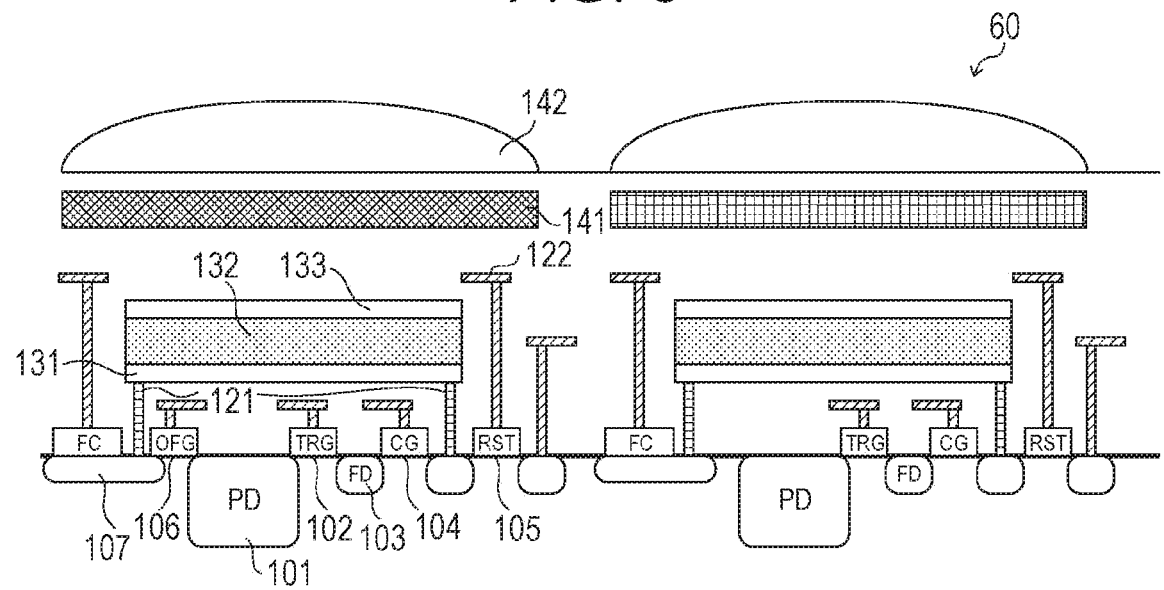
FIG. 6 is a schematic cross-sectional diagram illustrating pixels of a solid-state imaging element according to a second embodiment of the present technology.

A solid-state imaging element according to a second embodiment of the present technology will be described with reference to FIG. 6. FIG. 6 is a schematic cross-sectional diagram illustrating pixels of the solid-state imaging element according to the second embodiment of the present technology. The present embodiment is different from the first embodiment in that the electrochromic film 132 is disposed in the wiring layer. Note that the similar configurations as those of the first embodiment are denoted by the same reference numerals, and description thereof will be omitted.

In the solid-state imaging element 10 according to the first embodiment, the electrochromic film 132 having an optical characteristic changing according to an applied voltage is disposed between the color filter 141 and the pixel drive line 122 which is disposed in the wiring layer. On the other hand, in the solid-state imaging element 60 according to the present embodiment, the electrochromic film 132 is disposed below the pixel drive line 122 as illustrated in FIG. 6. As described above, the electrochromic film 132 may be disposed in any layer, as long as the electrochromic film 132 is positioned on an optical path of light incident on the photodiode 101. Therefore, the above configuration also enables the solid-state imaging element 60 according to the present embodiment to obtain similar pixel circuit operation and effects as those of the solid-state imaging element 10 according to the first embodiment. Furthermore, in the solid-state imaging element 60 according to the present embodiment, the electrochromic film 132 is disposed closer to the PD 101 compared with the solid-state imaging element 10 according to the first embodiment. Therefore, the optical characteristic may be effectively improved depending on the cross-sectional structure such as the number of wiring layers, compared with the solid-state imaging element 10 according to the first embodiment.

3. Solid-State Imaging Element According to Third Embodiment

Figure 7:
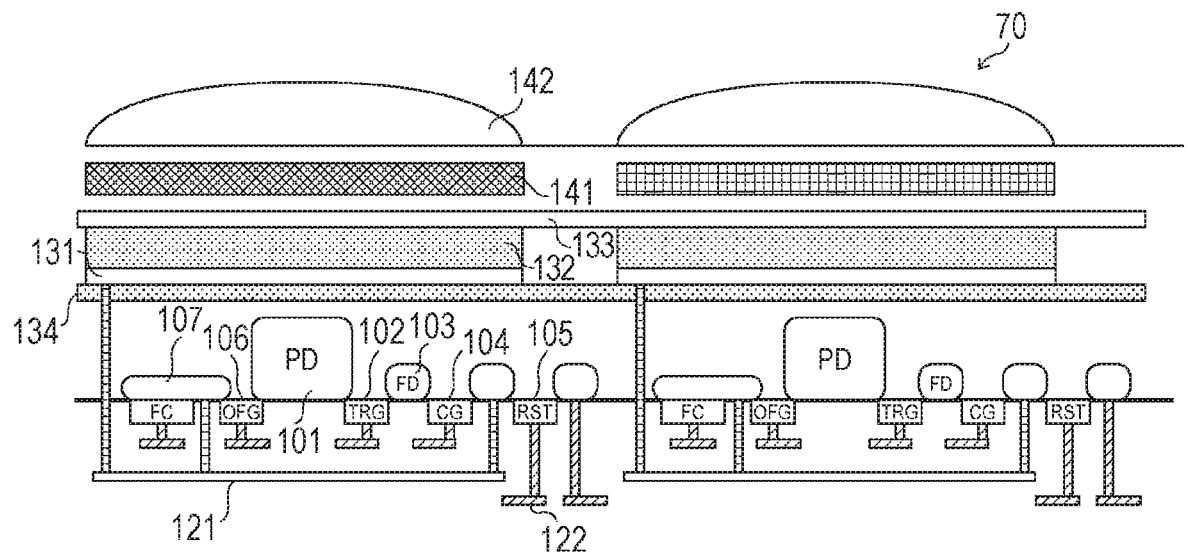
FIG. 7 is a schematic cross-sectional diagram illustrating pixels of a solid-state imaging element according to a third embodiment of the present technology.

A solid-state imaging element according to a third embodiment of the present technology will be described with reference to FIG. 7. FIG. 7 is a schematic cross-sectional diagram illustrating pixels of the solid-state imaging element according to the third embodiment of the present technology. The present embodiment is different from the first embodiment in that a back-illuminated type solid-state imaging element is used. Note that the similar configurations as those of the first embodiment are denoted by the same reference numerals, and description thereof will be omitted.

As illustrated in FIG. 7, since the solid-state imaging element 70 according to the present embodiment is the back-illuminated type solid-state imaging element, the wiring layer is disposed below the semiconductor substrate of the photodiode 101. Furthermore, an insulating film 134 is provided between the semiconductor substrate and the lower electrode 131 to prevent short circuit. Therefore, the connection line 121 is connected to the lower electrode 131 through the semiconductor substrate of the photodiode 101 and the insulating film 134. The above configuration also enables the solid-state imaging element 70 according to the present embodiment to obtain similar pixel circuit operation and effects as those of the solid-state imaging element 10 according to the first embodiment. In addition, since the solid-state imaging element 70 according to the present embodiment is of back-illuminated type, the sensitivity of the PD 101 and freedom degree in wiring layout may be effectively improved.

4. Solid-State Imaging Element According to Fourth Embodiment

Figure 8:
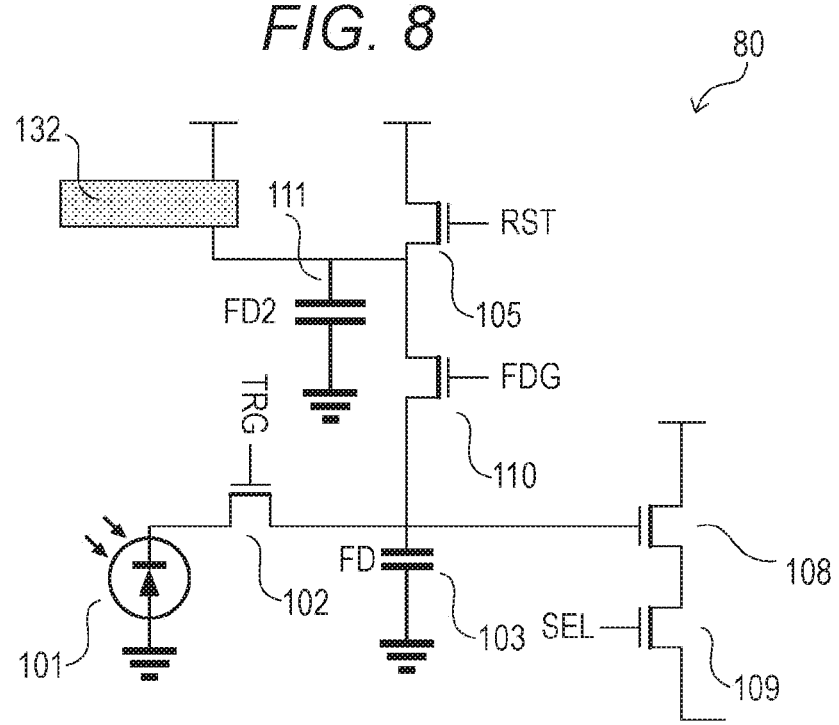
FIG. 8 is a schematic circuit diagram illustrating an equivalent circuit of a unit pixel according to a fourth embodiment of the present technology.

A solid-state imaging element according to a fourth embodiment of the present technology will be described with reference to FIG. 8. FIG. 8 is a schematic circuit diagram illustrating an equivalent circuit of a unit pixel according to the fourth embodiment of the present technology. The present embodiment is different from the first embodiment in that, a circuit configuration of the unit pixel does not include the overflow gate 106 and includes an FD portion that is an additional floating diffusion region instead of the storage capacitor 107. Note that the similar configurations as those of the first embodiment are denoted by the same reference numerals, and description thereof will be omitted.

As illustrated in FIG. 8, the unit pixel 80 according to the present embodiment includes a photodiode 101, a transfer transistor 102, an FD portion 103 including a floating capacitor FC, and a floating diffusion (FD) capacitance switching switch 110 as a floating diffusion region, a reset transistor 105, and an FD portion 111 including a floating capacitor FC. Furthermore, the unit pixel 80 includes an amplifier transistor 108 and a selection transistor 109.

The FD capacitance switching switch 110 has a source electrode that is connected to the FD portion 103. The FD capacitance switching switch 110 has a drain electrode that is connected to a source electrode of the reset transistor 105 and the FD portion 111. The FD capacitance switching switch 110 has a gate electrode to which a capacitance connection signal FDG is given from a vertical drive unit. When the FD capacitance switching switch 110 becomes conductive in response to the capacitance connection signal FDG, the FD portion 103 and the FD portion 111 are connected to each other.

The FD portion 111 is connected to the drain electrode of the FD capacitance switching switch 110, the source electrode of the reset transistor 105, and an electrochromic film 132. Furthermore, the FD portion 111 is connected to one end of the floating capacitor FC, and the other end of the floating capacitor FC is connected to ground. Note that the FD portion 111 can be formed as a charge accumulation portion that accumulates electric charge to apply a voltage to the electrochromic film 132 as a first film.

Next, an example of the circuit operation of the unit pixel 80 according to the present embodiment will be described. Normally, electric charge obtained by photoelectric conversion by the photodiode 101 during exposure is accumulated in the photodiode 101, and when reading out the electric charge, the transfer transistor 102 is turned on to transfer the electric charge to the FD portion 103, and a signal is output to the outside via the amplifier transistor 108 and the selection transistor 109.

The unit pixel 80 is configured to switch a capacitance value of a floating diffusion region by turning on and off the FD capacitance switching switch 110 so that a high sensitivity mode and a low sensitivity mode are switched. When the FD capacitance switching switch 110 is off, only the capacitance of the FD portion 103 is provided, having a small capacitance. Therefore high voltage amplitude can be obtained even with a small number of photoelectrons and the high sensitivity mode is provided. When the FD capacitance switching switch 110 is on, the capacitance of both of the FD portion 103 and the additional floating diffusion region 111 is provided, having a large capacitance. Therefore, small voltage amplitude can be obtained with a large number of photoelectrons transferred, and the low sensitivity mode which is unlikely to be saturated is provided.

Before exposure is started, the potential of the accumulation portion is reset, and the transmittance of the electrochromic film 132 is set high. At this time, by turning on the reset transistor 105, the additional floating diffusion region 111 is reset. Furthermore, by turning on the reset transistor 105 and the FD capacitance switching switch 110, the FD portion 103 is also reset.

Here, since the additional floating diffusion region 111 is connected to a lower electrode 131, if reset potential and a potential applied to an upper electrode 133 are set equal to each other, voltage applied to the electrochromic film 132 becomes 0 V upon resetting. In other words, in a reset state, the electrochromic film 132 has a high transmittance.

Next, pre-exposure is performed. After the pre-exposure is finished, the transfer transistor 102 is turned on while the FD capacitance switching switch 110 is on, and photoelectrons accumulated in the photodiode 101 are transferred to the FD portion 103 and the additional floating diffusion region 111. Then, the more the number of photoelectrons is, the less the potential of the additional floating diffusion region 111 is, and thus, voltage applied to the electrochromic film 132 increases and the transmittance decreases. In other words, the more the amount of light during pre-exposure is, the less the transmittance is.

Thereafter, the main exposure is started with electric charge in the additional floating diffusion region 111 held.

Then, as the amount of light during pre-exposure is larger, the exposure is performed in a lower sensitivity state, and saturation of the photodiode 101 can be suppressed. Thus, dynamic range can be extended. The above configuration also enables the solid-state imaging element including the unit pixel 80 according to the present embodiment to obtain similar pixel circuit operation and effects to those of the solid-state imaging element 10 according to the first embodiment.

5. Solid-State Imaging Element According to Fifth Embodiment

Figure 9:
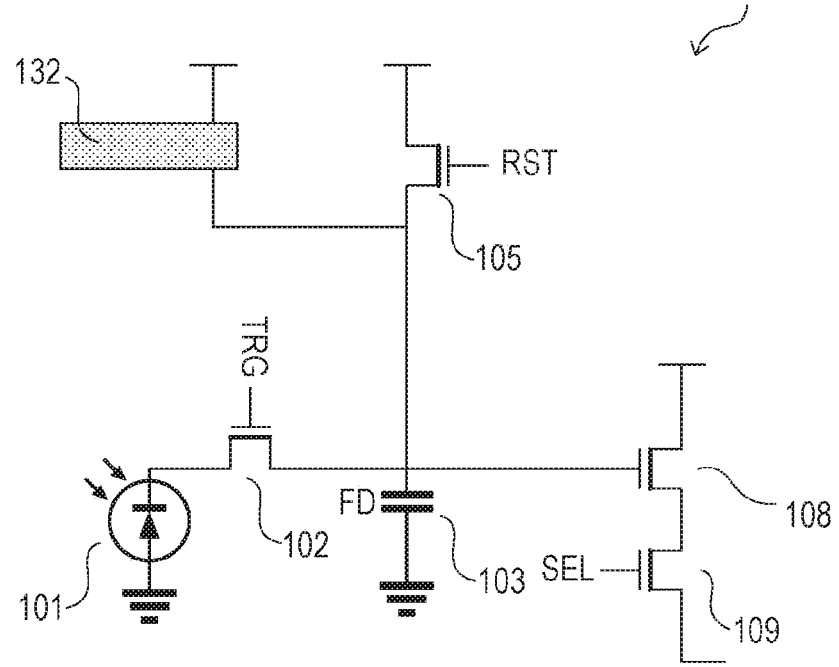
FIG. 9 is a schematic circuit diagram illustrating an equivalent circuit of a unit pixel according to a fifth embodiment of the present technology.

A solid-state imaging element according to a fifth embodiment of the present technology will be described with reference to FIG. 9. FIG. 9 is a schematic circuit diagram illustrating an equivalent circuit of a unit pixel according to the fifth embodiment of the present technology. The present embodiment is different from the first embodiment in that a circuit configuration of the unit pixel does not include the overflow gate 106 and the storage capacitor 107. Note that the similar configurations as those of the first embodiment are denoted by the same reference numerals, and description thereof will be omitted.

As illustrated in FIG. 9, the unit pixel 90 according to the present embodiment includes a photodiode 101, a transfer transistor 102, an FD portion 103 including a floating capacitor FC, and a reset transistor 105. In addition, the unit pixel 90 includes an amplifier transistor 108 and a selection transistor 109.

Next, an example of the circuit operation of the unit pixel 90 according to the present embodiment will be described with reference to FIG. 9. Normally, electric charge obtained by photoelectric conversion by the photodiode 101 during exposure is accumulated in the photodiode 101, and when reading out the electric charge, the transfer transistor 102 is turned on to transfer the electric charge to the FD portion 103, and a signal is output to the outside via the amplifier transistor 108 and the selection transistor 109.

Before exposure is started, the potential of the accumulation portion is reset, and the transmittance of an electrochromic film 132 is set high. At this time, the reset transistor 105 is turned on, and the FD portion 103 is reset.

Here, since the FD portion 103 is connected to a lower electrode 131, if reset potential and a potential applied to an upper electrode 133 are set equal to each other, voltage applied to the electrochromic film 132 becomes 0 V upon resetting. In other words, in a reset state, the electrochromic film 132 has a high transmittance.

Next, pre-exposure is performed. After the pre-exposure is finished, the transfer transistor 102 is turned on, and the photoelectrons accumulated in the photodiode 101 are transferred to the FD portion 103. Then, the more the number of photoelectrons is, the less the potential of the FD portion 103 is, and thus, a voltage applied to the electrochromic film 132 increases and the transmittance decreases. In other words, the more the amount of light during pre-exposure is, the less the transmittance is.

Thereafter, the main exposure is started with the electric charge in the FD portion 103 held. Then, as the amount of light during pre-exposure is larger, the exposure is performed in a lower sensitivity state, and saturation of the photodiode 101 can be suppressed. Thus, dynamic range can be extended.

Figure 10:
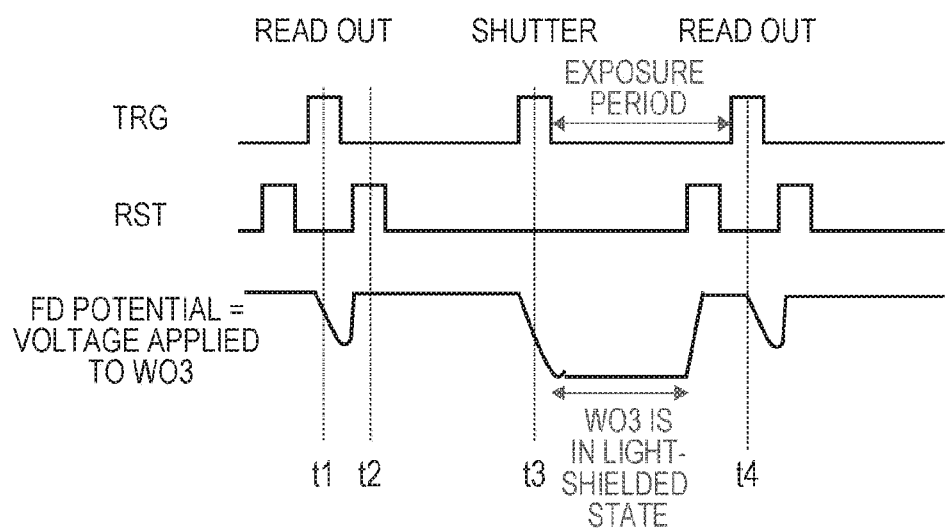
FIG. 10 is a graph illustrating the circuit operation of the unit pixel according to the fifth embodiment of the present technology.

Next, another example of the circuit operation of the unit pixel 90 according to the present embodiment will be described with reference to FIG. 10. FIG. 10 is a graph illustrating the circuit operation of the unit pixel 90 according to the present embodiment. Normally, electric charge obtained by photoelectric conversion by the photodiode 101 during exposure is accumulated in the photodiode 101, and for reading out the electric charge, the transfer transistor 102 is turned on to transfer the electric charge to the FD portion 103, and a signal is output to the outside via the amplifier transistor 108 and the selection transistor 109 (time t1).

Before exposure is started (time t2), the potential of the accumulation portion is reset, and the transmittance of the electrochromic film 132 is set high. At this time, the reset transistor 105 is turned on, and the FD portion 103 is reset.

Here, since the FD portion 103 is connected to a lower electrode 131, if reset potential and a potential applied to an upper electrode 133 are set equal to each other, voltage applied to the electrochromic film 132 becomes 0 V upon resetting. In other words, in a reset state, the electrochromic film 132 has a high transmittance.

Next, at time t3, an electronic shutter operation is performed. Specifically, the transfer transistor 102 is turned on to discharge electric charge accumulated in the photodiode 101. At this time, electric charge generated in the photodiode 101 from time t2 to time t3 is transferred to and held in the FD portion 103. Then, the more the amount of electric charge is, the less the potential of the FD portion 103 is, and thus, a voltage applied to the electrochromic film 132 increases and the transmittance decreases. In other words, the more the amount of incident light from time t2 to time t3 is, the less the transmittance is.

Thereafter, exposure is started with the electric charge in the FD portion 103 held. Then, as the amount of light incident from time t2 to time t3 is larger, the exposure is performed in a lower sensitivity state, and saturation of the photodiode 101 can be suppressed. Thus, dynamic range can be extended.

The above configuration also enables the solid-state imaging element including the unit pixel 90 according to the present embodiment to obtain similar pixel circuit operation and effects to those of the solid-state imaging element 10 according to the first embodiment.

6. Solid-State Imaging Element According to Sixth Embodiment

Figure 11:
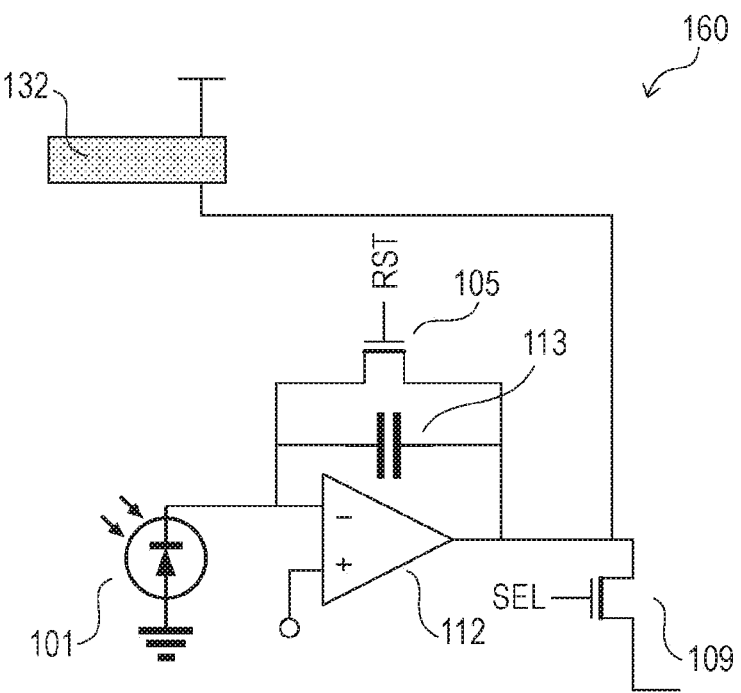
FIG. 11 is a schematic circuit diagram illustrating an equivalent circuit of a unit pixel according to a sixth embodiment of the present technology.

A solid-state imaging element according to a sixth embodiment of the present technology will be described with reference to FIG. 11. FIG. 11 is a schematic circuit diagram illustrating an equivalent circuit of a unit pixel according to the sixth embodiment of the present technology. The present embodiment is different from the first embodiment in that, a circuit configuration of the unit pixel includes an operational amplifier instead of using the transfer transistor 102. Note that the similar configurations as those of the first embodiment are denoted by the same reference numerals, and description thereof will be omitted.

As illustrated in FIG. 11, the unit pixel 160 according to the present embodiment includes a photodiode 101, an operational amplifier 112, a feedback capacitance 113, and a reset transistor 105. Furthermore, the unit pixel 160 includes a selection transistor 109.

The photodiode 101 has an anode electrode that is connected to a negative power supply such as ground, photoelectrically converts received light into photoelectrons being a photocharge having an amount of electric charge according to a light amount of the received light, and accumulates the photoelectrons. The photodiode 101 has a cathode electrode that is connected to a negative input terminal (inverting input terminal) of the operational amplifier 112, the feedback capacitance 113, and a source electrode of the reset transistor 105.

A positive input terminal (non-inverting input terminal) of the operational amplifier 112 is connected to a drive power supply. An output terminal of the operational amplifier 112, the feedback capacitance 113, and a drain electrode of the reset transistor 105 are connected to a drain electrode of the selection transistor 109 and an electrochromic film 132.

Next, an example of the circuit operation of the unit pixel 160 according to the present embodiment will be described. Before exposure is started, the potential of the accumulation portion is reset, and the transmittance of the electrochromic film 132 is set high. At this time, by turning on the reset transistor 105, the feedback capacitance 113 and the photodiode 101 are reset.

Here, since the output of the operational amplifier 112 is connected to a lower electrode 131, if the reset potential of the operational amplifier 112 and a potential applied to an upper electrode 133 are set equal to each other, voltage applied to the electrochromic film 132 becomes 0 V upon resetting. In other words, in a reset state, the electrochromic film 132 has a high transmittance.

Thereafter, the negative input terminal of the operational amplifier 112 is fixed to a constant potential by the operation of the operational amplifier 112, and electric charge obtained by photoelectric conversion during the exposure changes an output of the operational amplifier 112 via the feedback capacitance. Then, according to a formula Q=CV, an output potential V of the operational amplifier 112 is determined by a relationship between an amount Q obtained by photoelectric conversion and a capacitance value C of the feedback capacitance 113. At this time, the more the number of photoelectrons is, the more output potential of the operational amplifier 112 is, in proportion thereto. At this time, as the output of the operational amplifier 112 increases during the exposure, voltage applied to the electrochromic film 132 also increases, and the transmittance thereof decreases. After the exposure is finished, the output of the operational amplifier 112 is output to the outside via the selection transistor 109.

Next, dynamic range expanded by the solid-state imaging element using the unit pixels 160 according to the present embodiment will be described with reference to FIGS. 12A and 12B. FIGS. 12A and 12B illustrate graphs of photoelectric conversion characteristics of a solid-state imaging element according to the present embodiment. FIG. 12A is a graph illustrating a relationship between output of the operational amplifier and amount of incident light, and FIG. 12B is a graph illustrating a relationship between light transmittance of the electrochromic film and amount of incident light.

As indicated by a dashed line 161 in FIG. 12A, in a case where the electrochromic film 132 is not provided, output of the operational amplifier 112 rises in proportion to photocharge on the basis of a relationship of Q=CV, and the output potential of the operational amplifier 112 is saturated at light amount 1. Therefore, if more light is incident, it becomes impossible to know the correct amount of light.

On the other hand, in a case where the electrochromic film 132 is provided, as indicated by a solid line 163 in FIG. 12B, as the amount of light increases, the sensitivity decreases, and the number of generated photoelectrons decreases. Therefore, a logarithmic photoelectric conversion characteristic, of waveform as indicated by a solid line 162 in FIG. 12A, is obtained, and the output potential of the operational amplifier 112 is not saturated until a further higher amount of light is applied. Thus, dynamic range can be extended.

The above configuration also enables the solid-state imaging element including the unit pixel 160 according to the present embodiment to obtain similar pixel circuit operation and effects to those of the solid-state imaging element 10 according to the first embodiment.

7. Solid-State Imaging Element According to Seventh Embodiment

A solid-state imaging element according to a seventh embodiment of the present technology will be described with reference to FIG. 13. FIG. 13 is a schematic cross-sectional diagram illustrating pixels of the solid-state imaging element according to the seventh embodiment of the present technology. The present embodiment is different from the first embodiment in that two types of pixels are provided in which the electrochromic film 132 have different thicknesses. Note that the similar configurations as those of the first embodiment are denoted by the same reference numerals, and description thereof will be omitted.

In the solid-state imaging element 170 according to the present embodiment, viewing the drawing of FIG. 13, a pixel on the right side has the electrochromic film 132 with a thickness smaller than that of a pixel on the left side. Then, even if the same amount of electric charge is accumulated in the storage capacitor 107 with the same amount of light and the same voltage is applied to the electrochromic films 132, the pixel on the right side has a higher transmittance due to the smaller thickness of the electrochromic film 132.

Therefore, the above configuration enables the solid-state imaging element 170 according to the present embodiment to obtain similar pixel circuit operation and effects as those of the solid-state imaging element 10 according to the first embodiment and further achieve two types of pixels having different photoelectric conversion characteristics. Then, the solid-state imaging element 170 according to the present embodiment can further extend the dynamic range by combining outputs of the above two types of pixels by image processing.

8. Solid-State Imaging Element According to Eighth Embodiment

Figure 14:
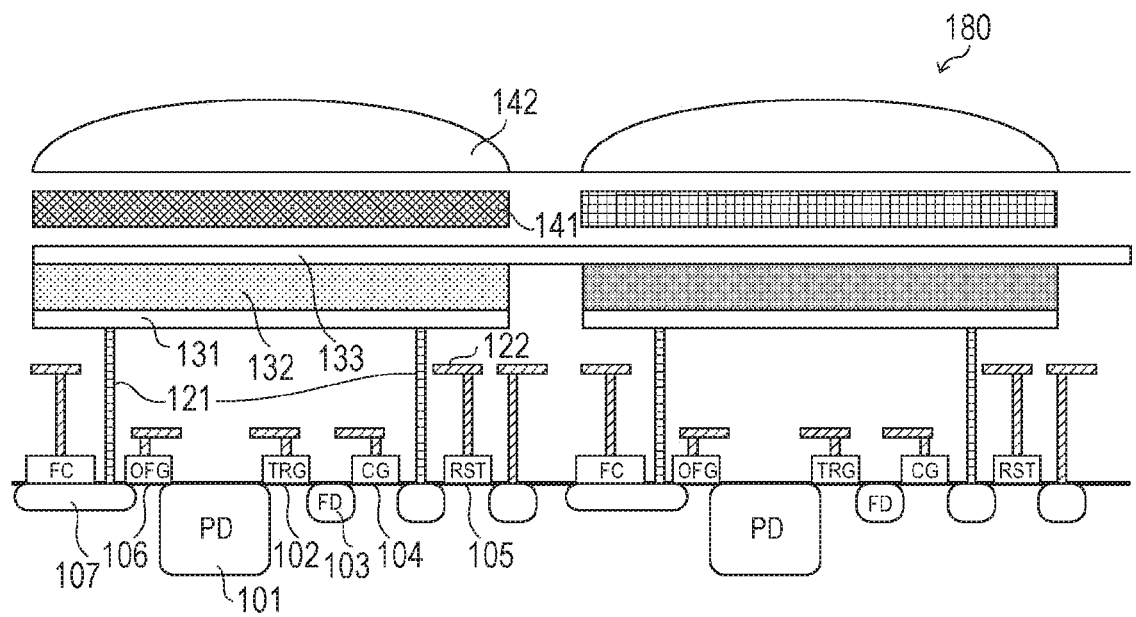
FIG. 14 is a schematic cross-sectional diagram illustrating pixels of a solid-state imaging element according to an eighth embodiment of the present technology.

A solid-state imaging element according to an eighth embodiment of the present technology will be described with reference to FIG. 14. FIG. 14 is a schematic cross-sectional diagram illustrating pixels of the solid-state imaging element according to the eighth embodiment of the present technology. The present embodiment is different from the first embodiment in that two types of pixels are provided in which the electrochromic film 132 includes different materials. Here, for the material of the electrochromic film 132, electrochromic films of different materials may be used or electrochromic films of the same material with different densities may be used. Note that the similar configurations as those of the first embodiment are denoted by the same reference numerals, and description thereof will be omitted.

In the solid-state imaging element 180 according to the present embodiment, viewing the drawing of FIG. 13, a pixel on the right side has an electrochromic film with a density larger than that of a pixel on the left side. Then, even if the same amount of electric charge is accumulated in the storage capacitor 107 with the same amount of light and the same voltage is applied to the electrochromic films 132, the pixel on the right side has a lower transmittance due to the larger density of the electrochromic film 132.

Therefore, the above configuration enables the solid-state imaging element 180 according to the present embodiment to obtain similar pixel circuit operation and effects as those of the solid-state imaging element 10 according to the first embodiment and further achieve two types of pixels having different photoelectric conversion characteristics. Then, the solid-state imaging element 180 according to the present embodiment can further extend the dynamic range by combining outputs of the above two types of pixels by image processing.

9. Solid-State Imaging Element According to Ninth Embodiment

A solid-state imaging element according to a ninth embodiment of the present technology will be described with reference to FIGS. 15, 16, 17A, 17B, 18, 19A and 19B. As in the solid-state imaging element according to the first embodiment, the solid-state imaging element according to the present embodiment is a solid-state imaging element, such as a complementary metal oxide semiconductor (CMOS) image sensor or charge coupled device (CCD) image sensor, configured to capture an image of an object and obtain digital data about a captured image.

(9-1) Example of Cross-Sectional Structure of Solid-State Imaging Element

Figure 15:
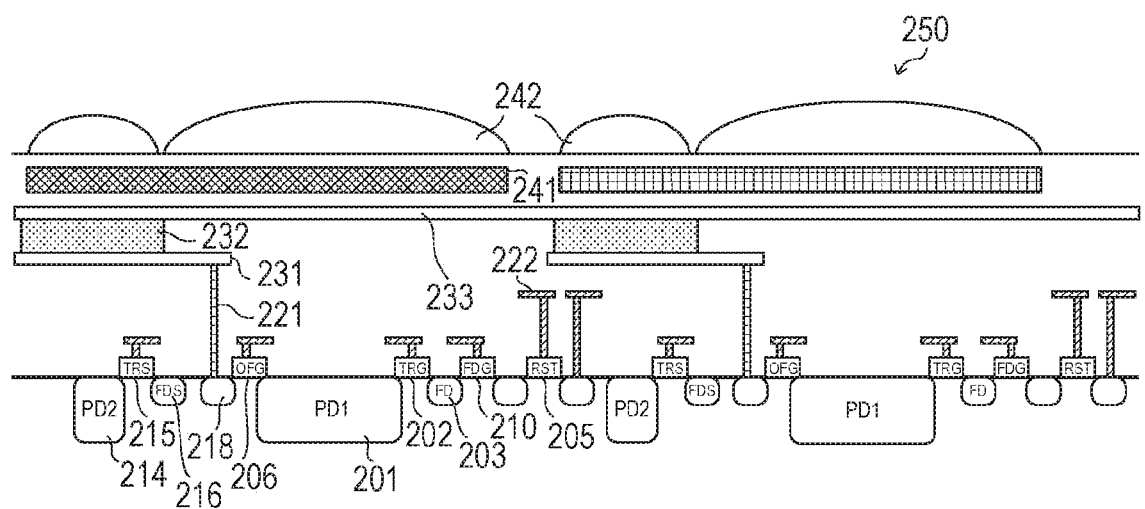
FIG. 15 is a schematic cross-sectional diagram illustrating pixels of a solid-state imaging element according to a ninth embodiment of the present technology.

Firstly, an example of a cross-sectional structure of the solid-state imaging element according to the present embodiment will be described with reference to FIG. 15 FIG. 15 is a schematic cross-sectional diagram of pixels illustrating the solid-state imaging element according to the present embodiment. As illustrated in FIG. 15, the solid-state imaging element 250 according to the present embodiment is a front-illuminated type CMOS solid-state imaging element, in the front-illuminated CMOS solid-state imaging element, a wiring layer in which a connection line 221 and the like are formed, a lower electrode 231, an electrochromic film 232, and an upper electrode 233 are stacked on a semiconductor substrate, and in the semiconductor substrate, a first photodiode 201 and a second photodiode 214 as an example of a photoelectric conversion element are formed. Furthermore, in the solid-state imaging element 250, color filters 241 of red, green, and blue are formed in a layer above the upper electrode 233, and on-chip lenses 242 are formed in a layer above the color filters 241. The first photodiode 201 and the second photodiode 214 are formed in each pixel of a pixel array of a red pixel, a green pixel, and a blue pixel arranged on the semiconductor substrate in a matrix.

Since the lower electrode 231 and the upper electrode 233 need to be transparent, for example, a material, such as indium tin oxide (ITO) or indium zinc oxide (IZO) is used. The electrochromic film 232 is provided in an optical incidence path to the second photodiode 214 and includes an electrochromic material having light transmittance changing according to an applied voltage. Furthermore, the electrochromic film 232 has a property that the light transmittance changes from a first transmittance to a second transmittance according to an applied voltage.

In the wiring layer, a first transfer transistor 202, a first reset transistor 205, an overflow gate 206, an FD (floating diffusion) capacitance switching switch 210 as a floating diffusion region, a second transfer transistor 215 are formed, near a contact surface with the semiconductor substrate. Furthermore, in the wiring layer, two connection lines 221 are formed that connects the semiconductor substrate and the lower electrode 231. In addition, the first transfer transistor 202, the first reset transistor 205, the overflow gate 206, the FD capacitance switching switch 210, and the second transfer transistor 215 are connected to a pixel drive line 222 via connection lines.

In the semiconductor substrate, a first FD portion 203 is formed between and below the first transfer transistor 202 and FD capacitance switching switch 210 adjoining each other. The first FD portion 203 serves as a first accumulation portion that accumulates electric charge obtained by photoelectric conversion by the first photodiode 201. In the semiconductor substrate, a second FD portion 216 is formed below and near the second transfer transistor 215. The second FD portion 216 serves as a second accumulation portion that accumulates electric charge obtained by photoelectric conversion by the second photodiode 214. Furthermore, in the semiconductor substrate, an overflow drain 218 is formed below and near the overflow gate 206. The overflow drain 218 is connected to the lower electrode 231 via the connection line 221. Here, the overflow drain 218 serves, for example, as a drain region of the overflow gate 206 including a MOSFET. The overflow drain 218 is, for an example, part of a configuration for receiving electric charge overflowing from the PD 201 and connection to the lower electrode 231.

(9-2) Exemplary Circuit Configuration of Unit Pixel

Figure 16:
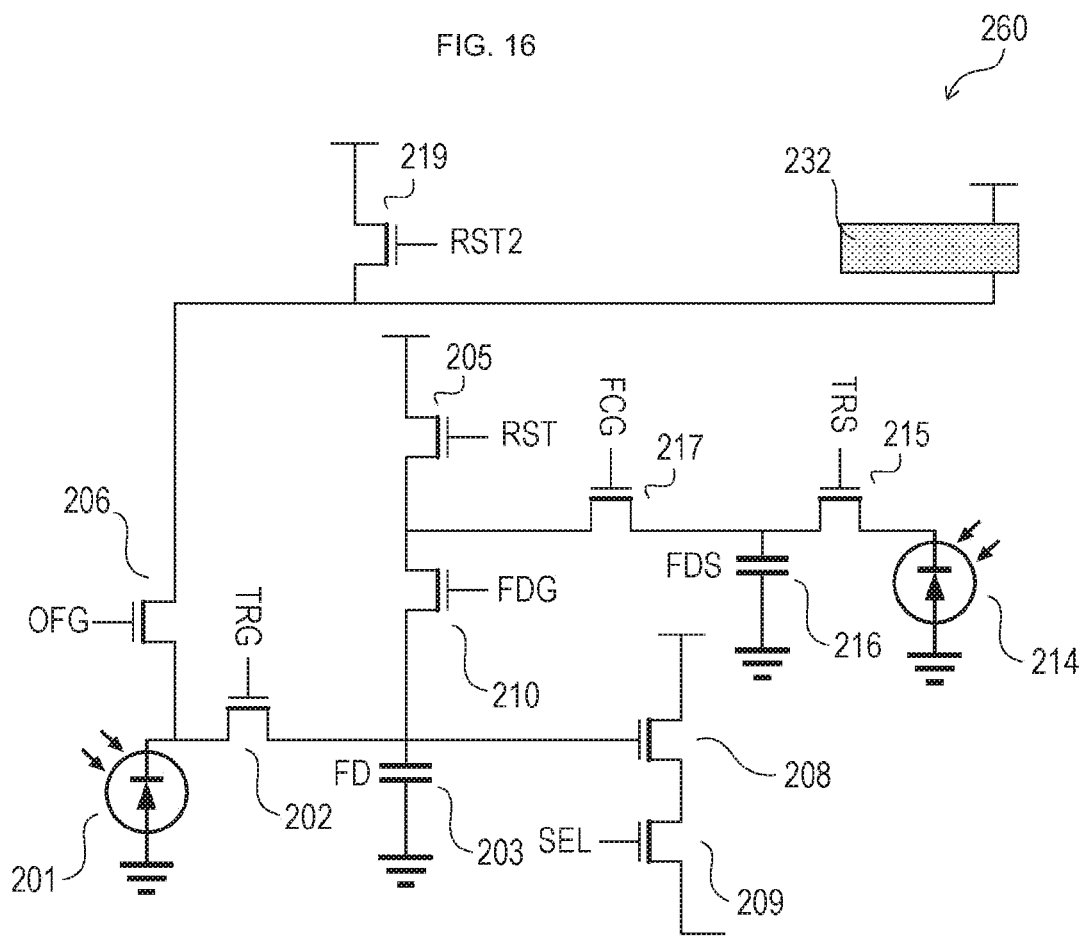
FIG. 16 is a schematic circuit diagram illustrating an equivalent circuit of a unit pixel of FIG. 15.

Next, an exemplary circuit configuration of a unit pixel according to the present embodiment will be described with reference to FIG. 16 FIG. 16 is a circuit configuration diagram illustrating an equivalent circuit of the unit pixel according to the present embodiment.

As illustrated in FIG. 16, the unit pixel 260 according to the present embodiment includes a first photodiode 201, a first transfer transistor 202, a first FD portion 203 including a floating capacitor FC, an FD capacitance switching switch 210, a first reset transistor 205, and an overflow gate 206. Furthermore, the unit pixel 260 includes a second photodiode 214, a second transfer transistor 215, a second FD portion 216 including a floating capacitor FC, a capacitance connection switch 217, and a second reset transistor 219. Furthermore, the unit pixel 260 includes an amplifier transistor 208 and a selection transistor 209.

In the unit pixel 260, a plurality of row control lines, which is not shown in FIG. 16 for simplification of the drawing, is disposed commonly for pixels in the same pixel row. A row control line for each pixel row of the plurality of row control lines is connected to an output terminal of a vertical drive unit corresponding to each pixel row. When driving each unit pixel 260 of a pixel array portion, the vertical drive unit appropriately outputs a transfer signal TRG which is a transfer pulse on the side of the PD 201, a transfer signal TRS being a transfer pulse on the side of the PD 214, a reset signal RST, and a selection signal SEL to the plurality of row control lines.

The first photodiode 201 has an anode electrode that is connected to a negative power supply such as ground, photoelectrically converts received light into photoelectrons being a photocharge having an amount of electric charge according to a light amount of the received light, and accumulates the photoelectrons. The first photodiode 201 has a cathode electrode that is connected to a source electrode of the first transfer transistor 202 and a source electrode of the overflow gate 106. Furthermore, the first photodiode 201 is electrically connected to the first FD portion 203 via the first transfer transistor 202. Furthermore, the first photodiode 201 is electrically connected to the electrochromic film 232 and a source electrode of the second reset transistor 219 via the overflow gate 206.

The first transfer transistor 202 has a drain electrode that is connected to the first FD portion 203. The first transfer transistor 202 has a gate electrode to which a transfer signal TRG is supplied from the vertical drive unit. When the first transfer transistor 202 becomes conductive in response to the transfer signal TRG, photocharge obtained by photoelectric conversion by the first photodiode 201 and accumulated therein is transferred to the first FD portion 203.

The first FD portion 203 is connected to a source electrode of the FD capacitance switching switch 210 and a gate electrode of the amplifier transistor 208. Furthermore, the first FD portion 203 is connected to one end of the floating capacitor FC, and the other end of the floating capacitor FC is connected to ground. Note that the first FD portion 203 can be formed as a charge accumulation portion that accumulates electric charge to apply a voltage to the electrochromic film 232 as a first film. However, the charge accumulation portion may be provided separately from the first FD portion 203.

The FD capacitance switching switch 210 has a drain electrode that is connected to a source electrode of the first reset transistor 205 and a drain electrode of the capacitance connection switch 217. The FD capacitance switching switch 210 has a gate electrode to which an FD capacitance switching switch signal FDG is given from the vertical drive unit. When the FD capacitance switching switch 210 becomes conductive in response to the FD capacitance switching switch signal FDG, the first FD portion 203 and the second FD portion 216 are electrically connected to each other.

The first reset transistor 205 has a drain electrode that is connected to a power supply. The first reset transistor 205 has a gate electrode to which a reset signal RST is given from the vertical drive unit. The first reset transistor 205 becomes conductive in response to the reset signal RST, supplies electric charge in the first FD portion 203 and/or the second FD portion 216 to the power supply, and resets the first FD portion 203 and/or the second FD portion 216.

The overflow gate 206 has a drain electrode that is connected to the electrochromic film 232 and the source electrode of the second reset transistor 219. The overflow gate 206 has a gate electrode to which an overflow signal OFG is given from the vertical drive unit. When the overflow gate 206 becomes conductive in response to the overflow signal OFG, photocharge obtained by photoelectric conversion by the first photodiode 201 and accumulated therein is supplied to a power supply via the electrochromic film 232 and/or the second reset transistor 219.

The second reset transistor 219 has a drain electrode that is connected to a power supply. The second reset transistor 219 has a gate electrode to which a reset signal RST2 is given from the vertical drive unit. The second reset transistor 219 becomes conductive in response to the reset signal RST2, supplies electric charge in the overflow drain 218 and/or the electrochromic film 232 to the power supply, and resets the overflow drain 218 and/or the electrochromic film 232.

The second photodiode 214 has an anode electrode that is connected to a negative power supply such as ground, photoelectrically converts received light into photoelectrons being a photocharge having an amount of electric charge according to a light amount of the received light, and accumulates the photoelectrons. The second photodiode 214 has a cathode electrode that is connected to a source electrode of the second transfer transistor 215. Furthermore, the second photodiode 214 is electrically connected to the second FD portion 216 via the second transfer transistor 215.

The second transfer transistor 215 has a drain electrode that is connected to the second FD portion 216. The second transfer transistor 215 has a gate electrode to which a transfer signal TRS is given from the vertical drive unit. When the second transfer transistor 215 becomes conductive in response to the transfer signal TRS, photocharge obtained by photoelectric conversion by the second photodiode 214 and accumulated therein is transferred to the second FD portion 216.

The second FD portion 216 is connected to a source electrode of the capacitance connection switch 217. Furthermore, the second FD portion 216 is connected to one end of the floating capacitor FC, and the other end of the floating capacitor FC is connected to ground. Note that, as in the first FD portion 203, the second FD portion 216 can be formed as a charge accumulation portion that accumulates electric charge to apply a voltage to the electrochromic film 232 as a first film. However, the charge accumulation portion may be provided separately from the second FD portion 216.

The capacitance connection switch 217 has a drain electrode that is connected to the source electrode of the first reset transistor 205 and the drain electrode of the FD capacitance switching switch 210. The capacitance connection switch 217 has a gate electrode to which a capacitance connection signal FCG is given from the vertical drive unit. When the capacitance connection switch 217 becomes conductive in response to the capacitance connection signal FCG, the first FD portion 203 and the second FD portion 216 are electrically connected.

The amplifier transistor 208 has a drain electrode connected to the power supply and a source electrode connected to a drain electrode of the selection transistor 209. The amplifier transistor 208 has a source electrode connected to a vertical signal line via the selection transistor 209.

The selection transistor 209 has a source electrode that is connected to the vertical signal line. The selection transistor 209 has a gate electrode to which a selection signal SEL is given from the vertical drive unit. When the selection transistor 209 becomes conductive in response to the selection signal SEL, a pixel signal amplified by the amplifier transistor 208 is output to the vertical signal line while the unit pixel 260 is in a selected state.

Note that the selection transistor 209 can be disposed so as to be connected between the drain electrode of the amplifier transistor 208 and the power supply. In other words, the selection transistor 209 being connected to the amplifier transistor 208 in series between the power supply and the vertical signal line is operable to select a unit pixel 260.

(9-3) Configuration Example of Unit Pixel

Figure 17A:
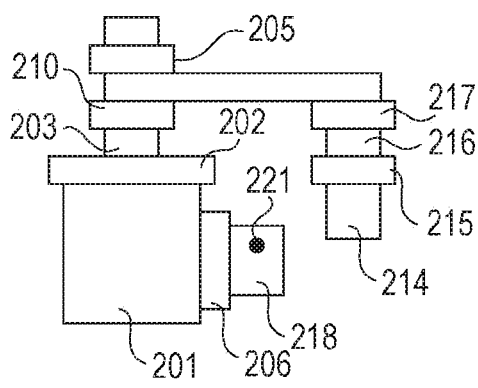
FIGS. 17A and 17B illustrate schematic plan views of the unit pixel of FIG. 15.
Figure 17B:
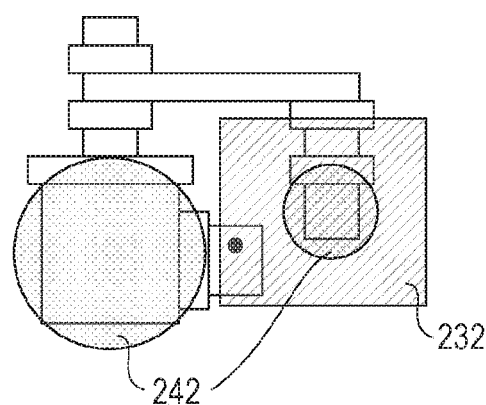

Next, a configuration example of the unit pixel according to the present embodiment will be described with reference to FIGS. 17A 17B and 18. FIGS. 17A and 17B illustrate schematic plan views of the unit pixel according to the present embodiment. FIG. 17A is a schematic plan view of the unit pixel 260 from which the electrochromic film 232 and an on-chip lens 242 are removed, and FIG. 17B is a schematic plan view of the unit pixel 260 in which the electrochromic film 232 disposed to cover the second photodiode 214 and the on-chip lens 242 disposed to cover the first photodiode 201 and the second photodiode 214 are shown.

As illustrated in FIG. 17A, when viewing the unit pixel 260 from above, as an example, the first transfer transistor 202, the first FD portion 203, the FD capacitance switching switch 210, and the first reset transistor 205 are connected to one side of the first photodiode 201 of rectangular shape. The overflow gate 206 and the overflow drain 218 are connected to another side adjacent to the one side of the first photodiode 201 of rectangular shape. Then, the connection line 221 is formed at the position of the overflow drain 218. Furthermore, the capacitance connection switch 217, the second FD portion 216, the second transfer transistor 215, and the second photodiode 214 are connected via a wiring line between the FD capacitance switching switch 210 and the first reset transistor 205.

As illustrated in FIG. 17B, the electrochromic film 232 of rectangular shape is disposed above the unit pixel 260 to cover the overflow drain 218, the capacitance connection switch 217, the second FD portion 216, the second transfer transistor 215, and the second photodiode 214. As an example, an on-chip lens 242 of circular shape is disposed at a position above the electrochromic film 232 to cover the second transfer transistor 215 and the second photodiode 214. Furthermore, another on-chip lens 242 of circular shape is disposed at a position to cover the first photodiode 201, the first transfer transistor 202, and the overflow gate 206.

As in the electrochromic film 132 according to the first embodiment, for the electrochromic film 232 according to the present embodiment, for example, a material having a transmittance changing according to applied voltage, such as tungsten oxide, can be used. In addition, the electrochromic film 132 according to the present embodiment may include a material such as a magnesium-titanium alloy, magnesium-nickel alloy, or tantalum oxide.

Figure 18:
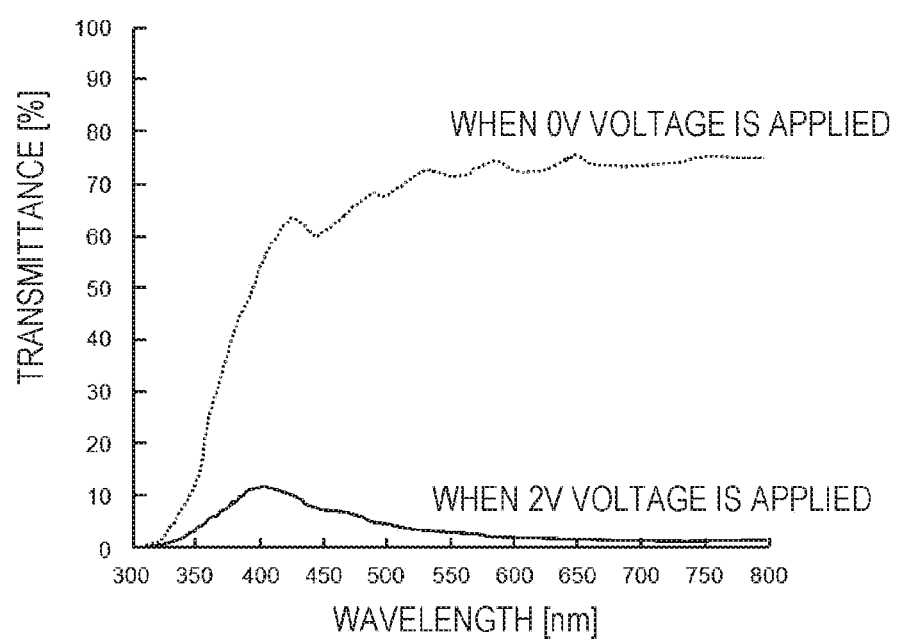
FIG. 18 is a graph illustrating a typical characteristic shown when a voltage is applied to a tungsten oxide film of the solid-state imaging element of FIG. 15.

FIG. 18 is a graph illustrating a typical characteristic shown when a voltage is applied to the electrochromic film 232 according to the present embodiment including tungsten oxide. A dotted line at the upper part of FIG. 18 indicates transmittance obtained when a voltage applied between the upper electrode 233 and the lower electrode 231 is 0 V. A solid line at the lower part of FIG. 18 indicates transmittance obtained when a voltage applied between the upper electrode 233 and the lower electrode 231 is 2 V. When voltage applied between the upper electrode 233 and the lower electrode 231 is 0 V, transmittance is around 70% in the visible light region (approximately 380 nm to 780 nm), whereas when the voltage is 2V, transmittance changes to 10% or less.

(9-4) Example of Circuit Operation of Unit Pixel

Next, an example of the circuit operation of the unit pixel 260 according to the present embodiment will be described.

Firstly, electric charge obtained by photoelectric conversion during exposure is accumulated in the first photodiode 201 and the second photodiode 214. The second photodiode 214 has a size smaller than that of the first photodiode 201 and has a lower sensitivity. In other words, the first photodiode 201 has higher sensitivity and is suitable for lower illuminance, and the second photodiode 214 has lower sensitivity and is suitable for higher illuminance.

After the exposure is finished, the first transfer transistor 202 is turned on, electric charge generated by the first photodiode 201 is transferred to the first FD portion 203, and a signal is output to the outside via the amplifier transistor 208 and the selection transistor 209. This signal is a high-sensitivity signal.

Subsequently, the second transfer transistor 215 is turned on, and electric charge obtained by photoelectric conversion by the second photodiode 214 is transferred to the second FD portion 216.

Then, by turning on the capacitance connection switch 117 and the FD capacitance switching switch 210, a signal is output to the outside via the amplifier transistor 208 and the selection transistor 209. This signal is a low-sensitivity signal. Here, wide dynamic range can be achieved by combining the high-sensitivity signal and the low sensitivity signal in image processing.

On the other hand, the overflow drain 218 is reset by the second reset transistor 219 before starting exposure. Since the overflow drain 218 is connected to the lower electrode 231, when reset potential and a potential supplied to the upper electrode 233 are set equal to each other, voltage applied to the electrochromic film 232 becomes 0 V upon resetting. In other words, in a reset state, the electrochromic film 232 has a high transmittance.

When strong light exceeding an amount of saturation charge of the first photodiode 201 is incident thereon, the electric charge leaks out via the overflow gate 206 and is accumulated in the overflow drain 218. As electric charge is gradually accumulated in the overflow drain 218, the potential decreases, and a potential difference is gradually generated between the overflow drain 218 and the upper electrode 233. Therefore, the larger the amount of photoelectrons, the larger the voltage applied to the electrochromic film 232, and the transmittance decreases. Then, the amount of light incident on the second photodiode 214 decreases, and the sensitivity decreases. Thus, dynamic range can be extended.

As described above, exposure is performed in a state where the pixels have transmittances of the electrochromic films 232 being different according to amount of light. At this time, it is preferable to cause at least the first FD portion 203 or the second FD portion 216 to keep holding accumulated electric charge during a period of the exposure. Then, a signal obtained by photoelectric conversion is read out to obtain an output.

(9-5) Extension of Dynamic Range

Next, dynamic range extended by the solid-state imaging element 250 according to the present embodiment will be described with reference to FIGS. 19A 19B and 19C. FIGS. 19A, 19B, and 19C illustrate graphs of photoelectric conversion characteristics of the solid-state imaging element 250 according to the present embodiment. FIG. 19A is a graph illustrating a photoelectric conversion characteristic obtained in a case where the electrochromic film 232 is not provided, FIG. 19B is a graph illustrating a photoelectric conversion characteristic obtained in a case where the electrochromic film 232 is provided, and FIG. 19C is a graph illustrating a relationship between light transmittance of the electrochromic film 232 and amount of incident light.

As indicated by a solid line 291 in FIG. 19A, in a case where the electrochromic film 232 is not provided, firstly, as the amount of incident light increases from a dark state, the number of photoelectrons accumulated in the first photodiode 201 also increases linearly. Then, when the amount of incident light reaches light amount 1 and the first photodiode 201 is saturated with accumulated electrons, no more electric charge can be accumulated in the first photodiode 201.

However, as indicated by a solid line 292 in FIG. 19A, the second photodiode 214 has low sensitivity and is not yet saturated at light amount 1. When the amount of light further increases and reaches light amount 2 and the second photodiode 214 is saturated with accumulated electrons, no more electric charge can be accumulated in the second photodiode 214.

Therefore, by reading out electrons accumulated in the first photodiode 201, reading out electrons accumulated in the second photodiode 214, and adding up the electrons, output which is not saturated up to light amount 2 can be obtained. However, in a case where the amount of light exceeds light amount 2, output is saturated, and it becomes impossible to know the correct amount of light.

On the other hand, a photoelectric conversion characteristic obtained in a case where the electrochromic film 232 is provided will be described with reference to FIG. 19B.

Firstly, in a reset state, the electrochromic film 232 has a high transmittance, and the transmittance does not change before the potential of the overflow drain 218 changes from a reset value. Therefore, from a dark state to light amount 1, the same photoelectric conversion characteristic as that indicated by the solid line 291 of 19A is shown.

Then, when the amount of light exceeds light amount 1, no more electric charge can be accumulated in the first photodiode 201, and photoelectrons generated thereafter are accumulated in the overflow drain 218 via the overflow gate 206. Therefore, when the amount of incident light exceeds light amount 1, the number of electrons accumulated in the first photodiode 201 does not increase, and the number of electrons accumulated in the overflow drain 218 increases.

Then, electric charge is gradually accumulated in the overflow drain 218 as indicated by a solid line 293 in FIG. 19B, and the transmittance of the electrochromic film 232 decreases according to the accumulation of the electric charge as indicated by a solid line 294 in FIG. 19C. Then, since the amount of light incident on the second photodiode 214 decreases, that is, the sensitivity gradually decreases, the gradient of the number of electrons accumulated in the second photodiode 214 is gradually laid, compared with the case where the electrochromic film 232 is not provided (indicated by a dashed line in FIG. 19B).

Therefore, even when the amount of light exceeds light amount 2, the second photodiode 214 is not saturated with electrons and saturated with electrons at light amount 3 higher than light amount 2. In other words, output that is not saturated before light amount 3 can be obtained, and dynamic range is extended. Furthermore, by reading out electrons accumulated in the first photodiode 201, reading out electrons accumulated in the second photodiode 214, and adding up the electrons, a linear output can be obtained from a dark state to light amount 1 and a logarithmic output can be obtained from light amount 1 to light amount 3, with respect to the amount of light.

As described above, employment of the solid-state imaging element 250 according to the present embodiment enables to extend the dynamic range from light amount 2 to light amount 3. Therefore, unlike the technology described in Patent Document 1, the present technology can provide a solid-state imaging element configured to automatically extend the dynamic range for each unit pixel.

Furthermore, according to the present technology, a charge detection unit or a voltage application unit does not need to be provided outside a pixel, a voltage applied to the electrochromic film can be controlled only by the elements in the pixel, and thus, dynamic range can be extended without increasing power consumption or chip area.

Furthermore, in the present technology, voltage applied to the electrochromic film can be controlled individually for each pixel, and the control thereof is automatically adjusted according to the amount of light incident on the pixel. Therefore, even if pixels have great differences in the amount of incident light, each pixel is adjusted in an optimum state.

10. Solid-State Imaging Element According to Tenth Embodiment

A solid-state imaging element according to a tenth embodiment of the present technology will be described with reference to FIG. 20. FIG. 20 is a schematic cross-sectional diagram illustrating pixels of the solid-state imaging element according to the tenth embodiment of the present technology. The present embodiment is different from the ninth embodiment in that the electrochromic film 232 is disposed in the wiring layer. Note that the similar configurations as those of the ninth embodiment are denoted by the same reference numerals, and description thereof will be omitted.

In the solid-state imaging element 250 according to the ninth embodiment, the electrochromic film 232 having an optical characteristic changing according to an applied voltage is disposed between the color filter 241 and the pixel drive line 222 which is disposed in the wiring layer. On the other hand, in the solid-state imaging element 300 according to the present embodiment, the electrochromic film 232 is disposed below the pixel drive line 222, as illustrated in FIG. 20, As described above, the electrochromic film 232 may be disposed in any layer, as long as the electrochromic film 232 is positioned on an optical path of light incident on the second photodiode 214. Therefore, the above configuration also enables the solid-state imaging element 300 according to the present embodiment to obtain similar pixel circuit operation and effects as those of the solid-state imaging element 250 according to the first embodiment. Furthermore, in the solid-state imaging element 250 according to the present embodiment, the electrochromic film 232 is disposed closer to the PD 201 and the PD 214 compared with the solid-state imaging element 10 according to the first embodiment. Therefore, the optical characteristic may be effectively improved depending on the cross-sectional structure such as the number of wiring layers, compared with the solid-state imaging element 10 according to the first embodiment.

11. Solid-State Imaging Element According to Eleventh Embodiment

Figure 21:
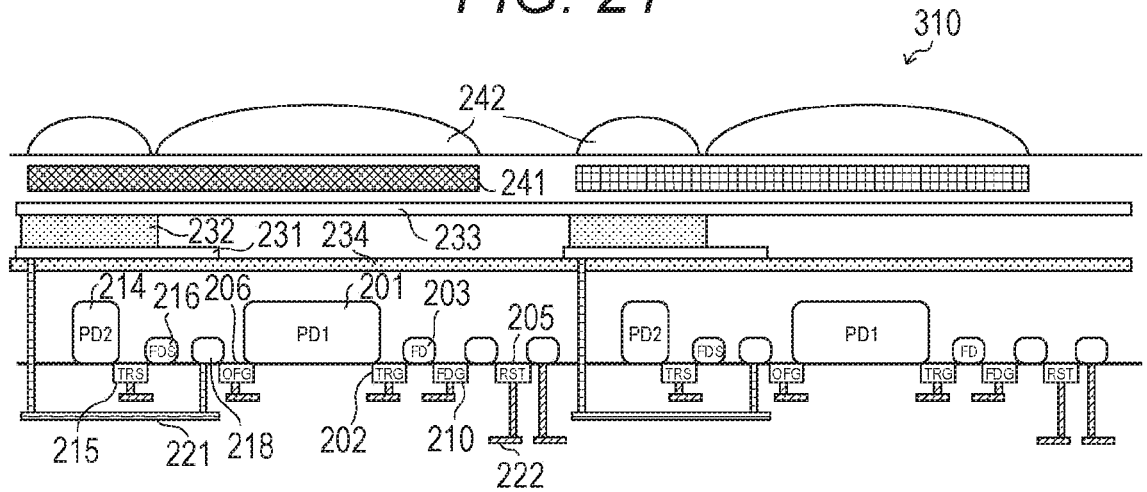
FIG. 21 is a schematic cross-sectional diagram illustrating pixels of a solid-state imaging element according to an eleventh embodiment of the present technology.

A solid-state imaging element according to an eleventh embodiment of the present technology will be described with reference to FIG. 21. FIG. 21 is a schematic cross-sectional diagram illustrating pixels of the solid-state imaging element according to the eleventh embodiment of the present technology. The present embodiment is different from the ninth embodiment in that a back-illuminated type solid-state imaging element is used. Note that the similar configurations as those of the ninth embodiment are denoted by the same reference numerals, and description thereof will be omitted.

As illustrated in FIG. 21, since the solid-state imaging element 310 according to the present embodiment is the back-illuminated type solid-state imaging element, the wiring layer is disposed below the semiconductor substrate of the first photodiode 201 and second photodiode 214. Furthermore, an insulating film 234 is provided between the semiconductor substrate and the lower electrode 231 to prevent short circuit. Therefore, the connection line 221 is connected to the lower electrode 231 through the semiconductor substrate and the insulating film 234. The above configuration also enables the solid-state imaging element 310 according to the present embodiment to obtain similar pixel circuit operation and effects as those of the solid-state imaging element 250 according to the ninth embodiment. In addition, since the solid-state imaging element 250 according to the present embodiment is of back-illuminated type, the sensitivity of the PD 201 and the PD 214 and freedom degree in wiring layout may be effectively improved.

12. Solid-State Imaging Element According to Twelfth Embodiment

Figure 22:
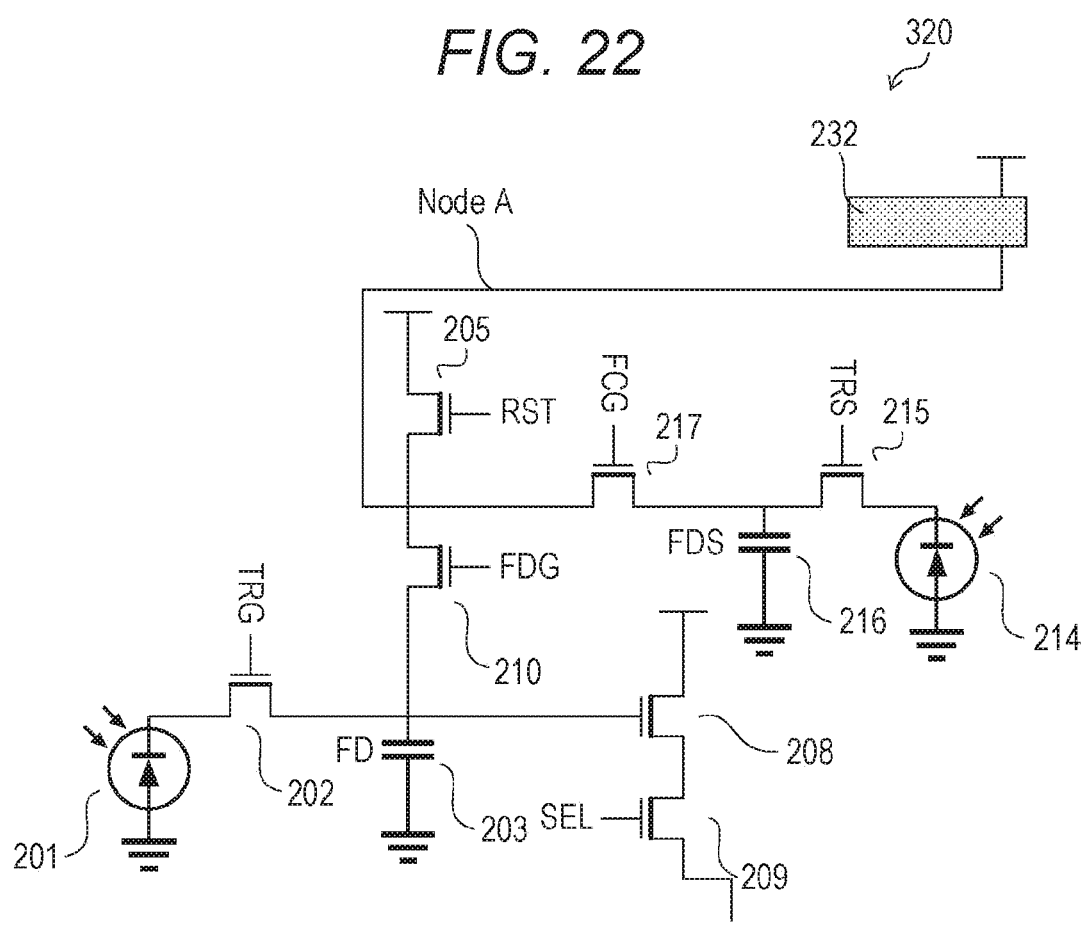
FIG. 22 is a schematic circuit diagram illustrating an equivalent circuit of a unit pixel according to a twelfth embodiment according to the present technology.

A solid-state imaging element according to a twelfth embodiment of the present technology will be described with reference to FIG. 22. FIG. 22 is a schematic circuit diagram illustrating an equivalent circuit of a unit pixel according to the twelfth embodiment of the present technology. The present embodiment is different from the ninth embodiment in that the circuit configuration of the unit pixel does not include the overflow gate 206 and the second reset transistor 219. Note that the similar configurations as those of the ninth embodiment are denoted by the same reference numerals, and description thereof will be omitted.

As illustrated in FIG. 22, the unit pixel 320 according to the present embodiment includes a first photodiode 201, a first transfer transistor 202, a first FD portion 203 including a floating capacitor FC, an FD capacitance switching switch 210, and a first reset transistor 205. In addition, the unit pixel 320 includes a second photodiode 214, a second transfer transistor 215, a second FD portion 216 including a floating capacitor FC, and a capacitance connection switch 217. Furthermore, the unit pixel 260 includes an amplifier transistor 208 and a selection transistor 209.

The first photodiode 201 has an anode electrode that is connected to a negative power supply such as ground, photoelectrically converts received light into photoelectrons being a photocharge having an amount of electric charge according to a light amount of the received light, and accumulates the photoelectrons. The first photodiode 201 has a cathode electrode that is connected to a source electrode of the first transfer transistor 202. Furthermore, the first photodiode 201 is electrically connected to the first FD portion 203 via the first transfer transistor 202.

The FD capacitance switching switch 210 has a drain electrode that is connected to a source electrode of the first reset transistor 205 and a drain electrode of the capacitance connection switch 217. The FD capacitance switching switch 210 has a drain electrode that is connected to the electrochromic film 232 via Node A. The FD capacitance switching switch 210 has a gate electrode to which an FD capacitance switching switch signal FDG is given from the vertical drive unit. When the FD capacitance switching switch 210 becomes conductive in response to the FD capacitance switching switch signal FDG, the first FD portion 203 and the second FD portion 216 are electrically connected to each other.

The capacitance connection switch 217 has a drain electrode that is connected to the source electrode of the first reset transistor 205 and the drain electrode of the FD capacitance switching switch 210. The capacitance connection switch 217 has a drain electrode that is connected to the electrochromic film 232 via Node A. The capacitance connection switch 217 has a gate electrode to which a capacitance connection signal FCG is given from the vertical drive unit. When the capacitance connection switch 217 becomes conductive in response to the capacitance connection signal FCG, the first FD portion 203 and the second FD portion 216 are electrically connected.

In the unit pixel 260 according to the ninth embodiment, an overflow path for electric charge overflowing from the first photodiode 201 is the overflow gate 106. On the other hand, the unit pixel 320 according to the present embodiment has a configuration in which the overflow gate 106 is not provided, and thus electric charge overflowing from the first photodiode 201 overflows toward the first FD portion 203.

In the unit pixel 320 according to the present embodiment, the FD capacitance switching switch 210 is on during a period of exposure, and overflow charge is accumulated in Node A. At this time, since Node A is connected to the lower electrode 231, the more overflow charge overflowing from the first photodiode 201 is, the less the amount of light incident on the second photodiode 214 is. Thus, dynamic range can be extended.

The other circuit operations of the unit pixel 320 are similar to those of the unit pixel 260 according to the ninth embodiment. As described above, the solid-state imaging element including the unit pixel 320 according to the present embodiment can also provide similar effects to those of the solid-state imaging element 250 according to the ninth embodiment.

13. Solid-State Imaging Element According to Thirteenth Embodiment

Figure 23:
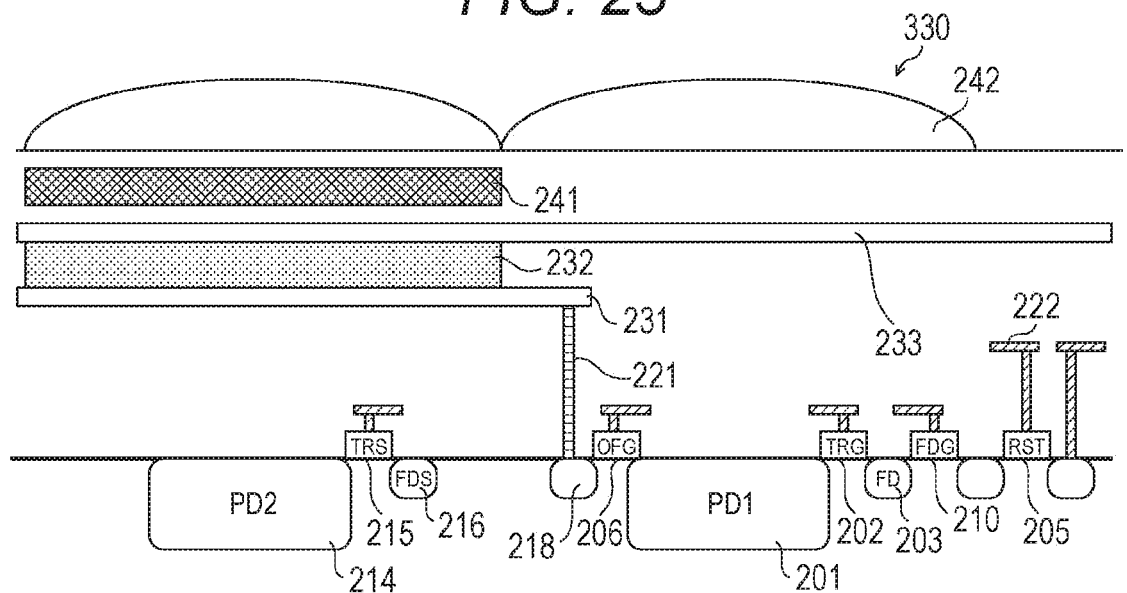
FIG. 23 is a schematic cross-sectional diagram illustrating pixels of a solid-state imaging element according to a thirteenth embodiment of the present technology.

A solid-state imaging element according to a thirteenth embodiment of the present technology will be described with reference to FIG. 23. FIG. 23 is a schematic cross-sectional diagram illustrating pixels of the solid-state imaging element according to the thirteenth embodiment of the present technology. The present embodiment is different from the ninth embodiment in that the color filter 241 is not provided on an optical path of light incident on the first photodiode 201. Note that the similar configurations as those of the ninth embodiment are denoted by the same reference numerals, and description thereof will be omitted.

As illustrated in FIG. 23, in the solid-state imaging element 330 according to the present embodiment, the color filter 241 is not provided on an optical path of light incident on the first photodiode 201, but on an optical path of light incident on the second photodiode 214, the color filter 241 is provided. Therefore, the first photodiode 201 is configured to acquire a luminance signal of an object, and the second photodiode 214 is configured to acquire color information about the object.

In general, when light passes through the color filter 241, part of the light is absorbed and the amount of the light is reduced. Therefore, the amount of light incident on the first photodiode 201 is larger than the amount of light incident on the second photodiode 214. Thus, the first photodiode 201 is saturated with electrons first.

Therefore, by lowering the transmittance of the electrochromic film 232 by using overflow charge overflowing from the first photodiode 201, light incident on the second photodiode 214 can be reduced before the second photodiode 214 is saturated with electrons. Thus, dynamic range can be extended. At this time, the photoelectric conversion characteristic of the solid-state imaging element 330 is similar to that of the solid-state imaging element 250 according to the ninth embodiment.

Figure 24:
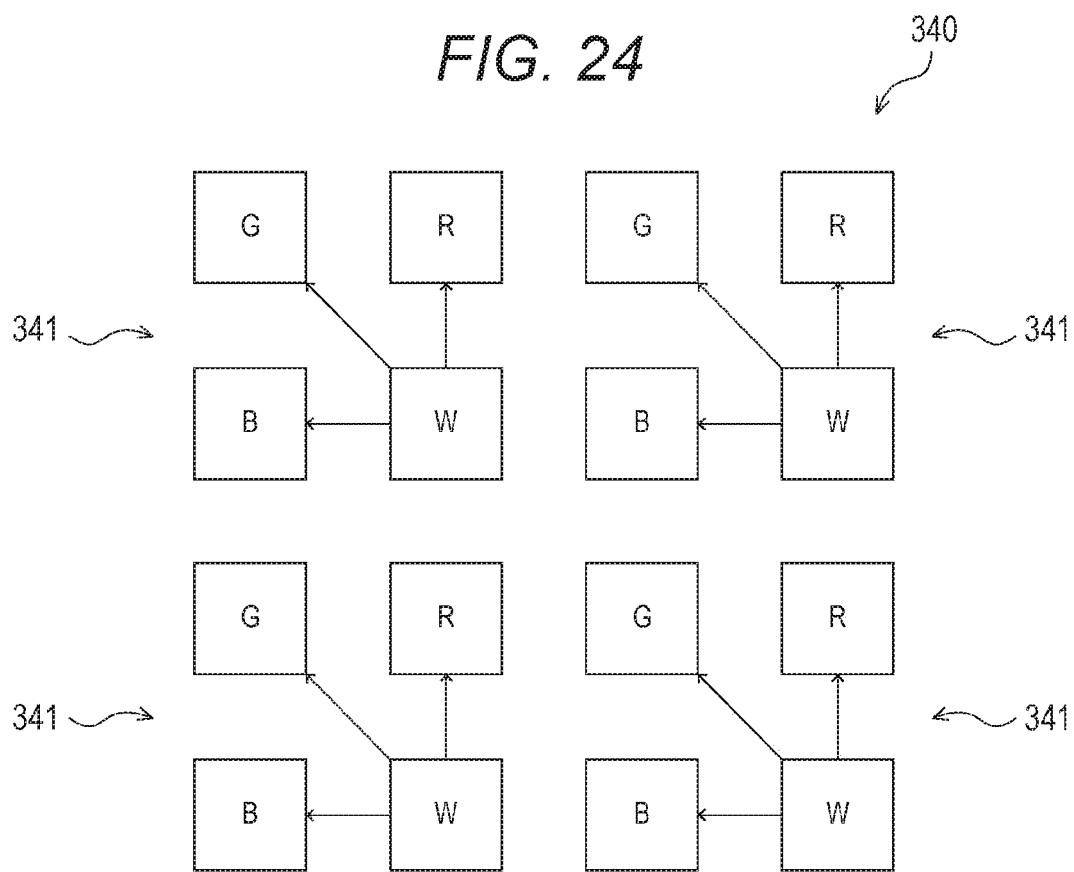
FIG. 24 is a schematic diagram illustrating an example of pixel array of the solid-state imaging element of FIG. 23.

FIG. 24 is a schematic diagram illustrating an example of a pixel array of the solid-state imaging element 330 according to the present embodiment. As illustrated in FIG. 24, the pixel array 340 of the solid-state imaging element 330 according to the present embodiment includes, as an example, a plurality of color filter arrays 341 in which RGBW pixels are arranged in a square shape. The solid-state imaging element 330 can have a configuration in which the transmittances of the RGB pixels are controlled according to the magnitude of an output of the W pixel by using this pixel array 340.

The above configuration also enables the solid-state imaging element 330 according to the present embodiment to obtain similar pixel circuit operation and effects as those of the solid-state imaging element 10 according to the ninth embodiment.

14. Solid-State Imaging Element According to Fourteenth Embodiment

Figure 25:
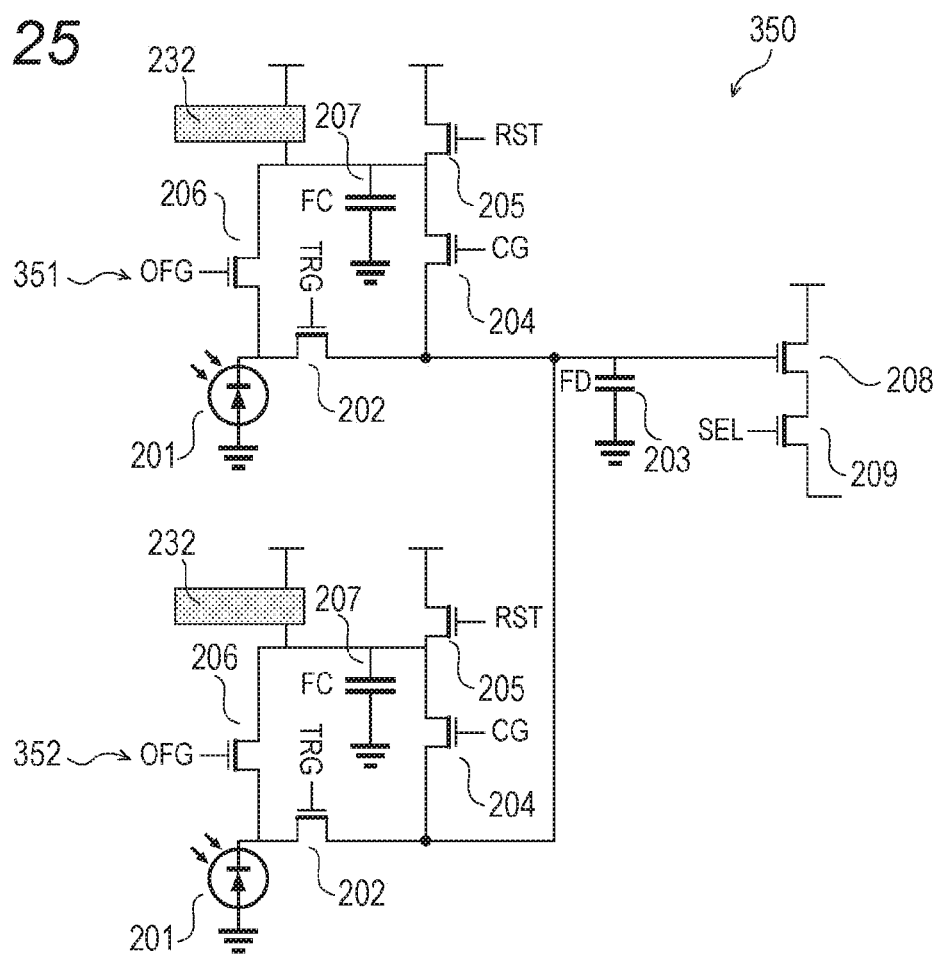
FIG. 25 is a schematic circuit diagram illustrating an equivalent circuit of unit pixels according to a fourteenth embodiment of the present technology.

A solid-state imaging element according to a fourteenth embodiment of the present technology will be described with reference to FIG. 25. FIG. 25 is a schematic circuit diagram illustrating an equivalent circuit of unit pixels according to the fourteenth embodiment of the present technology. The configuration of each unit pixel according to the present embodiment is similar to the configuration of the unit pixel according to the first embodiment but is different from that of the first embodiment in that a plurality of unit pixels shares a single first FD portion 203. Note that the similar configurations as those of the first and ninth embodiments are denoted by the same reference numerals, and description thereof will be omitted.

As illustrated in FIG. 25, a pixel 350 according to the present embodiment includes a first unit pixel 351, a second unit pixel 352, and a first FD portion 203 including a floating capacitor FC. Furthermore, the pixel 350 includes an amplifier transistor 208 and a selection transistor 209.

As in the unit pixel 20 according to the first embodiment, the first unit pixel 351 and the second unit pixel 352 each include a first photodiode 201, a first transfer transistor 202, a first FD portion 203, a capacitance connection transistor 204, a first reset transistor 205, an overflow gate 206, and a storage capacitor 207 configured to store overflow charge. Then, the first photodiode 201 included in each of the first unit pixel 351 and the second unit pixel 352 is electrically connected to each electrochromic film 232.

As illustrated in FIG. 25, in the pixel 350 according to the present embodiment, the overflow gates 206, the storage capacitors 207, and the electrochromic films 232 are included independently and respectively for the first unit pixel 351 and the second unit pixel 352. This configuration enables the pixel 350 according to the present embodiment to control the transmittances of the electrochromic films 232 independently for the first photodiodes 201, even with the configuration sharing the first FD portion 203.

The above configuration also enables the solid-state imaging element including the pixel 350 according to the present embodiment to obtain similar pixel circuit operation and effects of achievement of wide dynamic range independently for each pixel to those of solid-state imaging element according to the first to ninth embodiments.

15. Solid-State Imaging Element According to Fifteenth Embodiment

Next, a solid-state imaging element according to a fifteenth embodiment of the present technology will be described. In the fifteenth embodiment, a solid-state imaging element according to each of the above embodiments will be described in which an inter-pixel light shield is provided.

Figure 26:
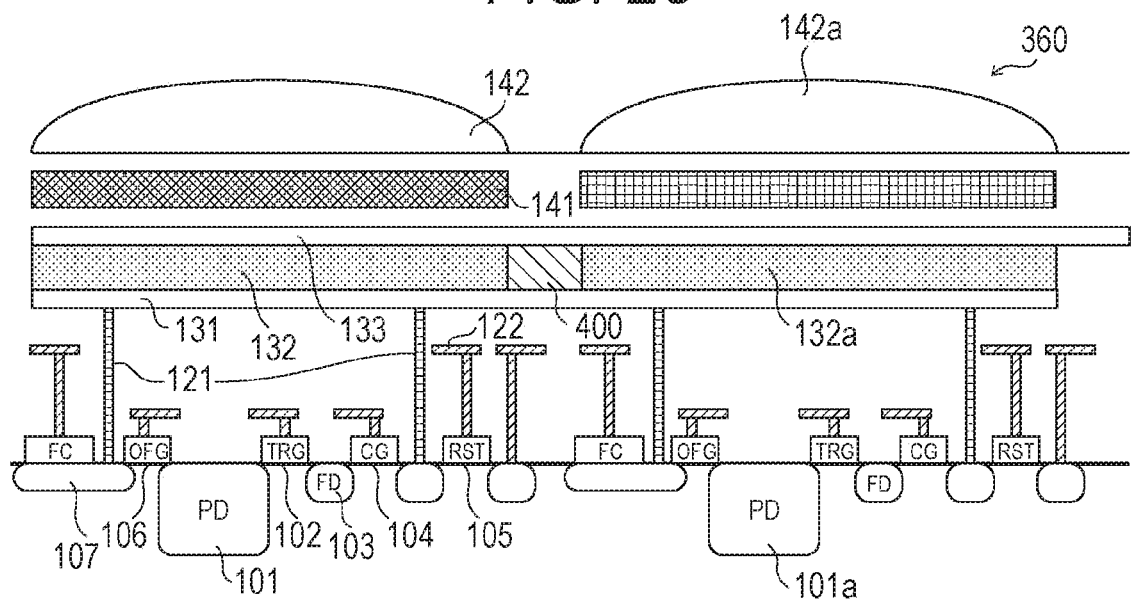
FIG. 26 is a schematic cross-sectional diagram illustrating pixels of a solid-state imaging element, the solid-state imaging element being obtained by providing an inter-pixel light shield in the solid-state imaging element according to the first embodiment of the present technology.

FIG. 26 illustrates pixels of the solid-state imaging element according to the fifteenth embodiment of the present technology. FIG. 26 is a schematic cross-sectional diagram illustrating pixels of a solid-state imaging element, the solid-state imaging element being obtained by providing an inter-pixel light shield in the solid-state imaging element according to the first embodiment of the present technology. Note that the similar configurations as those of the first embodiment are denoted by the same reference numerals, and description thereof will be omitted.

As illustrated in FIG. 26, the solid-state imaging element 360 includes the inter-pixel light shield 400. The inter-pixel light shield 400 is provided between an electrochromic film 132 and an electrochromic film 132a. The solid-state imaging element 360 illustrated in FIG. 26 is different from the solid-state imaging element 10 according to the first embodiment in that the inter-pixel light shield 400 is provided between the electrochromic film 132 and the electrochromic film 132a.

The inter-pixel light shield 400 includes a non-conductive light shielding film that shields light between adjacent pixels (hereinafter, also referred to as between pixels). The inter-pixel light shield 400 has a light shielding property and is provided to prevent color mixing. Note that the light transmittance of the inter-pixel light shield 400 is not particularly limited.

Note that "between pixels" represents between a photodiode 101 and a photodiode 101a in FIG. 26.

As described above, the solid-state imaging element 360 is configured so that the inter-pixel light shield 400 is provided between the electrochromic film 132 and the electrochromic film 132a, and color mixing between the photodiode 101 and the photodiode 101a can be prevented.

Next, as the fifteenth embodiment of the solid-state imaging element according to the present technology, an embodiment will be described in which an inter-pixel light shield is provided in a solid-state imaging element according to the second embodiment. The similar configurations as those of the second embodiment are denoted by the same reference numerals, and description thereof will be omitted.

Figure 27:
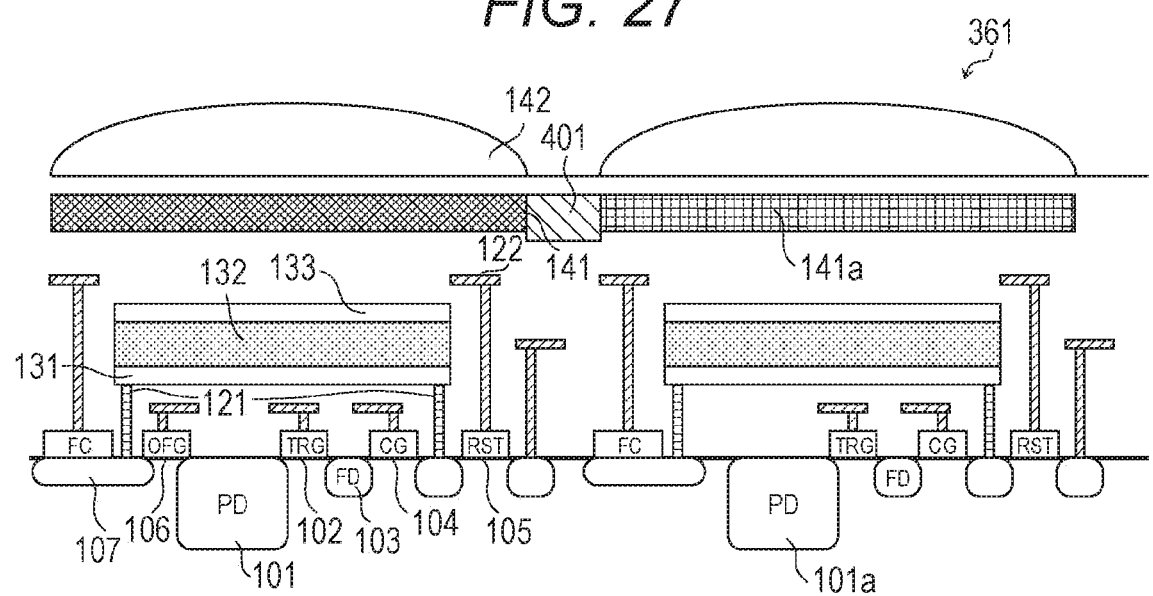
FIG. 27 is a schematic cross-sectional diagram illustrating pixels of a solid-state imaging element obtained by providing an inter-pixel light shield in the solid-state imaging element according to the second embodiment of the present technology.

As illustrated in FIG. 27, the solid-state imaging element 361 includes the inter-pixel light shield 401. The inter-pixel light shield 401 is provided between a color filter 141 and a color filter 141a. The solid-state imaging element 361 illustrated in FIG. 27 is different from the solid-state imaging element 60 according to the second embodiment in that the inter-pixel light shield 401 is provided between the color filter 141 and the color filter 141a.

The solid-state imaging element 361 is configured so that the inter-pixel light shield 401 is provided between the color filter 141 and the color filter 141a, and color mixing between a photodiode 101 and a photodiode 101a can be prevented.

Next, as the fifteenth embodiment of the solid-state imaging element according to the present technology, an embodiment will be described in which an inter-pixel light shield is provided in a solid-state imaging element according to the third embodiment. The similar configurations as those of the third embodiment are denoted by the same reference numerals, and description thereof will be omitted.

Figure 28:
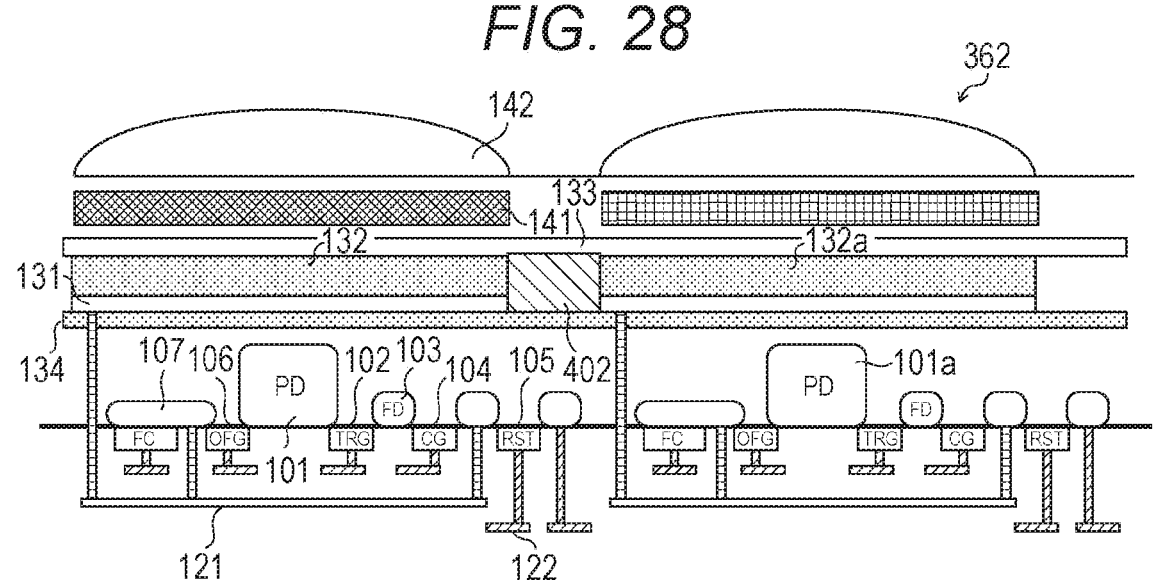
FIG. 28 is a schematic cross-sectional diagram illustrating pixels of a solid-state imaging element obtained by providing an inter-pixel light shield in the solid-state imaging element according to the third embodiment of the present technology.

As illustrated in FIG. 28, the solid-state imaging element 362 includes the inter-pixel light shield 402. The inter-pixel light shield 402 is provided between an electrochromic film 132 and an electrochromic film 132a. The solid-state imaging element 362 illustrated in FIG. 28 is different from the solid-state imaging element 70 according to the third embodiment in that the inter-pixel light shield 402 is provided between the electrochromic film 132 and the electrochromic film 132a.

The solid-state imaging element 362 is configured so that the inter-pixel light shield 402 is provided between the electrochromic film 132 and the electrochromic film 132a, and color mixing between a photodiode 101 and a photodiode 101a can be prevented.

Next, as the fifteenth embodiment according to the present technology, an embodiment will be described in which an inter-pixel light shield is provided in a solid-state imaging element according to the seventh embodiment. The similar configurations as those of the seventh embodiment are denoted by the same reference numerals, and description thereof will be omitted.

Figure 29:
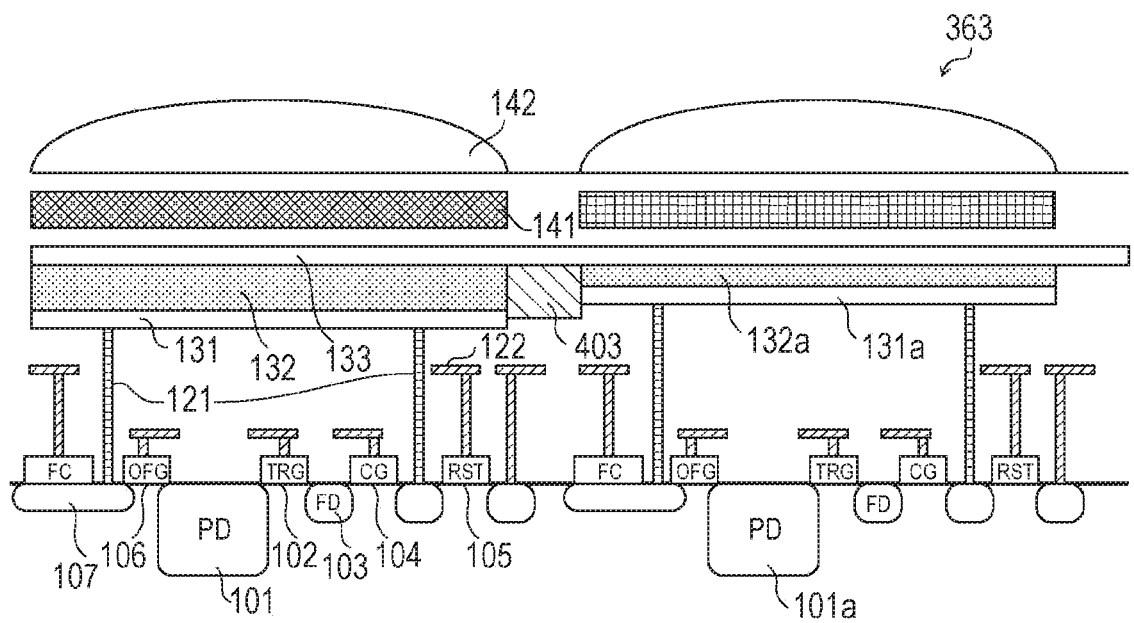
FIG. 29 is a schematic cross-sectional diagram illustrating pixels of a solid-state imaging element obtained by providing an inter-pixel light shield in the solid-state imaging element according to the seventh embodiment of the present technology.

As illustrated in FIG. 29, the solid-state imaging element 363 includes the inter-pixel light shield 403. The inter-pixel light shield 403 is provided between an electrochromic film 132 and an electrochromic film 132a. The solid-state imaging element 363 illustrated in FIG. 29 is different from the solid-state imaging element 170 according to the seventh embodiment in that the inter-pixel light shield 403 is provided between the electrochromic film 132 and the electrochromic film 132a.

The solid-state imaging element 363 is configured so that the inter-pixel light shield 403 is provided between the electrochromic film 132 and the electrochromic film 132a and further the inter-pixel light shield 403 is also provided between a lower electrode 131 and a lower electrode 131a. Therefore, the solid-state imaging element 363 can prevent color mixing between a photodiode 101 and a photodiode 101a.

Next, as the fifteenth embodiment of the solid-state imaging element according to the present technology, an embodiment will be described in which an inter-pixel light shield is provided in a solid-state imaging element according to the eighth embodiment. The similar configurations as those of the eighth embodiment are denoted by the same reference numerals, and description thereof will be omitted.

Figure 30:
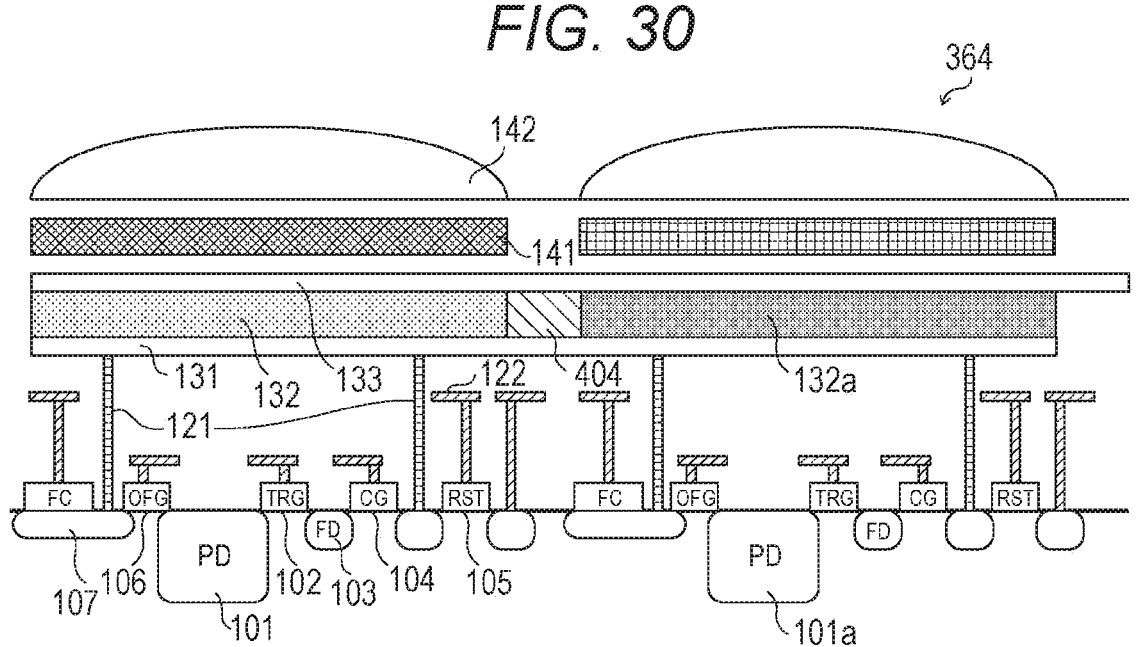
FIG. 30 is a schematic cross-sectional diagram illustrating pixels of a solid-state imaging element obtained by providing an inter-pixel light shield in the solid-state imaging element according to the eighth embodiment of the present technology.

As illustrated in FIG. 30, the solid-state imaging element 364 includes the inter-pixel light shield 404. The inter-pixel light shield 404 is provided between an electrochromic film 132 and an electrochromic film 132a. The solid-state imaging element 364 illustrated in FIG. 30 is different from the solid-state imaging element 180 according to the eighth embodiment in that the inter-pixel light shield 404 is provided between the electrochromic film 132 and the electrochromic film 132a.

The solid-state imaging element 364 is configured so that the inter-pixel light shield 404 is provided between the electrochromic film 132 and the electrochromic film 132a, and color mixing between a photodiode 101 and a photodiode 101a can be prevented.

Next, as the fifteenth embodiment of the solid-state imaging element according to the present technology, an embodiment will be described in which inter-pixel light shields are provided in a solid-state imaging element according to the ninth embodiment. The similar configurations as those of the ninth embodiment are denoted by the same reference numerals, and description thereof will be omitted. Note that unless otherwise specified, "right" represents the right side of FIG. 31 and "lower" represents a lower side of FIG. 31.

Figure 31:
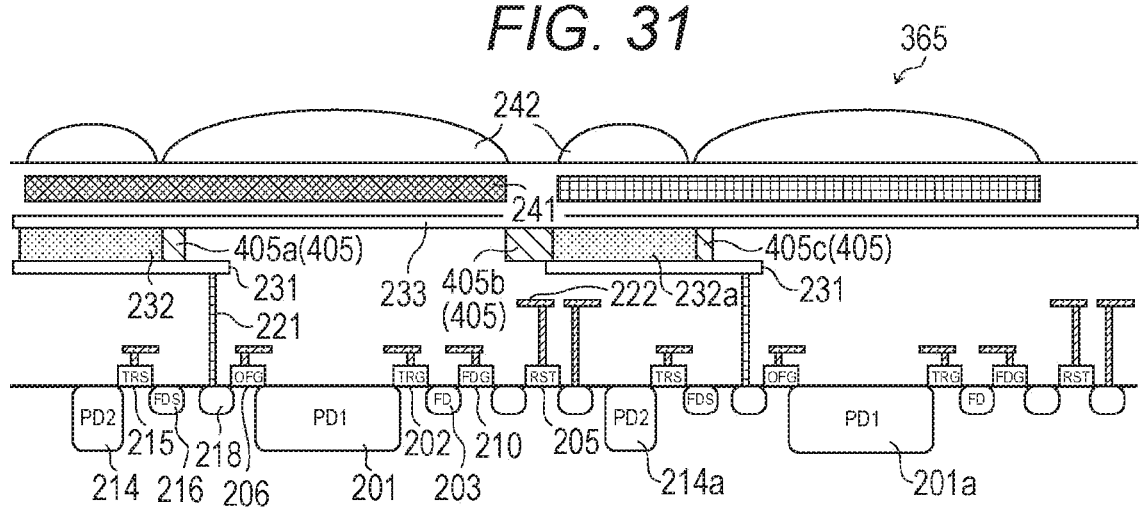
FIG. 31 is a schematic cross-sectional diagram illustrating pixels of a solid-state imaging element obtained by providing an inter-pixel light shield in the solid-state imaging element according to the ninth embodiment of the present technology.

As illustrated in FIG. 31, the solid-state imaging element 365 includes an inter-pixel light shield 405a (405), an inter-pixel light shield 405b (405), and an inter-pixel light shield 405c (405). The inter-pixel light shield 405a (405) is provided between an electrochromic film 232 and an electrochromic film 232a. The inter-pixel light shield 405b (405) is also provided between the electrochromic film 232 and the electrochromic film 232a. The inter-pixel light shield 405c (405) is provided on the right side of the electrochromic film 232a. The solid-state imaging element 365 illustrated in FIG. 31 is different from the solid-state imaging element 250 according to the ninth embodiment in that the inter-pixel light shields 405 (405a, 405b) are provided between the electrochromic film 232 and the electrochromic film 232a and the inter-pixel light shield 405c is provided on the right side of the electrochromic film 232a.

The solid-state imaging element 365 is configured so that the inter-pixel light shield 405a is provided between the electrochromic film 232 and the electrochromic film 232a, and color mixing between a first photodiode 201 and a second photodiode 214 can be prevented. Furthermore, the solid-state imaging element 365 is configured so that the inter-pixel light shield 405b is provided between the electrochromic film 232 and the electrochromic film 232a, and color mixing between the first photodiode 201 and a second photodiode 214a can be prevented. Furthermore, the solid-state imaging element 365 is configured so that the inter-pixel light shield 405c is provided on the right side of the electrochromic film 232a, and color mixing between a first photodiode 201a and the second photodiode 214a can be prevented.

Next, as the fifteenth embodiment of the solid-state imaging element according to the present technology, an embodiment will be described in which an inter-pixel light shield is provided in a solid-state imaging element according to the tenth embodiment. The similar configurations as those of the tenth embodiment are denoted by the same reference numerals, and description thereof will be omitted. Note that unless otherwise specified, "right" represents the right side of FIG. 32 and "lower" represents a lower side of FIG. 32.

Figure 32:
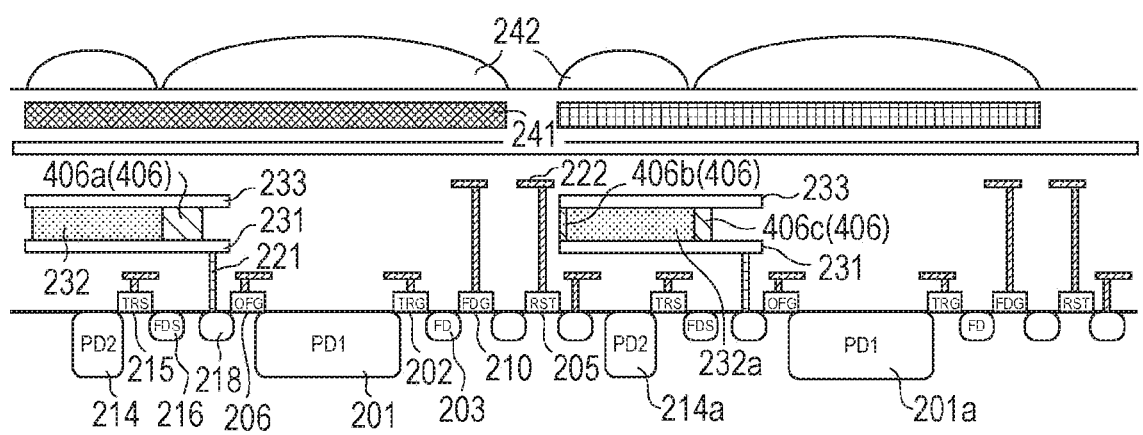
FIG. 32 is a schematic cross-sectional diagram illustrating pixels of a solid-state imaging element obtained by providing an inter-pixel light shield in the solid-state imaging element according to the tenth embodiment of the present technology.

As illustrated in FIG. 32, the solid-state imaging element 366 includes an inter-pixel light shield 406a (406), an inter-pixel light shield 406b (406), and an inter-pixel light shield 406c (406). The inter-pixel light shield 406a (406) is provided on the right side of an electrochromic film 232. The inter-pixel light shield 406b (406) is provided on the left side of an electrochromic film 232a, and the inter-pixel light shield 406c (406) is provided on the right side of the electrochromic film 232a. The solid-state imaging element 366 illustrated in FIG. 32 is different from the solid-state imaging element 300 according to the tenth embodiment in that the inter-pixel light shield 406a is provided on the right side of the electrochromic film 232, and the inter-pixel light shield 406b is provided on the left side of the electrochromic film 232a, and the inter-pixel light shield 406c is provided on the right side of the electrochromic film 232a.

The solid-state imaging element 366 is configured so that the inter-pixel light shield 406a is provided on the right side of the electrochromic film 232, and color mixing between a first photodiode 201 and a second photodiode 214 can be prevented. Furthermore, the solid-state imaging element 366 is configured so that the inter-pixel light shield 406b is provided on the left side of the electrochromic film 232a, and color mixing between the first photodiode 201 and a second photodiode 214a can be prevented. Furthermore, the solid-state imaging element 366 is configured so that the inter-pixel light shield 406c is provided on the right side of the electrochromic film 232a, and color mixing between the first photodiode 201a and the second photodiode 214a can be prevented.

Next, as the fifteenth embodiment of the solid-state imaging element according to the present technology, an embodiment will be described in which an inter-pixel light shield is provided in a solid-state imaging element according to the eleventh embodiment. The similar configurations as those of the eleventh embodiment are denoted by the same reference numerals, and description thereof will be omitted. Note that unless otherwise specified, "right" represents the right side of FIG. 33 and "lower" represents a lower side of FIG. 33.

Figure 33:
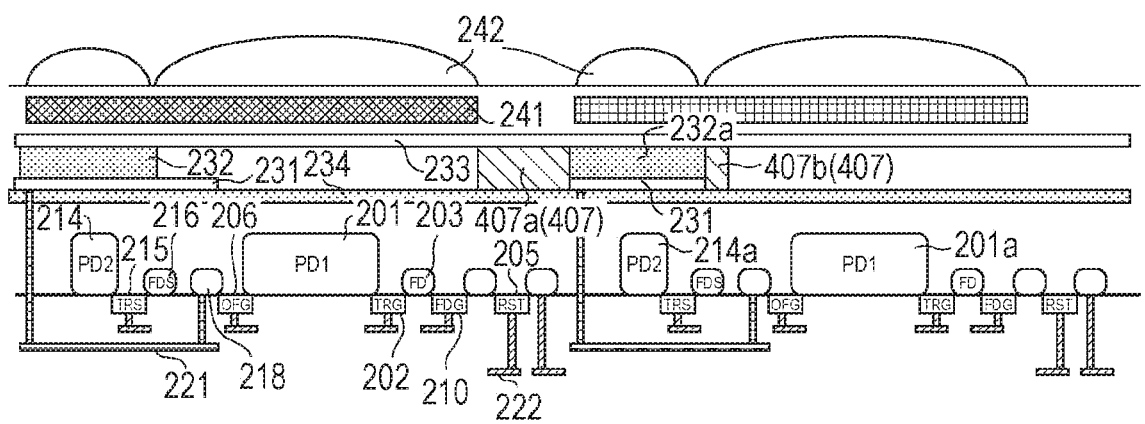
FIG. 33 is a schematic cross-sectional diagram illustrating pixels of a solid-state imaging element obtained by providing an inter-pixel light shield in the solid-state imaging element according to the eleventh embodiment of the present technology.

As illustrated in FIG. 33, the solid-state imaging element 367 includes an inter-pixel light shield 407a (407) and an inter-pixel light shield 407b (407). The inter-pixel light shield 407a is provided on the left side of an electrochromic film 232. The inter-pixel light shield 407b is provided on the right side of the electrochromic film 232. The solid-state imaging element 367 illustrated in FIG. 33 is different from the solid-state imaging element 310 according to the eleventh embodiment in that the inter-pixel light shield 407a (407) is provided on the left side of an electrochromic film 232a, and the right side of the electrochromic film 232a is provided with an inter-pixel light shield 407b (407).

The solid-state imaging element 367 is configured so that the inter-pixel light shield 407a (407) is provided on the left side of the electrochromic film 232a, and color mixing between the first photodiode 201 and the second photodiode 214a can be prevented. Furthermore, the solid-state imaging element 367 is configured so that the inter-pixel light shield 407b (407) is provided on the right side of the electrochromic film 232a, and color mixing between the first photodiode 201a and the second photodiode 214a can be prevented.

Next, as the fifteenth embodiment of the solid-state imaging element according to the present technology, an embodiment will be described in which an inter-pixel light shield is provided in a solid-state imaging element according to the thirteenth embodiment. The similar configurations as those of the thirteenth embodiment are denoted by the same reference numerals, and description thereof will be omitted. Note that unless otherwise specified, "right" represents the right side of FIG. 34 and "lower" represents a lower side of FIG. 34.

Figure 34:
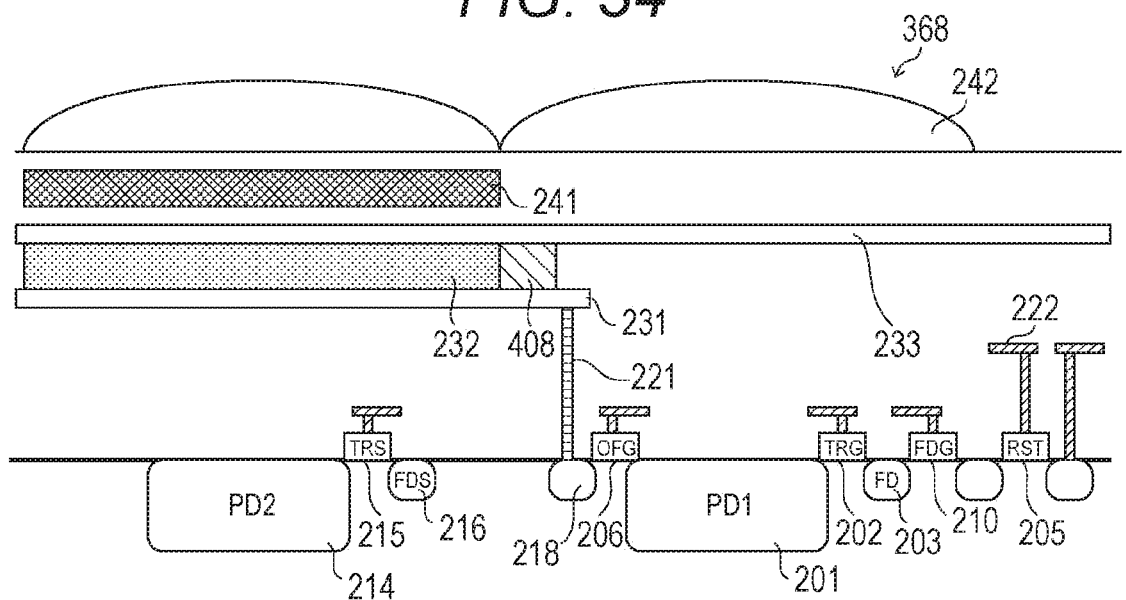
FIG. 34 is a schematic cross-sectional diagram illustrating pixels of a solid-state imaging element obtained by providing an inter-pixel light shield in the solid-state imaging element according to the thirteenth embodiment of the present technology.

As illustrated in FIG. 34, the solid-state imaging element 368 includes an inter-pixel light shield 408. The inter-pixel light shield 408 is provided on the right side of an electrochromic film 232. The solid-state imaging element 368 illustrated in FIG. 34 is different from the solid-state imaging element 330 according to the thirteenth embodiment in that the inter-pixel light shield 408 is provided on the right side of the electrochromic film 232.

The solid-state imaging element 368 is configured so that the inter-pixel light shield 408 is provided on the right side of the electrochromic film 232, and color mixing between a first photodiode 201 and a second photodiode 214 can be prevented.

16. Solid-State Imaging Element According to Sixteenth Embodiment

A solid-state imaging element according to a sixteenth embodiment of a solid-state imaging element according to the present technology is a solid-state imaging element including, in order of incidence of light, for a unit pixel, a first electrode, an electrochromic film that has an optical characteristic changing according to applied voltage, a second electrode, a first photoelectric conversion element, a first accumulation portion that accumulates electric charge obtained by photoelectric conversion by the first photoelectric conversion element, a second photoelectric conversion element, and a second accumulation portion that accumulates electric charge obtained by photoelectric conversion by the second photoelectric conversion element, in which the electrochromic film is disposed on an optical path of light incident on the second photoelectric conversion element and the first accumulation portion is connected to the second electrode.

According to a solid-state imaging element according to the sixteenth embodiment of the present technology, it is possible to extend the dynamic range by increasing a sensitivity difference between a pair of pixels.

(16-1) Configuration Example of Solid-State Imaging Element

Figure 35:
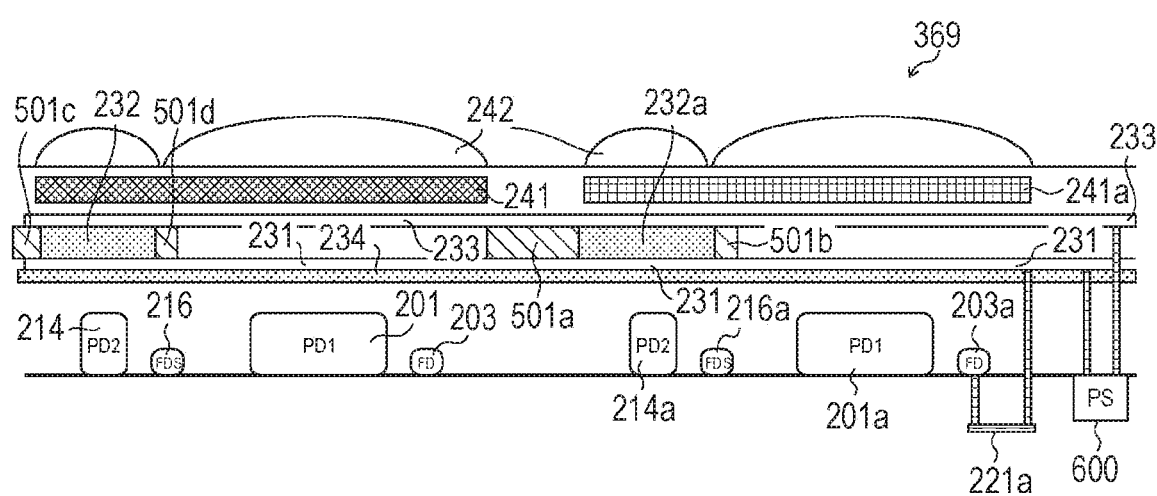
FIG. 35 is a schematic cross-sectional diagram illustrating pixels of a solid-state imaging element according to a sixteenth embodiment according to the present technology.

A solid-state imaging element according to a sixteenth embodiment of the present technology will be described with reference to FIG. 35. FIG. 35 is a schematic cross-sectional diagram of pixels illustrating the solid-state imaging element in which two unit pixels are arranged. Note that unless otherwise specified, "upper" represents the upper side of FIG. 35, and "right" represents the right side of FIG. 35. Hereinafter, a unit pixel on the right side of FIG. 35 will be mainly described.

As illustrated in FIG. 35, the solid-state imaging element 369 includes, in order of incidence of light, for a unit pixel, a first electrode (upper electrode 233), an electrochromic film 232a that has an optical characteristic changing according to applied voltage, a second electrode (lower electrode 231), a first photodiode 201a as a first photoelectric conversion element, a first accumulation portion (first FD portion 203a) that accumulates electric charge obtained by photoelectric conversion by the first photodiode 201a, a second photodiode 214a as a second photoelectric conversion element, and a second accumulation portion (second FD portion 216a) that accumulates electric charge obtained by photoelectric conversion by the second photodiode 214a.

The electrochromic film 232a is disposed on an optical path of light incident on the second photodiode 214a and the first accumulation portion (first FD portion 203a) is connected to the second electrode (lower electrode 231). Note that the first FD portion 203a functions as the first accumulation portion, and the second FD portion 214a functions as the second accumulation portion.

Furthermore, in the solid-state imaging element 369, a color filter 241 and a color filter 241a which have any of red, green, and blue colors are formed in a layer above the first electrode (upper electrode 233), and on-chip lenses 242 are formed in a layer above the color filters. The first photodiode 201a and the second photodiode 214a are formed in each unit pixel of a pixel array of a red pixel, a green pixel, and a blue pixel arranged on a semiconductor substrate in a matrix. Note that the first photodiode 201a has a similar configuration to that of a first photodiode 201, and the second photodiode 214a and a second photodiode 214 also have the same configuration.

Since light is incident on the first electrode (upper electrode 233) and the second electrode (lower electrode 231) via the on-chip lenses 242, the color filter 241 and the color filter 241a, the first and second electrodes are required to be transparent. Therefore, a material such as indium tin oxide (ITO) or indium zinc oxide (IZO) is used for the first electrode (upper electrode 233) and the second electrode (lower electrode 231).

The electrochromic film 232a is disposed between an inter-pixel light shield 501a and an inter-pixel light shield 501b. For the electrochromic film 232a, for example, a material having a transmittance changing according to applied voltage, such as tungsten oxide, is used. Therefore, the electrochromic film 232a has a property that the light transmittance changes from a first transmittance to a second transmittance according to an applied voltage.

In other words, in the solid-state imaging element 369, a predetermined voltage is applied between the first electrode (upper electrode 233) and the second electrode (lower electrode 231), the predetermined voltage is applied to the electrochromic film 232a from the second electrode (lower electrode 231), and thereby the light transmittance of the electrochromic film 232a is changed.

Note that the electrochromic film 232a is not limited to tungsten oxide and may use a material such as a magnesium-titanium alloy, a magnesium-nickel alloy, or tantalum oxide.

Figure 36:
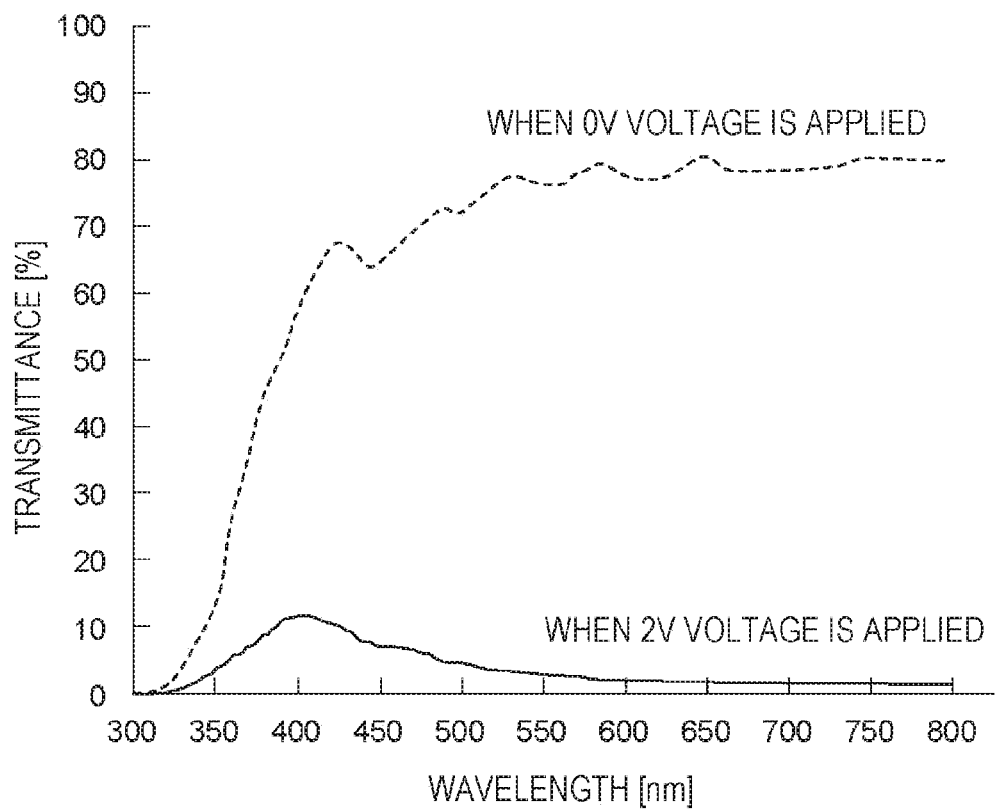
FIG. 36 is a graph illustrating a typical characteristic shown when a voltage is applied to a tungsten oxide film of the solid-state imaging element.

FIG. 36 is a graph illustrating a typical characteristic shown when a voltage is applied to the electrochromic film 232a including tungsten oxide. A dashed line at the upper part of FIG. 36 indicates transmittance obtained when a voltage applied between the first electrode (upper electrode 233) and the second electrode (lower electrode 231) is 0 V. A solid line at the lower part of FIG. 36 indicates transmittance obtained when a voltage applied between the first electrode (upper electrode 233) and the second electrode (lower electrode 231) is 2 V. When voltage applied between the first electrode (upper electrode 233) and the second electrode (lower electrode 231) is 0V, a transmittance shows approximately 80% in the visible light region (approximately 380 nm to 780 nm), whereas when 2V is applied between the first electrode (upper electrode 233) and the second electrode (lower electrode 231), the transmittance changes to 10% or less.

In the solid-state imaging element 369, the first accumulation portion (first FD portion 203a) and the second electrode (lower electrode 231) are connected by a connection line 221a. Therefore, before exposure is started, by setting reset potential and a potential applied to the first electrode (upper electrode 233) equal to each other, a potential applied to the electrochromic film 232a upon resetting becomes 0 V. In other words, in a reset state, the electrochromic film 232a has a transmittance of around 80%.

(16-2) Operation Example of Unit Pixel

Next, an example of the operation of the unit pixel of the solid-state imaging element 369 according to the sixteenth embodiment will be described.

Firstly, electric charge obtained by photoelectric conversion during exposure is accumulated in the first photodiode 201a and the second photodiode 214a respectively. The first photodiode 201a and the second photodiode 214a have different sensitivities. The second photodiode 214a has a size smaller than that of the first photodiode 201a and has a lower sensitivity. In other words, the first photodiode 201a has higher sensitivity and is suitable for lower illuminance, and the second photodiode 214a has lower sensitivity and is suitable for higher illuminance.

Then, the solid-state imaging element 369 combines a high-sensitivity signal and a low-sensitivity signal in image processing to achieve a wide dynamic range.

Figure 37:
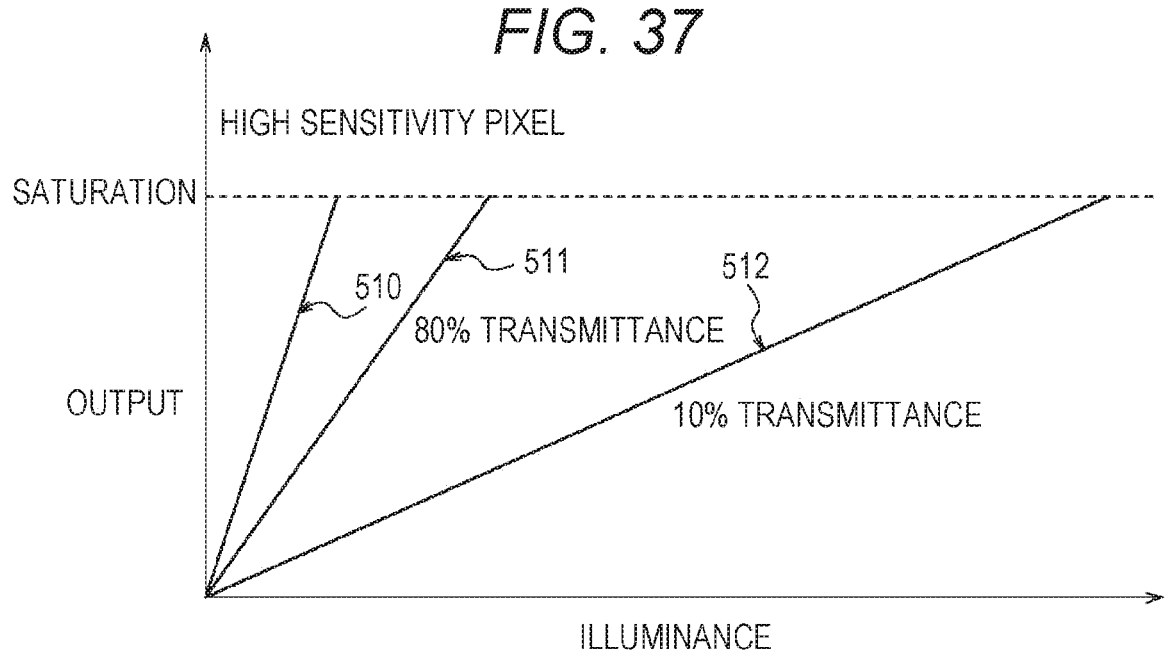
FIG. 37 is an explanatory diagram illustrating a state where dynamic range of the solid-state imaging element according to the sixteenth embodiment of the present technology is extended.

FIG. 37 is an explanatory diagram illustrating a state where dynamic range is extended. Note that unless otherwise specified, "upper" represents the upper side of FIG. 37, and "right" represents the right side of FIG. 37.

A solid line 510 on the left side in FIG. 37 indicates a state where the first photodiode 201a having high sensitivity is saturated. A middle solid line 511 in FIG. 37 indicates a state where the second photodiode 214a having low sensitivity and a transmittance of 80% is saturated. In addition, a solid line 512 on the right in FIG. 37 indicates a state where the second photodiode 214a having low sensitivity and a transmittance of 10% is saturated.

Here, in the solid-state imaging element 369, a predetermined voltage is applied between the first electrode (upper electrode 233) and the second electrode (lower electrode 231), the predetermined voltage is applied to the electrochromic film 232a from the second electrode (lower electrode 231). Thus, in the solid-state imaging element 369, the light transmittance of the electrochromic film 232a in the visible light region (approximately 380 nm to 780 nm) is changed. Therefore, the solid-state imaging element 369 is configured so that voltage applied to the second electrode (lower electrode 231) is changed to switch modes.

Specifically, for example, in a case where 0 V is applied as a first voltage to the electrochromic film 232a disposed at the second photodiode 214a, a first transmittance of the second photodiode 214a in the visible light region (approximately 380 nm to 780 nm) is approximately 80%. On the other hand, for example, in a case where 2 V is applied as a second voltage to the electrochromic film 232a disposed at the second photodiode 214a, a second transmittance of the second photodiode 214a in the visible light region (approximately 380 nm to 780 nm) is approximately 10%.

The sensitivity of the second photodiode 214a in a case where the first transmittance in the visible light region is 80% is compared with that in a case where the second transmittance in the visible light region is 10%, the first transmittance of 80% has higher sensitivity. Here, a difference in sensitivity between the first photodiode 201a and the second photodiode 214a will be considered. When the second photodiode 214a having the first transmittance of 80% in the visible light region is compared with the second photodiode 214a having the second transmittance of 10% in the visible light region, the second photodiode 214a having the first transmittance of 80% in the visible light region has a small difference in sensitivity, compared with the second photodiode 214a having the second transmittance of 10% in the visible light region. In other words, a difference in sensitivity between the first photodiode 201a and the second photodiode 214a having the second transmittance of 10% in the visible light region is larger than that between the first photodiode 201a and the second photodiode 214a having the first transmittance of 80%.

Therefore, in the solid-state imaging element 369, for example, in a case where 0 V is applied as the first voltage between the first electrode (upper electrode 233) and the second electrode (lower electrode 231), a first mode can be set as a high SN mode, and the high SN mode has a smaller difference in sensitivity than in a case where 2 V is applied as the second voltage. On the other hand, in the solid-state imaging element 369, for example, a case where 2 V is applied as a second voltage between the first electrode (upper electrode 233) and the second electrode (lower electrode 231), a second mode can be set as a dynamic range mode, the dynamic range mode has a larger difference in sensitivity than in a case where 0 V is applied as the first voltage.

Furthermore, in the solid-state imaging element 369, the predetermined voltage may be applied between the first electrode (upper electrode 233) and the second electrode (lower electrode 231), from a power supply 600. In this case, in the solid-state imaging element 369, when the predetermined voltage is applied from the power supply 600, the predetermined voltage is applied to the electrochromic film 232a by the second electrode (lower electrode 231), and the light transmittance of the electrochromic film 232a can be changed. Note that the power supply 600 is configured by a booster circuit in FIG. 35, but is not limited to the booster circuit, and may be configured by, for example, an external power supply. Furthermore, the power supply 600 may be configured by a combination of the booster circuit and the external power supply.

In a case where a voltage is applied from the power supply 600 to the solid-state imaging element 369, even after the solid-state imaging element 369 has been manufactured, the power supply 600 is configured to apply a voltage between the first electrode (upper electrode 233) and the second electrode (lower electrode 231) to adjust the transmittance of the electrochromic film 232a, and dynamic range can be adjusted between the first photodiode 201a and the second photodiode 214a. Thus, the solid-state imaging element 369 is operable to adjust voltage applied to the electrochromic film 232a, for each solid-state imaging element, which facilitates individual adjustment of sensitivity.

Note that voltage set in the solid-state imaging element 369 can be fixed for each solid-state imaging element 369 or switched when the modes are changed, and thus it is not necessary to consider a low response characteristic of the electrochromic film 232a.

As described above, according to the solid-state imaging element according to the sixteenth embodiment of the present technology, it is possible to increase a difference in sensitivity between a pair of pixels, and the dynamic range can be extended. In particular, the solid-state imaging element according to the sixteenth embodiment is configured to extend the dynamic range without reducing the sensitivity of the first photodiode 201a of high sensitivity. Furthermore, the technology described for the solid-state imaging element according to the sixteenth embodiment can be applied to the solid-state imaging element according to the fifteenth embodiment.

17. Solid-State Imaging Element According to Seventeenth Embodiment

Next, a solid-state imaging element according to a seventeenth embodiment of the present technology will be described. In the seventeenth embodiment, a position where an electrochromic film of the solid-state imaging element according to the sixteenth embodiment, which has been described above, is provided is changed. The similar configurations as those of the sixteenth embodiment are denoted by the same reference numerals, and description thereof will be omitted.

Figure 38:
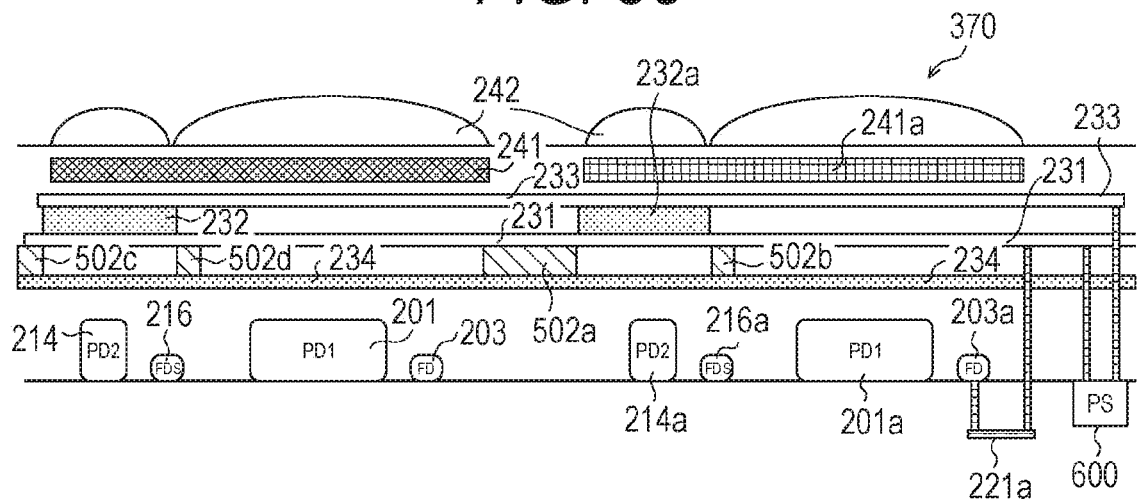
FIG. 38 is a schematic cross-sectional diagram illustrating pixels of a solid-state imaging element according to a seventeenth embodiment according to the present technology.

FIG. 38 is a schematic cross-sectional diagram illustrating pixels of the solid-state imaging element 370 according to the seventeenth embodiment. The solid-state imaging element 370 illustrated in FIG. 38 is different from the solid-state imaging element 369 according to the sixteenth embodiment in that the electrochromic film 232 and the electrochromic film 232a are provided in a layer above the inter-pixel light shields 502 (the inter-pixel light shield 502a, inter-pixel light shield 502b, inter-pixel light shield 502c, and inter-pixel light shield 502d). Note that unless otherwise specified, "upper" represents the upper side of FIG. 38, and "lower" represents the lower side of FIG. 38.

As illustrated in FIG. 38, the solid-state imaging element 370 includes the electrochromic film 232 and the electrochromic film 232. The electrochromic film 232 and the electrochromic film 232a are provided in a layer above the inter-pixel light shields 502 (the inter-pixel light shield 502a, inter-pixel light shield 502b, inter-pixel light shield 502c, and inter-pixel light shield 502d) and below the color filter 241 and color filter 241a.

As described above, the electrochromic film 232 and the electrochromic film 232a may be arranged in the same layer as or in a different layer from the inter-pixel light shields 502, as long as the films are on an optical path of light incident on the second photodiode 214 and second photodiode 214a.

As described above, the solid-state imaging element 370 according to the seventeenth embodiment of the present technology can extend the dynamic range, when the electrochromic film 232 and the electrochromic film 232a are arranged in any layer of the solid-state imaging element 370.

18. Solid-State Imaging Element According to Eighteenth Embodiment

Next, a solid-state imaging element according to an eighteenth embodiment of the present technology will be described. In the eighteenth embodiment, the second photodiode 214 of the solid-state imaging element according to the sixteenth embodiment, which has been described above, is changed to have the same pixel size as that of the first photodiode 201.

Figure 39:
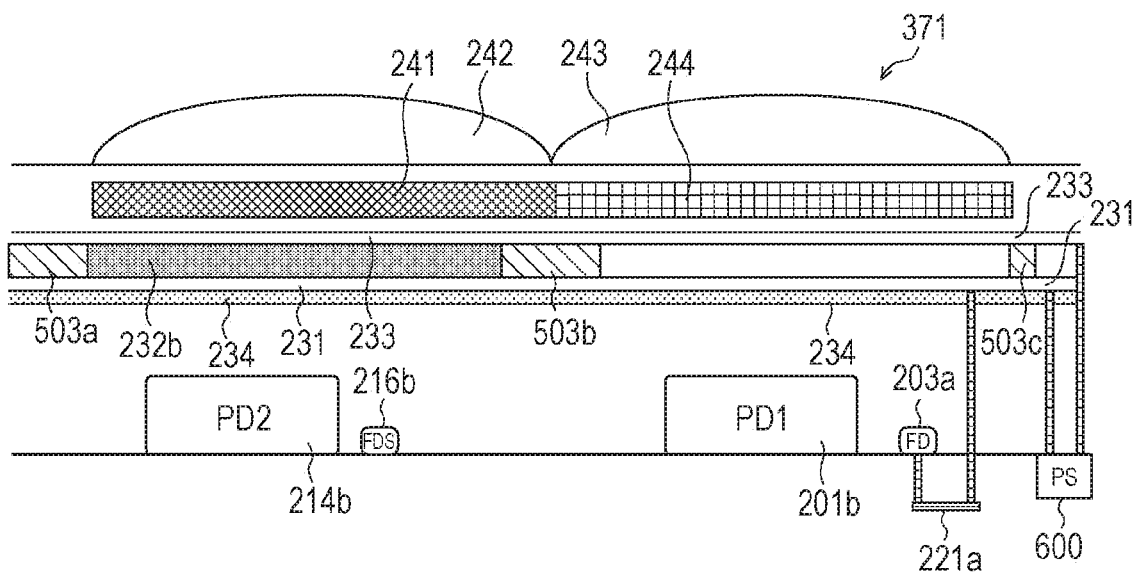
FIG. 39 is a schematic cross-sectional diagram illustrating pixels of a solid-state imaging element according to an eighteenth embodiment of the present technology.

FIG. 39 is a schematic cross-sectional diagram illustrating pixels of the solid-state imaging element 371 according to the eighteenth embodiment. The solid-state imaging element 371 illustrated in FIG. 39 is different from the solid-state imaging element 369 according to the sixteenth embodiment in that a second photodiode 214b has the same pixel size as a first photodiode 201b. Furthermore, in FIG. 39, the solid-state imaging element 371 shows one unit pixel. The similar configurations as those of the sixteenth embodiment are denoted by the same reference numerals, and description thereof will be appropriately omitted. Note that unless otherwise specified, "upper" represents the upper side of FIG. 39, and "lower" represents the lower side of FIG. 39.

As illustrated in FIG. 39, the solid-state imaging element 371 includes, in order of incidence of light, a first electrode (upper electrode 233), an electrochromic film 232b having an optical characteristic changing according to an applied voltage, and a second electrode (lower electrode 231). Furthermore, the solid-state imaging element 371 includes the first photodiode 201b as a first photoelectric conversion element, a first accumulation portion (first FD portion 203b) that accumulates electric charge obtained by photoelectric conversion by the first photodiode 201b, the second photodiode 214b as a second photoelectric conversion element, and a second accumulation portion (second FD portion 216b) that accumulates electric charge obtained by photoelectric conversion by the second photodiode 214b.

In the solid-state imaging element 371, a color filter 241, a color filter 244, an on-chip lens 242, and an on-chip lens 243 are formed on the first electrode (upper electrode 233).

The electrochromic film 232b is provided between an inter-pixel light shield 503a and an inter-pixel light shield 503b. The second photodiode 214b has the same pixel size as the first photodiode 201b.

According to the solid-state imaging element 371 of the eighteenth embodiment of the present technology, the second photodiode 214b provided with the electrochromic film 232b is not limited to the pixel size and can employ a desired pixel size. Furthermore, the electrochromic film 232b may be provided for the second photodiode 214b for each pixel or may be provided for each color of the color filter 241.

Note that since the electrochromic film 232b is used for the purpose of extending the dynamic range, the electrochromic film 232b cannot be provided for the first photodiode 201b that is paired with the second photodiode 214b.

19. Nineteenth Embodiment (Configuration Example of Electronic Apparatus)

An electronic apparatus according to a nineteenth embodiment of the present technology is an apparatus including a solid-state imaging element according to any one of the first to eighteenth embodiments of the present technology. The solid-state imaging elements according to the first to eighteenth embodiments of the present technology are as described above, and thus description thereof will be omitted. The electronic apparatus according to the nineteenth embodiment of the present technology includes a solid-state imaging element having excellent image quality and excellent reliability, and thus performance such as image quality of a color image can be improved.

Figure 40:
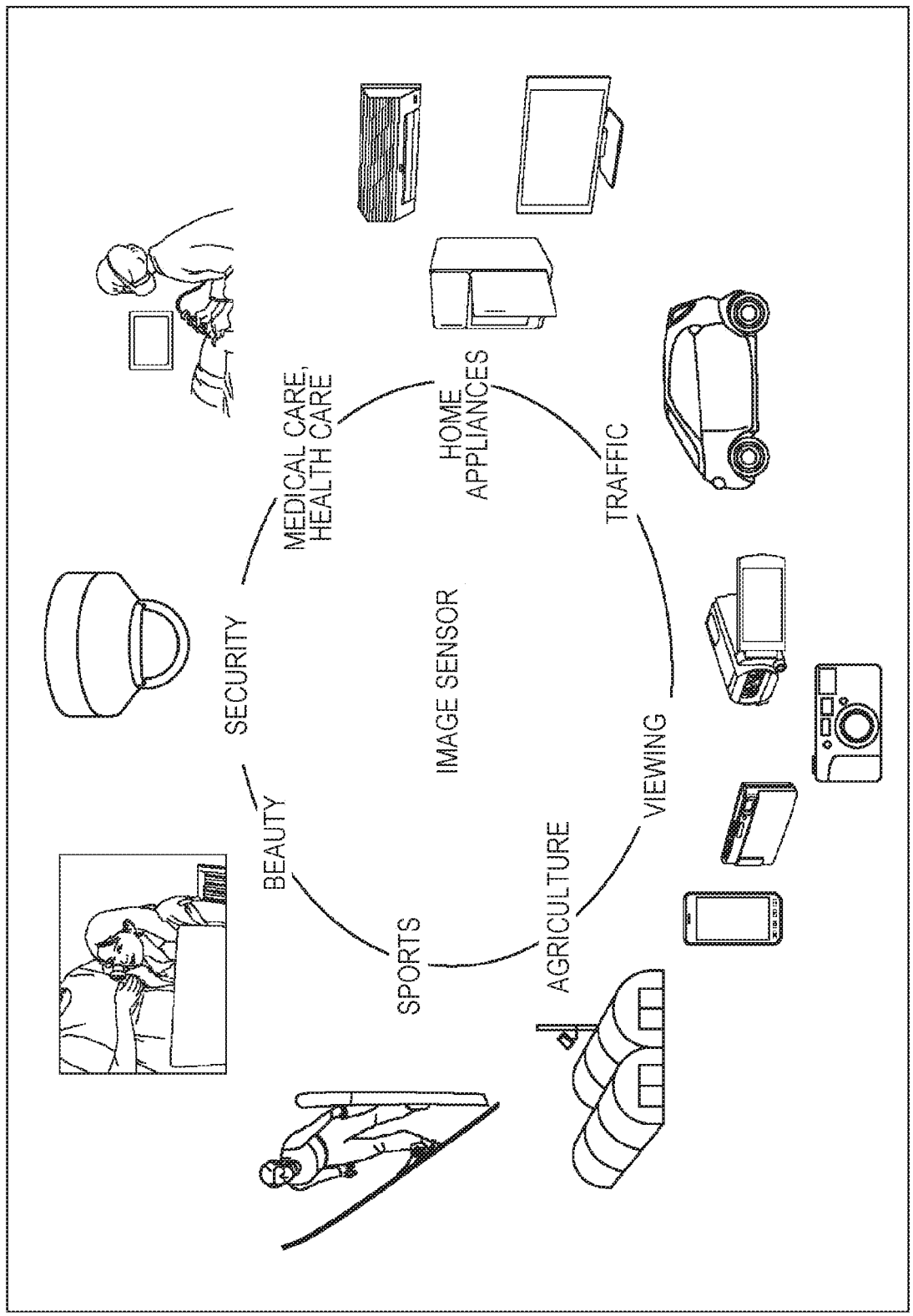
FIG. 40 is a diagram illustrating usage examples of a solid-state imaging element to which the present technology is applied.

20. Usage Examples of Solid-State Imaging Element to Which Present Technology is Applied FIG. 40 is a diagram illustrating usage examples of a solid-state imaging element according to any of the first to eighteenth embodiments of the present technology, as an image sensor.

The solid-state imaging elements according to the first to eighteenth embodiments described above can be used for various cases for sensing light, such as visible light, infrared light, ultraviolet light, or X-ray, as described below. In other words, as illustrated in FIG. 40, for example, the solid-state imaging elements according to the first to eighteenth embodiments can be used for apparatuses (e.g., the electronic apparatus according to the nineteenth embodiment) used in the field of image viewing for which an image for viewing is captured, the field of traffic, the field of home appliances, the field of medical care and health care, the field of security, the field of beauty, the field of sports, the field of agriculture, and the like.

Specifically, in the field of image viewing, a solid-state imaging element according to any of the first to eighteenth embodiments can be used for an apparatus for capturing an image for viewing, such as a digital camera, smartphone, or mobile phone with camera function.

In the field of traffic, a solid-state imaging element according to any of the first to eighteenth embodiments can be used for a traffic-related apparatus, such as a car sensor capturing an image of forward, backward, or peripheral position of a car, inside a car, or the like, for safe driving such as automatic stop or recognition of driver's condition, a monitoring camera monitoring a running vehicle or a road, or a distance measuring sensor measuring a distance between vehicles or the like.

In the field of home appliances, a solid-state imaging element according to any of the first to eighteenth embodiments can be used for an apparatus used for a home appliance, such as a TV set, refrigerator, or air conditioner, which is configured to be operated according to captured user's gesture.

In the field of medical care and health care, a solid-state imaging element according to any of the first to eighteenth embodiments can be used for an apparatus for medical care or health care, such as an endoscope or an angiographic apparatus using infrared light.

In the field of security, a solid-state imaging element according to any of the first to eighteenth embodiments can be used for a security apparatus, such as a monitoring camera for security or a camera for personal identification.

In the field of beauty, a solid-state imaging element according to any of the first to eighteenth embodiments can be used for an apparatus for beauty, such as a skin measurement apparatus capturing a skin image or a microscope capturing a scalp image.

In the field of sports, a solid-state imaging element according to any of the first to eighteenth embodiments can be used for an apparatus for sport use, such as an action camera or a wearable camera for sport use or the like.

In the field of agriculture, a solid-state imaging element according to any of the first to eighteenth embodiments can be used for an apparatus for agricultural use, such as a camera for monitoring field condition or crop condition.

A technology according to the present disclosure (the present technology) is applicable to various products. An example of application to a mobile body will be described below.

21. Example of Application to Mobile Body

The technology according to the present disclosure can be achieved as a device that is mounted to any type of mobile body, such as an automobile, electric vehicle, hybrid-electric vehicle, motorcycle, a bicycle, personal mobility vehicle, airplane, drone, ship, and robot.

Figure 41:
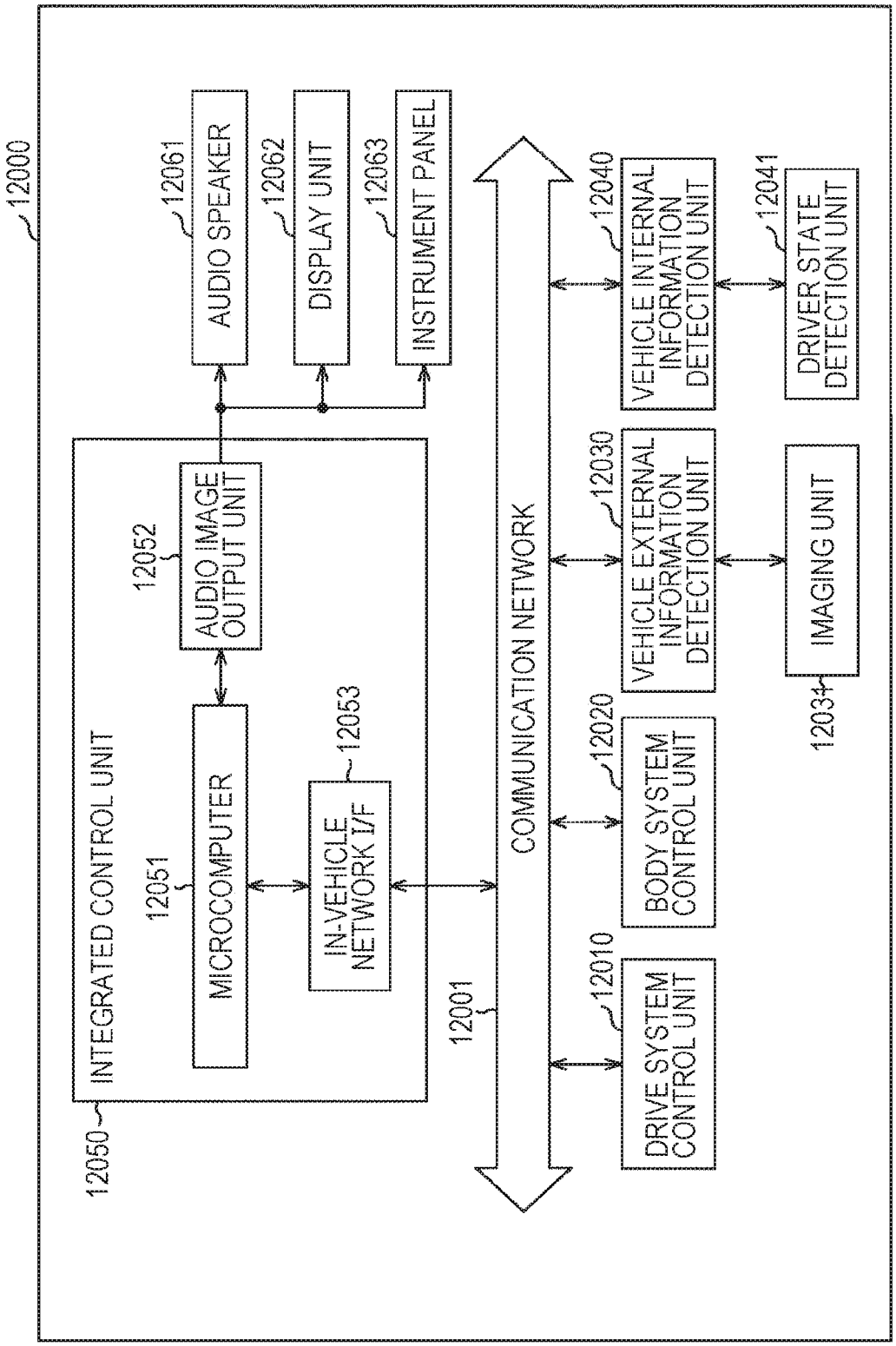
FIG. 41 is a block diagram illustrating an example of a schematic configuration of a vehicle control system.

FIG. 41 is a block diagram illustrating a schematic configuration example of a vehicle control system that is an example of a mobile body control system to which a technology according to the present disclosure is applicable.

The vehicle control system 12000 includes a plurality of electronic control units that is connected via a communication network 12001. In the example illustrated in FIG. 41, the vehicle control system 12000 includes a drive system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, an audio image output unit 12052, and an in-vehicle network interface (I/F) 12053 are illustrated.

The drive system control unit 12010 controls the operation of a device relating to the drive system of the vehicle according to various programs. For example, the drive system control unit 12010 functions as a control device for a driving force generation device configured to generate a driving force of a vehicle, such as an internal combustion engine or driving motor, a driving force transmission mechanism configured to transmit a driving force to wheels, a steering mechanism configured to adjust a steering angle of the vehicle, a braking device configured to generate a braking force of the vehicle, and the like.

The body system control unit 12020 controls the operation of various devices mounted to the vehicle body according to various programs. For example, the body system control unit 12020 functions as a control device for a keyless entry system, smart key system, power window device, or various lamps, such as a head lamp, backup lamp, brake lamp, blinker, or fog lamp. In this case, the body system control unit 12020 receives input of a radio wave transmitted from a portable device substituting for a key or signals from various switches. The body system control unit 12020 receiving input of the radio wave or signals controls a door lock device, power window device, a lamp, and the like of the vehicle.

The vehicle external information detection unit 12030 detects information outside the vehicle on which the vehicle control system 12000 is mounted. For example, an imaging unit 12031 is connected to the vehicle external information detection unit 12030. The vehicle external information detection unit 12030 causes the imaging unit 12031 to capture an image outside the vehicle and receives the captured image. The vehicle external information detection unit 12030 may perform object detection processing for detecting an object, such as a person, car, obstacle, traffic sign, or writing on a road surface or distance detection processing, on the basis of the captured image.

The imaging unit 12031 includes an optical sensor configured to receive light and output an electric signal according to an amount of the received light. The imaging unit 12031 is operable to output an electric signal as an image or as distance measurement information. In addition, light received by the imaging unit 12031 may be visible light or invisible light such as infrared light.

The vehicle internal information detection unit 12040 detects information inside the vehicle. For example, a driver state detection unit 12041 configured to detect a driver's state is connected to the vehicle internal information detection unit 12040. The driver state detection unit 12041 may include, for example, a camera configured to image the driver, and the vehicle internal information detection unit 12040 may calculate a level of fatigue or concentration of the driver or determine whether or not the driver is asleep, on the basis of detected information input from the driver state detection unit 12041.

The microcomputer 12051 calculates, on the basis of the information inside and outside the vehicle acquired by the vehicle external information detection unit 12030 or the vehicle internal information detection unit 12040, a control target value for the driving force generation device, steering mechanism, or braking device and output a control command to the drive system control unit 12010. For example, in order to achieve an advanced driver assistance system (ADAS) functions, the microcomputer 12051 performs cooperative control, the ADAS including vehicle collision avoidance or impact mitigation, follow-up traveling based on a distance between vehicles, traveling at a constant vehicle speed, vehicle collision warning, vehicle lane departure warning, or the like.

Furthermore, the microcomputer 12051 controls the driving force generation device, the steering mechanism, the braking device, or the like on the basis of information around the vehicle acquired by the vehicle external information detection unit 12030 or the vehicle internal information detection unit 12040 to perform cooperative control, for example, for automatic drive enabling autonomous travel without depending on the driver's operation.

Furthermore, the microcomputer 12051 is operable to output a control command to the body system control unit 12020, on the basis of information outside the vehicle acquired by the vehicle external information detection unit 12030. For example, the microcomputer 12051 is operable to control the head lamps according to a position of a preceding vehicle or oncoming vehicle detected by the vehicle external information detection unit 12030 to perform cooperative control for antidazzle, for example, by switching the head lamps from high beam to low beam.

The audio image output unit 12052 transmits at least one of an audio output signal or visual output signal to an output device configured to notify a vehicle occupant or the outside of the vehicle of visual or audible information. In the example of FIG. 27, an audio speaker 12061, a display unit 12062, and an instrument panel 12063 are illustrated as the output device. For example, the display unit 12062 may include at least one of an on-board display or a head-up display.

Figure 42:
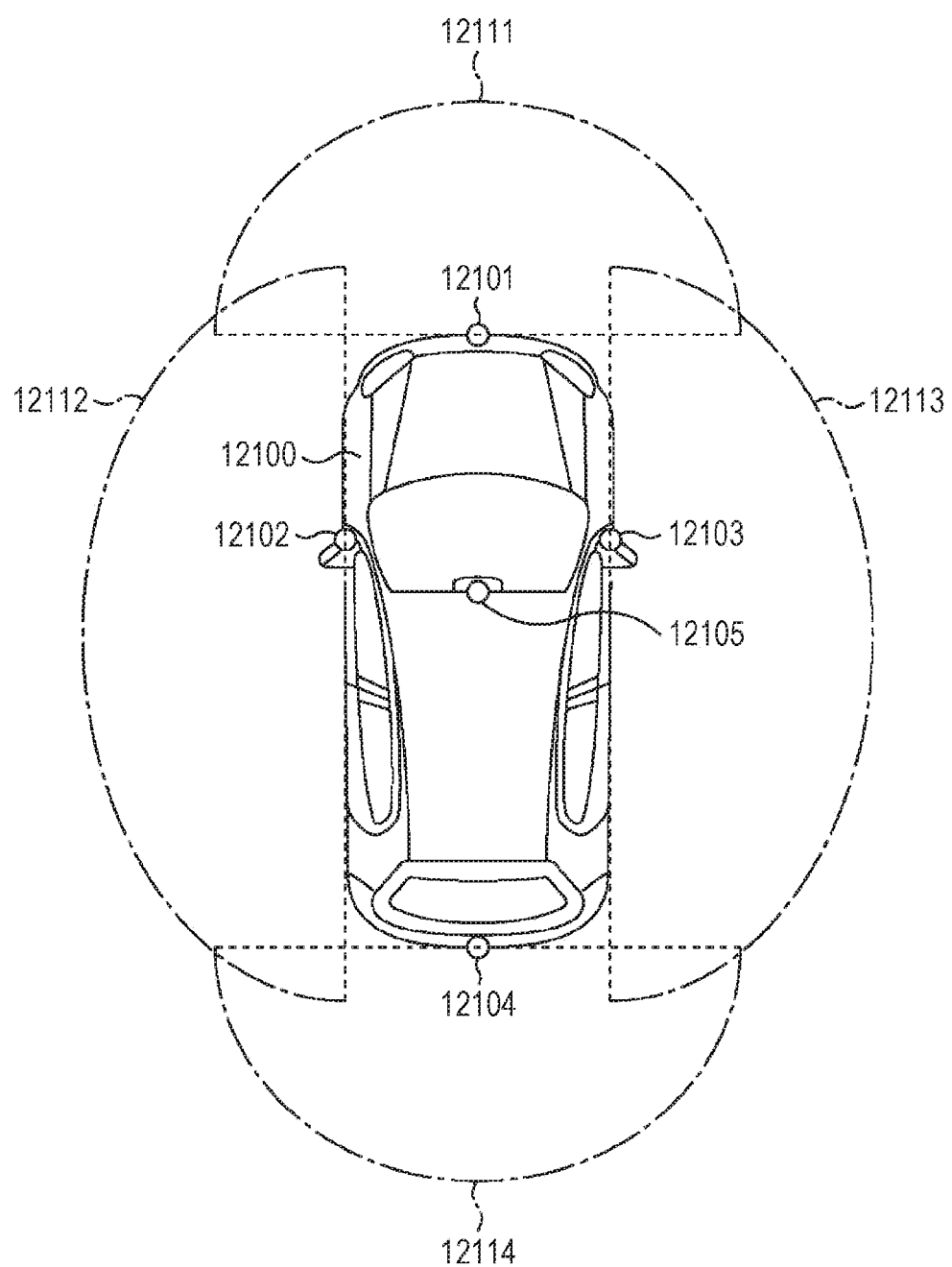
FIG. 42 is an explanatory diagram illustrating an example of installation positions of a vehicle external information detection unit and imaging units.

FIG. 42 is a diagram illustrating an example of installation positions of the imaging unit 12031.

In FIG. 42, a vehicle 12100 includes imaging units 12101, 12102, 12103, 12104, and 12105 as the imaging unit 12031.

The imaging units 12101, 12102, 12103, 12104, and 12105 are provided at positions, such as a front nose, side mirrors, a rear bumper, a back door, and an upper portion of a windshield on the vehicle interior side, of the vehicle 12100, for example. The imaging unit 12101 provided at the front nose and the imaging unit 12105 provided at the upper portion of the windshield on the vehicle interior side each mainly acquire a forward image of an area in front of the vehicle 12100. The imaging units 12102 and 12103 provided at the side mirrors each mainly acquire a side image of an area on each side of the vehicle 12100. The imaging unit 12104 provided at the rear bumper or the back door mainly acquires an image of an area in back of the vehicle 12100. The forward images of areas in front of the vehicle acquired by the imaging units 12101 and 12105 are mainly used for detecting a preceding vehicle, pedestrian, obstacle, traffic light, traffic sign, lane, or the like.

Note that FIG. 42 illustrates an example of imaging ranges of the imaging units 12101 to 12104. An imaging range 12111 indicates an imaging range of the imaging unit 12101 provided in the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, by superimposing image data captured by the imaging units 12101 to 12104, an overhead view image when the vehicle 12100 is viewed from above is obtained.

At least one of the imaging units 12101 to 12104 may have a function of acquiring distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114, and a temporal change in each distance (speed relative to the vehicle 12100), on the basis of the distance information obtained from the imaging units 12101 to 12104, and extracts, in particular, a three-dimensional object nearest on a travel path of the vehicle 12100 and traveling at a predetermined speed (e.g., 0 km/h or more) in substantially the same direction of the vehicle 12100, as a preceding vehicle. Furthermore, the microcomputer 12051 sets a distance between the vehicles to be secured in advance with respect to the preceding vehicle to perform automatic brake control (including following stop control), automatic acceleration control (including following start control), or the like. As described above, cooperative control for automatic drive or the like enabling autonomous travel without depending on the driver's operation can be performed.

For example, on the basis of the distance information obtained from the imaging units 12101 to 12104, the microcomputer 12051 classifies three-dimensional object data about three-dimensional objects into three-dimensional objects, such as a two-wheeled motorcycle, ordinary motor vehicle, large-sized motor vehicle, pedestrian, and others object such as a power pole and extracts the three-dimensional objects, for use in automatic avoidance of obstacles. For example, the microcomputer 12051 identifies obstacles around the vehicle 12100 between an obstacle which is visible to the driver of the vehicle 12100 and an obstacle which is difficult for the driver to see. Then, the microcomputer 12051 determines a collision risk indicating the risk of collision with each obstacle, and in a case where the risk of collision has a value equal to or more than a set value and there is a possibility of collision, the microcomputer 12051 outputs warning to the driver via the audio speaker 12061 or the display unit 12062 or performs forced deceleration or evasive steering via the drive system control unit 12010, and thus, driving assistance for collision avoidance can be performed.

At least one of the imaging units 12101 to 12104 may be an infrared camera configured to detect infrared light. For example, the microcomputer 12051 enables pedestrian recognition by determining whether or not the pedestrian is present in an image captured by the imaging units 12101 to 12104. Such pedestrian recognition is performed, for example, according to a procedure for extracting feature points in images captured by the imaging units 12101 to 12104 as the infrared camera and a procedure for determining whether or not a series of feature points indicating a contour of an object after pattern matching thereof represents a pedestrian. When the microcomputer 12051 determines that a pedestrian is in images captured by the imaging units 12101 to 12104 and recognizes the pedestrian, the audio image output unit 12052 controls the display unit 12062 to display a rectangular emphasis contour line to be superimposed on the recognized pedestrian. Furthermore, the audio image output unit 12052 may control the display unit 12062 to display an icon or the like indicating a pedestrian at a desired position.

Heretofore, an example of the vehicle control system to which the technology according to the present disclosure is applicable has been described. The technology according to the present disclosure is applicable to the imaging unit 12031 (the imaging units 12101, 12102, 12103, 12104, and 12105) of the configurations described above. Specifically, a solid-state imaging element according to the present technology can be applied to the imaging unit 12031 (the imaging units 12101, 12102, 12103, 12104, and 12105). The imaging unit 12031 (imaging units 12101, 12102, 12103, 12104, and 12105) to which the technology according to the present disclosure is applied can provide a captured image easy to view, and it is possible to reduce driver's fatigue.

Note that the present technology is not intended to be limited to the above-mentioned embodiments, and various modifications and variations may be made without departing from the scope and spirit of the present technology. For example, a combination of all or part of the above-mentioned plurality of embodiments may be employed. Furthermore, it is noted that the effects described herein are by way of example only and not limited to the description, and there may be further additional effects.

Furthermore, the present technology may also include the following configurations.

(1)

A solid-state imaging element including, for a unit pixel:

a first photoelectric conversion element;

a first accumulation portion that accumulates electric charge obtained by photoelectric conversion by the first photoelectric conversion element; and a first film that is electrically connected to the first accumulation portion and has an optical characteristic changing according to applied voltage.

(2)

The solid-state imaging element according to (1), in which the unit pixel further includes a first transfer transistor that transfers electric charge obtained by photoelectric conversion by the photoelectric conversion element to the first accumulation portion, an amplification transistor that is electrically connected to the first accumulation portion, and a selection transistor that is electrically connected to the amplification transistor.

(3)

The solid-state imaging element according to (1) or (2), in which the unit pixel further includes a first reset transistor that resets electric charge accumulated in the first accumulation portion.

(4)

The solid-state imaging element according to any of (1) to (3), in which the unit pixel further includes a second accumulation portion that accumulates electric charge obtained by photoelectric conversion by the first photoelectric conversion element, and a capacitance connection transistor that electrically connects the first accumulation portion and the second accumulation portion.

(5)

The solid-state imaging element according to any of (1) to (4), in which the unit pixel further includes an overflow gate that electrically connects the first photoelectric conversion element and the second accumulation portion.

(6)

The solid-state imaging element according to (3), in which the unit pixel further includes a selection transistor that is electrically connected to the first film and an operational amplifier, and the first accumulation portion, the reset transistor, and the operational amplifier are connected to each other in parallel.

(7)

The solid-state imaging element according to any of (1) to (6), in which the first photoelectric conversion element and the first accumulation portion are directly connected.

(8)

The solid-state imaging element according to any of (1) to (7), in which the first film is disposed on an optical path of light incident on the first photoelectric conversion element and has a light transmittance changing according to an amount of electric charge accumulated in the first accumulation portion.

(9)

The solid-state imaging element according to any of (1) to (8), further including:

a second photoelectric conversion element; and a second accumulation portion that accumulates electric charge obtained by photoelectric conversion by the second photoelectric conversion element, in which the first film is disposed on an optical path of light incident on the second photoelectric conversion element.

(10)

The solid-state imaging element according to (9), in which the unit pixel further includes a second transfer transistor that transfers electric charge obtained by photoelectric conversion by the photoelectric conversion element to the second accumulation portion.

(11)
The solid-state imaging element according to (9) or (10), in which the unit pixel further includes a second reset transistor that resets electric charge accumulated in the second accumulation portion.

(12)
The solid-state imaging element according to any one of (9) to (11), in which
on an optical path of light incident on the second photoelectric conversion element, a second film is disposed, and
the second film has an optical characteristic different from an optical characteristic of the first film.

(13)
The solid-state imaging element according to any one of (1) to (12), in which the first accumulation portion accumulates overflow charge overflowing from the first photoelectric conversion element.

(14)
The solid-state imaging element according to any one of (1) to (13), in which the first accumulation portion accumulates electric charge discharged when the first photoelectric conversion element is reset.

(15)
The solid-state imaging element according to any of (9) to (14), in which the first film is disposed on an optical path through which light is incident on the second photoelectric conversion element and has a light transmittance changing according to an amount of electric charge accumulated in the first accumulation portion.

(16)
The solid-state imaging element according to any of (9) to (15), in which the first photoelectric conversion element and the second photoelectric conversion element have different sensitivities.

(17)
The solid-state imaging element according to any of (9) to (16), further including:
a first color filter that is disposed on an optical path of light incident on the first photoelectric conversion element; and
a second color filter that is disposed on an optical path of light incident on the second photoelectric conversion element, in which
the first color filter and the second color filter are different color filters.

(18)
The solid-state imaging element according to any of (1) to (17), in which no color filter is disposed on an optical path of light incident on the first photoelectric conversion element.

(19)
A solid-state imaging element including, for a unit pixel, in order of incidence of light:
a first electrode;
an electrochromic film that has an optical characteristic changing according to applied voltage;
a second electrode;
a first photoelectric conversion element;
a first accumulation portion that accumulates electric charge obtained by photoelectric conversion by the first photoelectric conversion element;
a second photoelectric conversion unit; and
a second accumulation portion that accumulates electric charge obtained by photoelectric conversion by the second photoelectric conversion element, in which the electrochromic film
is disposed on an optical path of light incident on the second photoelectric conversion element and the first accumulation portion is connected to the second electrode.

(20)
The solid-state imaging element according to (19), in which
a predetermined voltage is applied between the first electrode and the second electrode, and
the predetermined voltage is applied to the electrochromic film from the second electrode to change a light transmittance of the electrochromic film.

(21)
The solid-state imaging element according to (19) or (20), in which the first photoelectric conversion element and the second photoelectric conversion element have different sensitivities.

(22)
The solid-state imaging element according to any of (19) to (21), in which a voltage applied to the second electrode is changed to switch modes.

(23)
The solid-state imaging element according to any of (19) to (22), in which
a predetermined voltage is applied between the first electrode and the second electrode by an external power supply, and
the predetermined voltage is applied to the electrochromic film from the second electrode to change a light transmittance of the electrochromic film.

(24)
The solid-state imaging element according to any one of (19) to (23), in which
a predetermined voltage is applied between the first electrode and the second electrode by a booster circuit, and
the predetermined voltage is applied to the electrochromic film from the second electrode to change a light transmittance of the electrochromic film.

(25)
A method of driving a solid-state imaging element including:
accumulating an electric charge in response to photoelectric conversion by a first photoelectric conversion element, in a first accumulation portion; and
causing the first accumulation portion to keep holding the accumulated electric charge during an exposure period.

(26)
An electronic apparatus including the solid-state imaging element according to any of (1) to (23) as an imaging unit.

REFERENCE SIGNS LIST

10, 60, 70, 170, 180, 250, 300, 310, 330 Solid-state imaging element
20, 80, 90, 160, 260, 320, 351, 352 Unit pixel
101, 114, 201, 214 Photodiode
102, 115, 202, 215 Transfer transistor
103, 203, 216 FD portion (floating diffusion region)
104, 204 Capacitance connection transistor
105, 205, 219 Reset transistor
106, 206 Overflow gate
107, 207 Storage capacitor
108, 208 Amplifier transistor
109, 209 Selection transistor
110, 210 FD (floating diffusion region) capacitance switching switch
111 Additional floating diffusion region 112 Operational amplifier
113 Feedback capacitance
121, 221 Connection line
122, 222 Pixel drive line
131, 231 Lower electrode
132, 232 Electrochromic film
133, 233 Upper electrode
134, 234 Insulating film
141, 241 Color filter
142, 242 On-chip lens
217 Capacitance connection switch
218 Overflow drain
340 Color filter array
341 RGBW pixels
350 Pixel equivalent circuit

The invention claimed is:

1. A solid-state imaging element, comprising:
a plurality of pixels, wherein a unit pixel of the plurality of pixels includes:
  a first photoelectric conversion element;
  a first accumulation portion configured to accumulate an electric charge obtained based on photoelectric conversion by the first photoelectric conversion element;
  a first reset transistor configured to reset the electric charge accumulated in the first accumulation portion;
  a first film that is electrically connected to the first accumulation portion, wherein the first film has an optical characteristic that changes based on application of voltage; and
  a selection transistor configured to electrically connect to the first film and an operational amplifier, wherein the first accumulation portion, the first reset transistor, and the operational amplifier are connected in parallel.

2. The solid-state imaging element according to claim 1, wherein the unit pixel further includes:
  a first transfer transistor configured to transfer the electric charge, obtained based on photoelectric conversion by the first photoelectric conversion element, to the first accumulation portion;
  an amplification transistor configured to electrically connect to the first accumulation portion; and
  the selection transistor configured to electrically connect to the amplification transistor.

3. The solid-state imaging element according to claim 1, wherein the unit pixel further includes
  a second accumulation portion configured to accumulate electric charge obtained based on photoelectric conversion by a second photoelectric conversion element; and
  a capacitance connection transistor configured to electrically connect the first accumulation portion and the second accumulation portion.

4. The solid-state imaging element according to claim 3, wherein the unit pixel further includes an overflow gate configured to electrically connect the first photoelectric conversion element and the second accumulation portion.

5. The solid-state imaging element according to claim 1, wherein the first photoelectric conversion element and the first accumulation portion are directly connected.

6. The solid-state imaging element according to claim 1, wherein the first film is on an optical path of light incident on the first photoelectric conversion element and has a light transmittance that changes based on an amount of electric charge accumulated in the first accumulation portion.

7. The solid-state imaging element according to claim 1, further comprising:
  a second photoelectric conversion element; and
  a second accumulation portion configured to accumulate an electric charge obtained based on photoelectric conversion by the second photoelectric conversion element, wherein the first film is on a first optical path of first light incident on the second photoelectric conversion element.

8. The solid-state imaging element according to claim 7, wherein the unit pixel further includes a second transfer transistor configured to transfer electric charge obtained based on photoelectric conversion by the second photoelectric conversion element to the second accumulation portion.

9. The solid-state imaging element according to claim 7, wherein the unit pixel further includes a second reset transistor configured to reset the electric charge accumulated in the second accumulation portion.

10. The solid-state imaging element according to claim 7, further comprising:
  a second film on a second optical path of second light incident on the second photoelectric conversion element, and
  the second film has an optical characteristic different from the optical characteristic of the first film.

11. The solid-state imaging element according to claim 1, wherein the first accumulation portion is further configured to accumulate overflow charge overflowing from the first photoelectric conversion element.

12. The solid-state imaging element according to claim 1, wherein the first accumulation portion is further configured to discharge the accumulated electric charge when the first photoelectric conversion element is reset.

13. The solid-state imaging element according to claim 7, wherein the first film is on the first optical path through which the first light is incident on the second photoelectric conversion element and has a light transmittance that changes based on an amount of the electric charge accumulated in the first accumulation portion.

14. The solid-state imaging element according to claim 7, wherein a sensitivity of the first photoelectric conversion element is different from a sensitivity of the second photoelectric conversion element.

15. The solid-state imaging element according to claim 7, further comprising:
  a first color filter on a second optical path of second light incident on the first photoelectric conversion element; and
  a second color filter on the first optical path of the first light incident on the second photoelectric conversion element, wherein the first color filter is different from the second color filter.

16. The solid-state imaging element according to claim 1, wherein no color filter is on an optical path of light incident on the first photoelectric conversion element.

17. A solid-state imaging element, comprising:
a plurality of pixels, wherein a unit pixel of the plurality of pixels includes:
  in order of incidence of light:
    a first electrode;
    an electrochromic film configured to change an optical characteristic based on application of a voltage;
    a second electrode, wherein
      a first voltage is applied between the first electrode and the second electrode by an external power supply, and the first voltage is applied to the electrochromic film from the second electrode to change a light transmittance of the electrochromic film;
a first photoelectric conversion element;
a first accumulation portion configured to accumulate electric charge obtained based on photoelectric conversion by the first photoelectric conversion element;
a second photoelectric conversion element; and
a second accumulation portion configured to accumulate electric charge obtained based on photoelectric conversion by the second photoelectric conversion element, wherein
the electrochromic film is on an optical path of light incident on the second photoelectric conversion element, and
the first accumulation portion is connected to the second electrode.

18. The solid-state imaging element according to claim 17, wherein a sensitivity of the first photoelectric conversion element is different from a sensitivity of the second photoelectric conversion element.

19. The solid-state imaging element according to claim 17, wherein
a second voltage is applied to the second electrode, and the second voltage is changed to switch modes.

20. The solid-state imaging element according to claim 17, wherein
a second voltage is applied between the first electrode and the second electrode by a booster circuit, and
the second voltage is applied to the electrochromic film from the second electrode to change a light transmittance of the electrochromic film.

21. A method of driving a solid-state imaging element, comprising:
accumulating an electric charge based on photoelectric conversion by a first photoelectric conversion element, in an accumulation portion, wherein
a first film is electrically connected to the accumulation portion,
a selection transistor is electrically connected to the first film and an operational amplifier, and
the first film has an optical characteristic that changes based on application of voltage;
controlling the accumulation portion to hold the accumulated electric charge during an exposure period; and
resetting, by a reset transistor, the electric charge accumulated in the accumulation portion, wherein the accumulation portion, the reset transistor, and the operational amplifier are connected in parallel.

22. An electronic apparatus, comprising:
a solid-state imaging element, wherein
the solid-state imaging element includes a plurality of pixels, and
a unit pixel of the plurality of pixels includes:
a photoelectric conversion element;
an accumulation portion configured to accumulate an electric charge obtained based on photoelectric conversion of the photoelectric conversion element;
a reset transistor configured to reset the electric charge accumulated in the accumulation portion;
a film that is electrically connected to the accumulation portion, wherein the film has an optical characteristic that changes based on application of voltage; and
a selection transistor configured to electrically connect to the film and an operational amplifier, wherein the accumulation portion, the reset transistor, and the operational amplifier are connected in parallel.

* * * * *